US008438449B2

(12) United States Patent
Song et al.

(10) Patent No.: US 8,438,449 B2
(45) Date of Patent: May 7, 2013

(54) METHOD AND APPARATUS FOR TRANSMITTING BROADCAST SIGNAL IN TRANSMITTER

(75) Inventors: Won Gyu Song, Seoul (KR); Byoung Gill Kim, Seoul (KR); Jin Woo Kim, Seoul (KR); Hyoung Gon Lee, Seoul (KR); Jae Hyung Song, Seoul (KR); In Hwan Choi, Seoul (KR); Chul Kyu Mun, Seoul (KR)

(73) Assignee: LG Electronics Inc., Seoul (KR)

( * ) Notice: Subject to any disclaimer, the term of this patent is extended or adjusted under 35 U.S.C. 154(b) by 436 days.

(21) Appl. No.: 12/938,176

(22) Filed: Nov. 2, 2010

(65) Prior Publication Data

US 2011/0107176 A1 May 5, 2011

Related U.S. Application Data

(60) Provisional application No. 61/257,446, filed on Nov. 2, 2009.

(51) Int. Cl.
*H03M 13/00* (2006.01)
(52) U.S. Cl.
USPC .......................................... 714/755; 714/786
(58) Field of Classification Search .................. None
See application file for complete search history.

(56) References Cited

U.S. PATENT DOCUMENTS

| 6,233,251 | B1 * | 5/2001 | Kurobe et al. ................. 370/471 |
| 8,023,525 | B2 * | 9/2011 | Oh et al. ........................ 370/432 |
| 2009/0034442 | A1 * | 2/2009 | Song et al. .................... 370/310 |
| 2009/0041129 | A1 * | 2/2009 | Suh et al. ................. 375/240.25 |
| 2009/0103632 | A1 * | 4/2009 | Choi et al. ............... 375/240.25 |
| 2009/0323683 | A1 * | 12/2009 | Song et al. .................... 370/389 |
| 2011/0007677 | A1 * | 1/2011 | Song et al. .................... 370/310 |
| 2011/0142072 | A1 * | 6/2011 | Song et al. .................... 370/474 |
| 2011/0158167 | A1 * | 6/2011 | Song et al. .................... 370/328 |
| 2012/0114070 | A1 * | 5/2012 | Choi et al. .................... 375/295 |

* cited by examiner

*Primary Examiner* — Gabriel Chu
(74) *Attorney, Agent, or Firm* — Lee, Hong, Degerman, Kang & Waimey

(57) ABSTRACT

A transmitting system, a receiving system, and a method of processing broadcast signals are disclosed. The method for transmitting a broadcast signal includes encoding mobile data for forward error correction (FEC) to build Reed-Solomon (RS) frames, dividing the built RS frames into a number of RS frame portions, dividing one of the RS frame portions into Serially Concatenated Convolutional Code (SCCC) blocks, mapping the SCCC blocks including the convolution-coded data to mobile data blocks according to a SCCC block mode which identifies relationship between the mobile data blocks and the SCCC blocks, forming a data group including the mobile data blocks, forming mobile data packets including data in the data group and, multiplexing a specified number of the mobile data packets, a first scalable number of the mobile data packets, and a second scalable number of main data packets.

10 Claims, 67 Drawing Sheets

FIG. 4
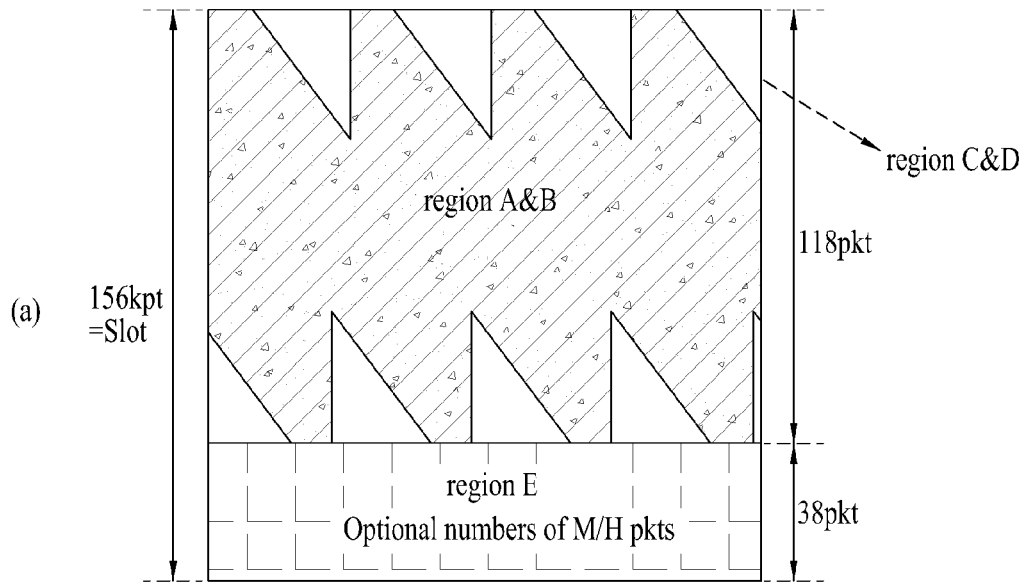
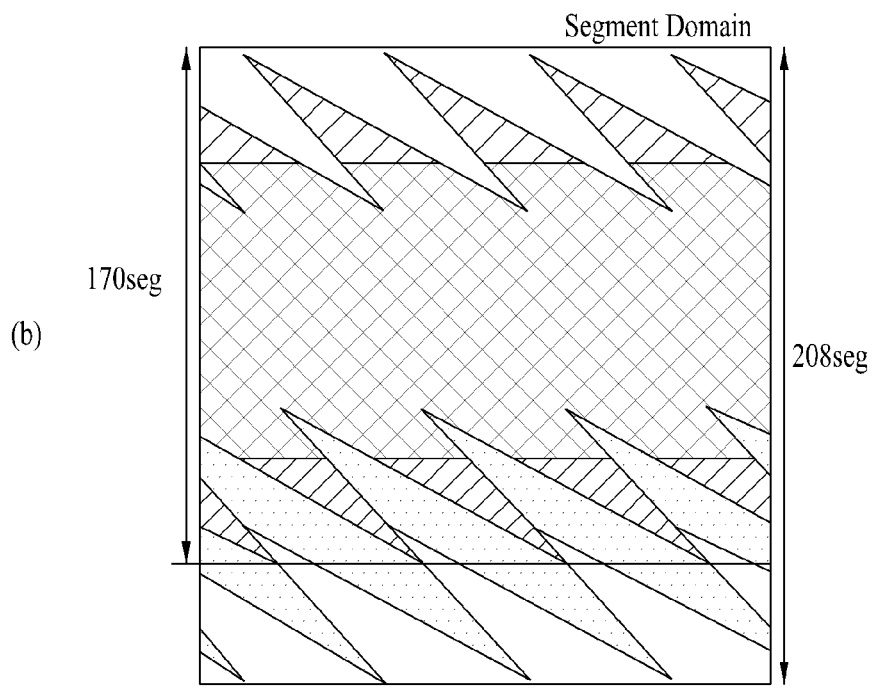

FIG. 6

| Group Type | Group Division | | Group Format | # pkt / Slot | | Description |
|---|---|---|---|---|---|---|
| | Primary | Scondary | | M/H | Main | |
| 0 | ABCD / AB | - / CD | G0 | 118 | 38 | CMM (no Region E) |
| 1-0 | ABCD | E | G1-0 | 156 | 0 | Region ABCD: CMM<br>Region E: EMM |
| 1-1 | | | G1-1 | 155 | 1 | |
| 1-2 | | | G1-2 | 154 | 2 | |
| 1-4 | | | G1-4 | 152 | 4 | |
| 1-8 | | | G1-8 | 148 | 8 | |
| 2-0 | AB | CDE | G2-0 | 156 | 0 | Region AB: CMM<br>Region CDE: EMM |
| 2-1 | | | G2-1 | 155 | 1 | |
| 2-2 | | | G2-2 | 154 | 2 | |
| 2-4 | | | G2-4 | 152 | 4 | |
| 2-8 | | | G2-8 | 148 | 8 | |
| 3-0 | ABCD | - | G2-0 | 156 | 0 | All Region: EMM |
| 3-1 | | | G2-1 | 155 | 1 | |
| 3-2 | | | G2-2 | 154 | 2 | |
| 3-4 | | | G2-4 | 152 | 4 | |
| 3-8 | | | G2-8 | 148 | 8 | |
| 4 | ABCD | - | G3 | 156 | 0 | Increased Bandwidth Mode (Special Use Case)<br>No MPEG2 Headers, No VSB RS parities.<br>Output packet of Pre-processor has 207 bytes not 188 bytes |

Black: A/153-compatible (CMM)
Bold: A/153-non-compatible (EMM)

Note: A Parade consists of Group Divisions from Groups having an identical Group Type

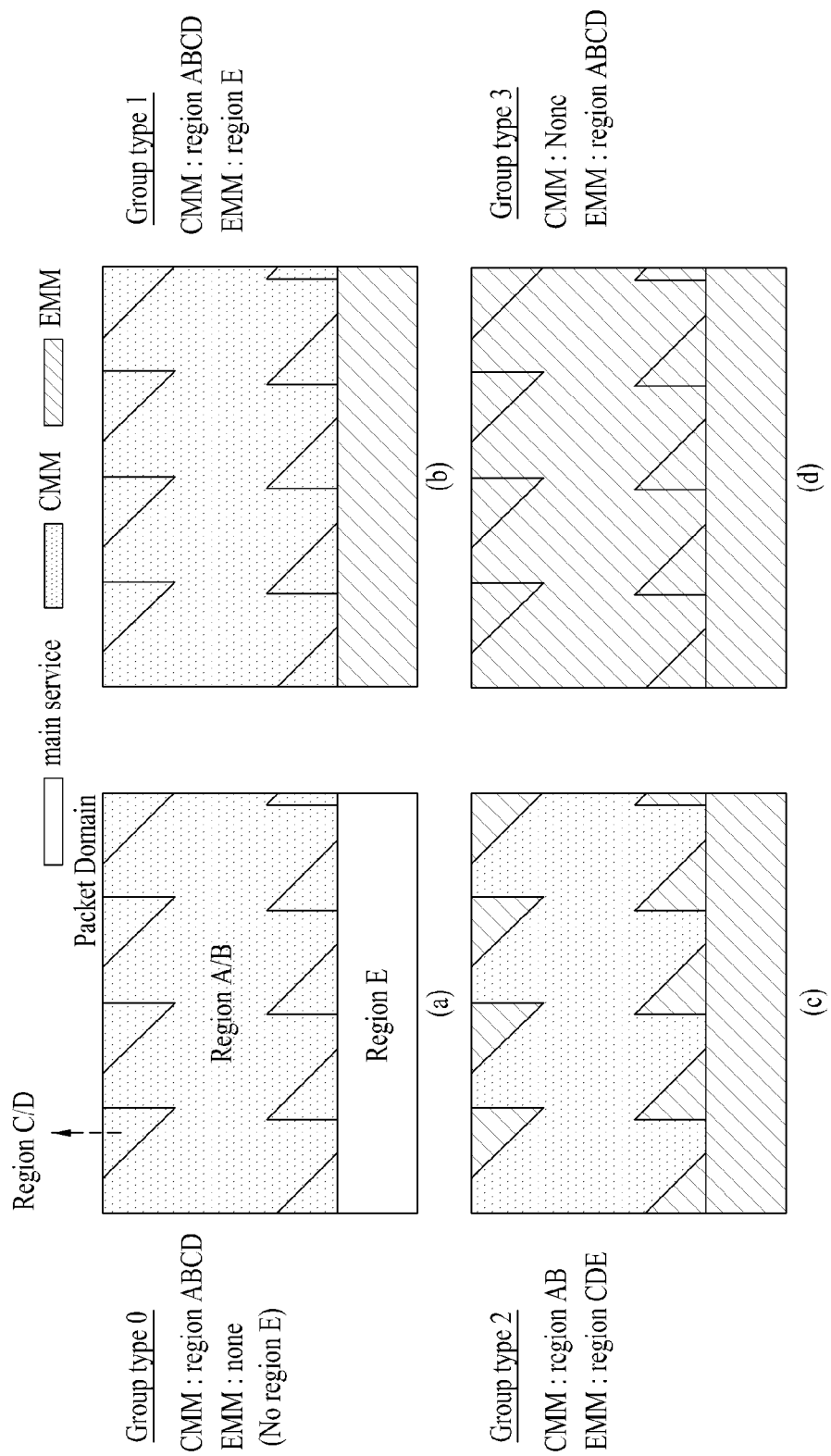

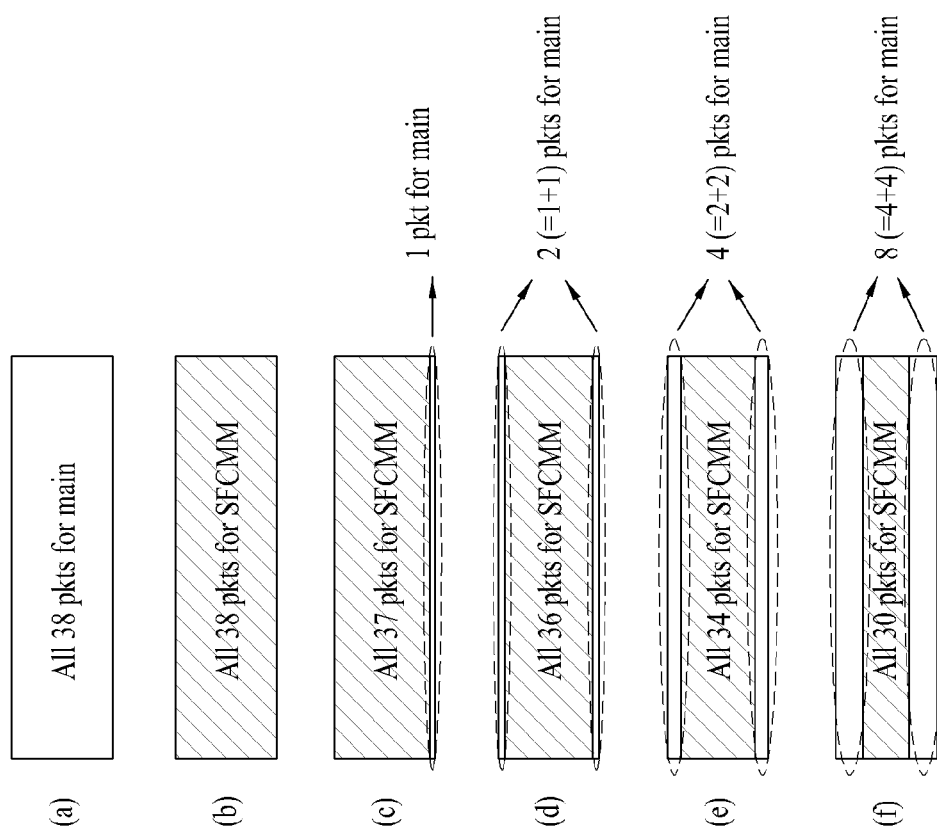

FIG. 33
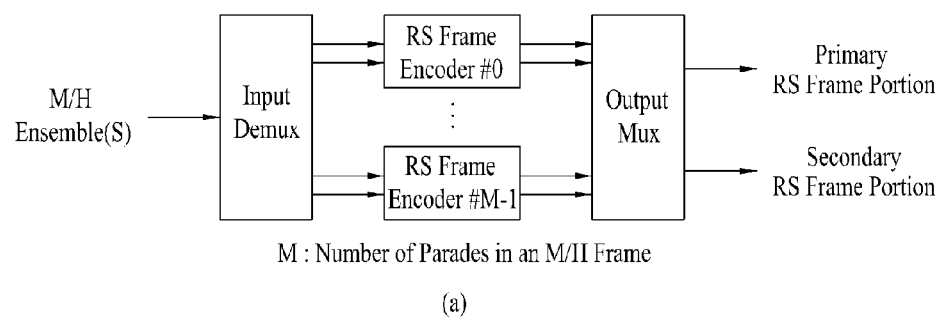
(a)
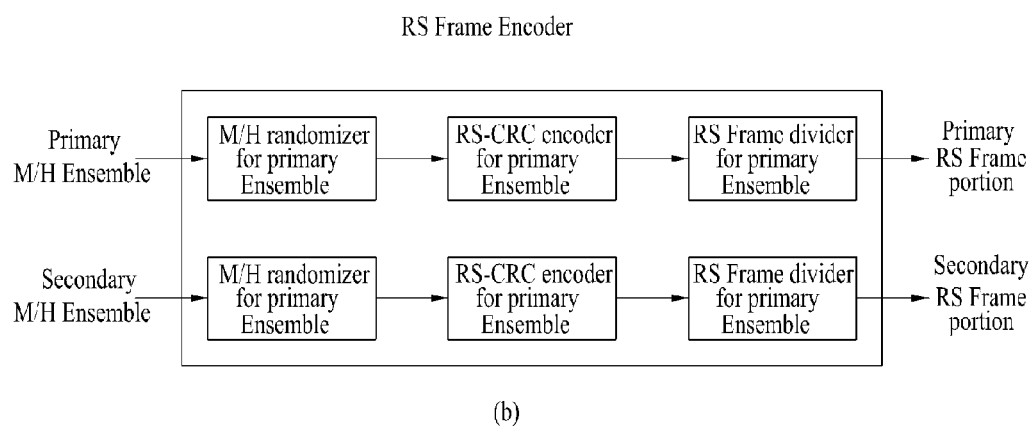
(b)

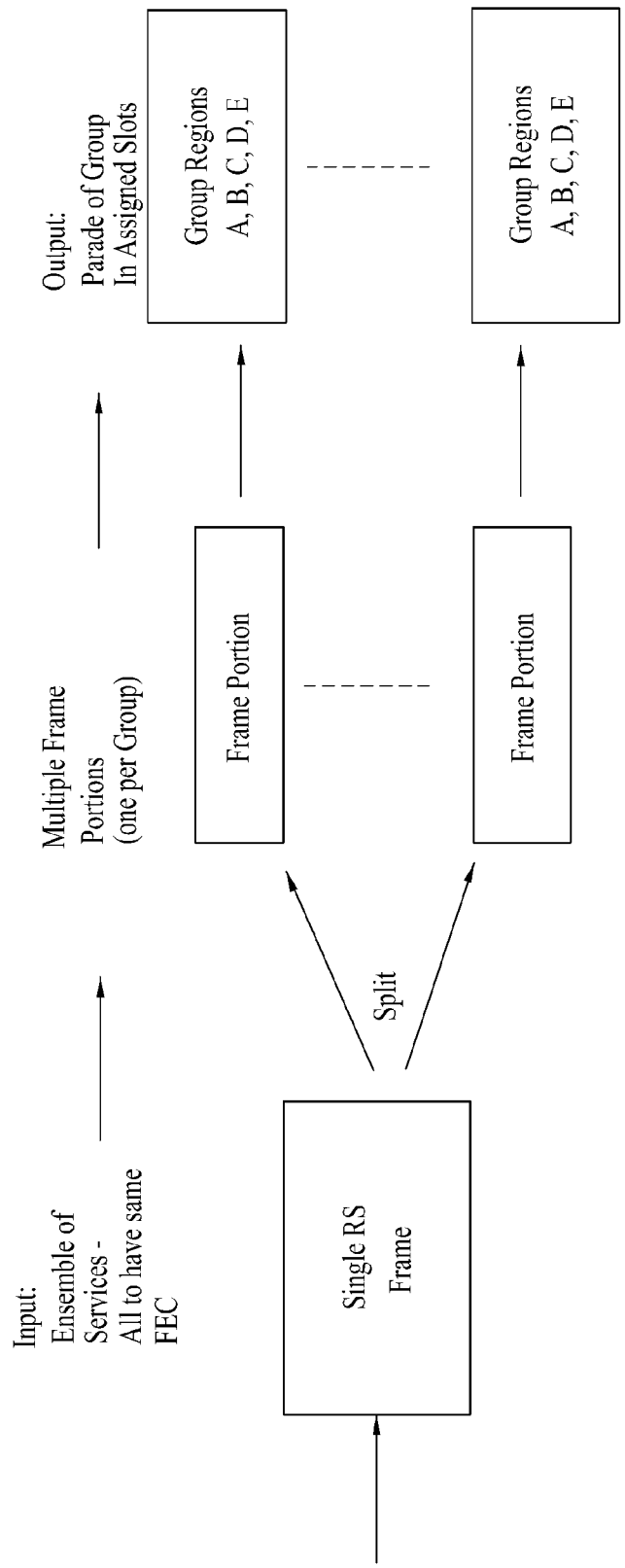

FIG. 39

| Syntax | No. of Bits | Format |
|---|---|---|
| TPC_data { | | |
|   sub-frame_number | 3 | uimsbf |
|   slot_number | 4 | uimsbf |
|   parade_id | 7 | uimsbf |
|   if(sub-frame_number≤1) { | | |
|     current_starting_group_number | 4 | uimsbf |
|     current_number_of_groups_minus_1 | 3 | uimsbf |
|   } | | |
|   if(sub-frame_number≥2) { | | |
|     next_starting_group_number | 4 | uimsbf |
|     next_number_of_groups_minus_1 | 3 | uimsbf |
|   } | | |
|   parade_repetition_cycle_minus_1 | 3 | uimsbf |
|   if(sub-frame_number≤1) { | | |
|     current_rs_frame_mode | 2 | bslbf |
|     current_rs_code_mode_primary | 2 | bslbf |
|     current_rs_code_mode_secondary | 2 | bslbf |
|     current_sccc_block_mode | 2 | bslbf |
|     current_sccc_outer_code_mode_a | 2 | bslbf |
|     current_sccc_outer_code_mode_b | 2 | bslbf |
|     current_sccc_outer_code_mode_c | 2 | bslbf |
|     current_sccc_outer_code_mode_d | 2 | bslbf |
|   } | | |
|   if(sub-frame_number≥2) { | | |
|     next_rs_frame_mode | 2 | bslbf |
|     next_rs_code_mode_primary | 2 | bslbf |
|     next_rs_code_mode_secondary | 2 | bslbf |
|     next_sccc_block_mode | 2 | bslbf |
|     next_sccc_outer_code_mode_a | 2 | bslbf |
|     next_sccc_outer_code_mode_b | 2 | bslbf |
|     next_sccc_outer_code_mode_c | 2 | bslbf |
|     next_sccc_outer_code_mode_d | 2 | bslbf |
|   } | | |
|   fic_version | 5 | uimsbf |
|   parade_continuity_counter | 4 | uimsbf |
|   if(sub-frame_number≤1) { | | |
|     current_TNoG | 5 | uimsbf |
|     reserved | 5 | bslbf |
|   } | | |
|   if(sub-frame_number≥2) { | | |
|     next_TNoG | 5 | uimsbf |
|     current_TNoG | 5 | uimsbf |
|   } | | |
|   if(tpc protocol version == '11000') { | | |
|     if(sub-frame_number<1) { | | |
|       current scalable mode | 3 | uimsbf |
|     } | | |
|     if(sub-frame_number>2) { | | |
|       next scalable mode | 3 | uimsbf |
|     } | | |
|     sccc block extension mode | 2 | uimsbf |
|     reserved | 11 | bslbf |
|   } | | |
|   if(tpc protocol version == '11111') { | | |
|     reserved | 16 | bslbf |
|   } ~~reserved~~ | | |
|   tpc_protocol_version | 5 | bslbf |
| } | | |

FIG. 44
(a) 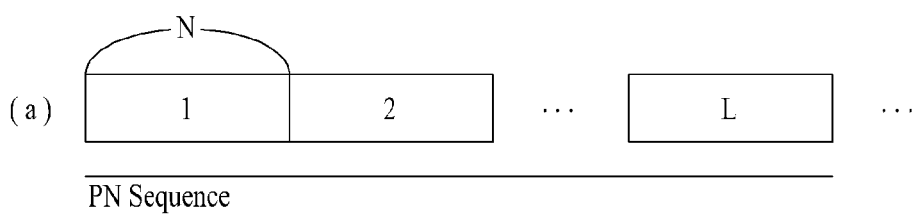
PN Sequence
(b) 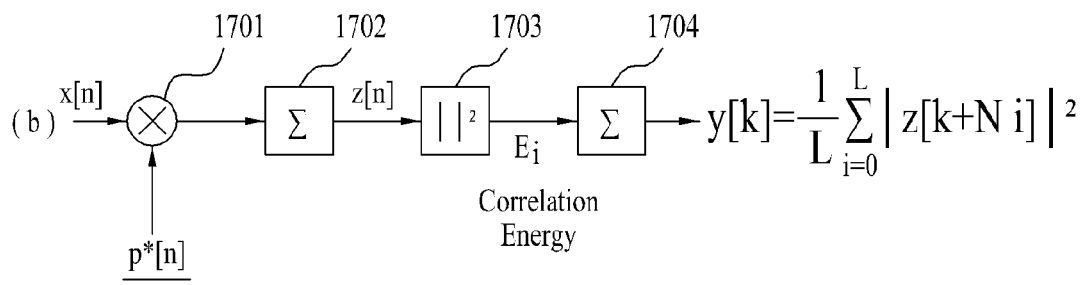
L : Number of parts
N : Length of each part

FIG. 53

| Index | : | 0 | 1 | 2 | 3 | ... | 11997 | 11998 | 11999 | 12000 | 12001 | 12002 | ... | 23997 | 23998 | 23999 | ... |
|---|---|---|---|---|---|---|---|---|---|---|---|---|---|---|---|---|---|
| Output | : | 0 | 89 | 267 | 534 | ... | 6267 | ... | 6089 | 6000 | 6000 | 6089 | 6267 | ... | 267 | 89 | 0 | ... |
| Direction | : | <--- | --- | --- | --- | --- | --- | --- | forward | --- | --- | ---> | <--- | --- | --- | reverse | --- | --- | ---> |

FIG. 54
Interleaver Operation
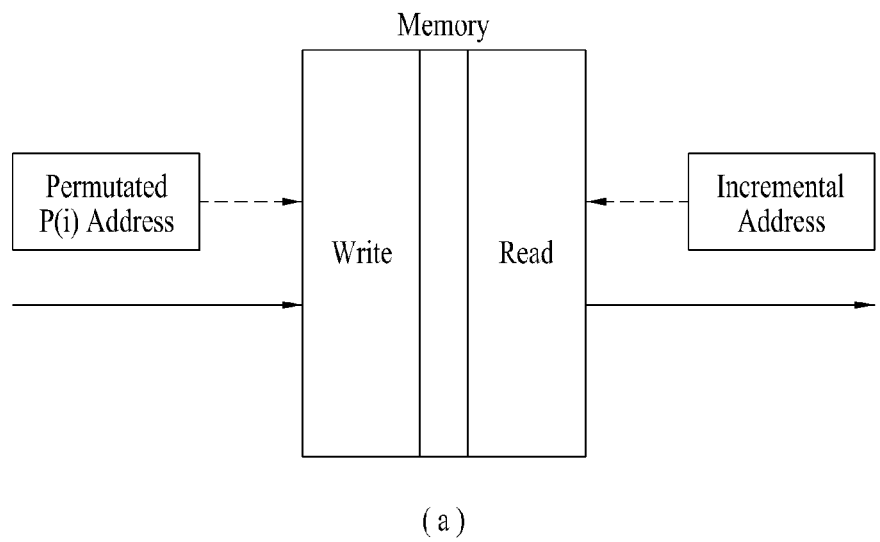
(a)
Deinterleaver Operation
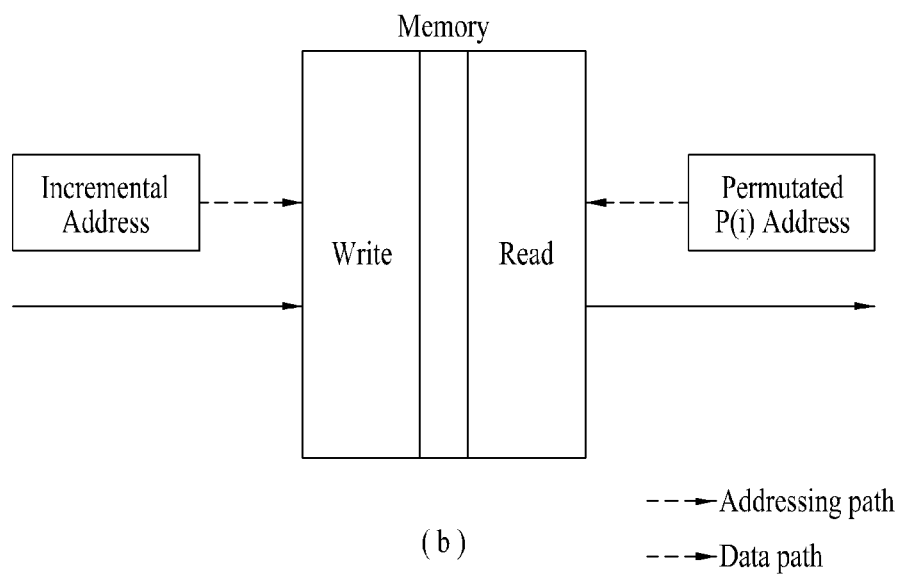
(b)
---▶ Addressing path
---▶ Data path

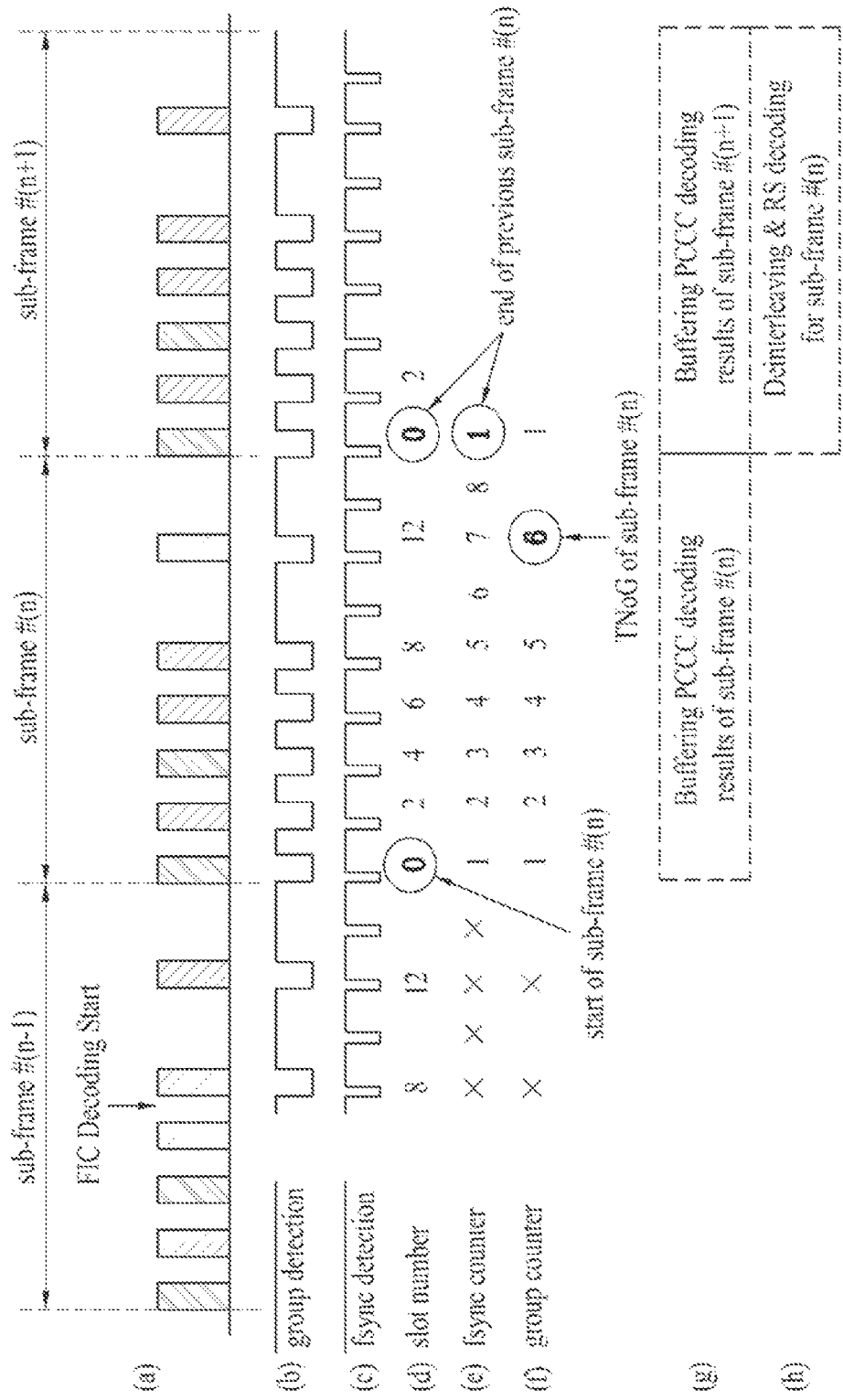

METHOD AND APPARATUS FOR TRANSMITTING BROADCAST SIGNAL IN TRANSMITTER

This application claims the benefit of U.S. Provisional Application No. 61/257,446, filed on Nov. 2, 2009 which is hereby incorporated by reference as if fully set forth herein.

BACKGROUND OF THE INVENTION

1. Field of the Invention

The present invention relates to a method and apparatus for transmitting a broadcast signal in a transmitter.

2. Discussion of the Related Art

The Vestigial Sideband (VSB) transmission mode, which is adopted as the standard for digital broadcasting in North America and the Republic of Korea, is a system using a single carrier method.

Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to an apparatus and method for transmitting a broadcast signal in a transmitter that substantially obviate one or more problems due to limitations and disadvantages of the related art.

An object of the present invention is to provide a method for transmitting digital broadcast that can create a mobile service group, and that can use data included in the created mobile service group when forming a mobile data packet, and that can add a specified number of scalable mobile data packets, thereby realizing full channel capability when transmitting mobile data. Since the added specified number of mobile data packets may scalably vary depending upon the intentions of the system designer, the entire packets may be allocated for mobile data, or a portion of the packets may be allocated for main data. By doing so, since a full channel bandwidth may be used, the mobile data transmitting performance may be enhanced.

Another object of the present invention is to provide a method for transmitting a digital broadcast, wherein RS frames of mobile data are encoded for Forward Error Correction (FEC), the encoded RS frames are divided into a plurality of RS frame portions, one of the divided RS frame portions is divided into a plurality of Serially Concatenated Convolutional Code (SCCC) blocks, data included in the SCCC blocks is encoded according to an SCCC code rate, and the encoded SCCC blocks are mapped to a mobile data block to form a data group. Here, the SCCC code rate may be independently (or individually) applied according to a mobile data block to which the SCCC blocks are mapped.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a transmitting system of the present invention includes an RS frame encoder 111 for performing Forward Error Correction (FEC) encoding on an RS frame including mobile data and dividing the encoded RS frame into RS frame portions, a block processor 112 for dividing an RS frame portion to form SCCC blocks, performing convolutional coding on data included in the SCCC blocks according to an SCCC code rate, and mapping the SCCC blocks including the convolutional-coded data to a mobile data block, a group formatter (or a data group formatter) 113 for forming a group including the mobile data blocks, a packet formatter for forming a mobile data packet using data included in the group, and a packet multiplexer 120 for multiplexing a specified number of mobile data packets and a first scalable number of mobile data packets, and a second scalable number of main data packets.

The sum of the first scalable number and the second scalable number is fixed to a specified value which can be changed at the designer's discretion. In the present invention, the first scalable number may be 11, 20, 29, or 38.

In the present invention, a data group (or a group) may be divided into a plurality of regions. The RS frame may include a primary RS frame and a secondary RS frame having different FEC code rates. In this case, the primary RS frame and the secondary RS frame are transmitted through different regions of groups.

In the present invention, the SCCC code rate may be ½, ⅓, or ¼. The SCCC code rate may be independently or equally applied to regions of the group and may be independently applied to regions of the group through which the primary RS frame and the secondary RS frame are transmitted.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 4 illustrates an embodiment of a group according to the present invention;

FIG. 6 illustrates a table of group types associated with the size of the E region according to the present invention;

FIG. 7 illustrates an embodiment of a group format of each group type before interleaving according to the present invention;

FIG. 8 illustrates an embodiment of an E region having various sizes according to the present invention;

FIG. 33 illustrates an embodiment of an RS frame encoder 111 included in a preprocessor in a transmitting system according to the present invention;

FIGS. 35A and 35B illustrate another embodiment of a procedure in which an RS frame is divided into RS frame portions;

FIG. 39 illustrates a syntax structure of a TPC data field for signaling digital broadcast data according to an embodiment of the present invention;

FIG. 44 illustrates a known data symbol sequence and a partial correlation unit according to an embodiment of the present invention.

FIG. 53 illustrates an example of a symbol interleaving pattern when an offset value is set to '0' according to an embodiment of the present invention.

FIG. 54 is a conceptual diagram illustrating a process for performing the symbol interleaving using only a symbol interleaving pattern P(i) according to an embodiment of the present invention.

FIG. 64 illustrates a detailed embodiment of a process of extracting a TNoG according to an embodiment of the present invention.

DETAILED DESCRIPTION OF THE INVENTION

Figure 1:
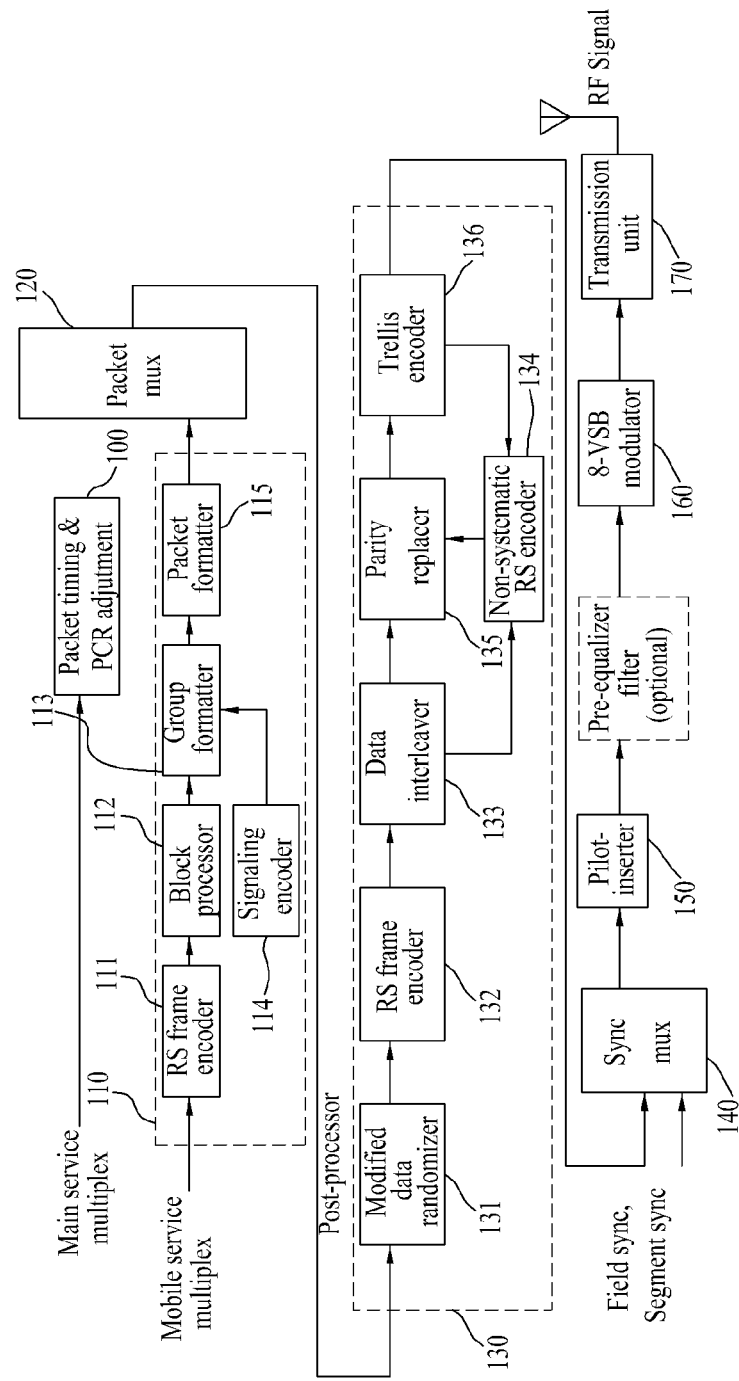
FIG. 1 illustrates a block view of a transmitting system according to a first embodiment of the present invention.

Although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main data correspond to data that can be received by the conventional fixed-type receiving system and may include audio/video (A/V) data. More specifically, the main data may include A/V data of high definition (HD) or standard definition (SD) levels and may also include diverse data types required for data broadcasting. Also, the known data sequences (or known data) correspond to data pre-known according to a pre-arranged agreement between the receiving system and the transmitting system.

Among the terms used in the description of the present invention, M/H (or MH) corresponds to the first letters (or abbreviation) of the terms 'mobile' and 'handheld', thereby corresponding to an opposite concept of 'fixed'. Also, the M/H service data may include at least one of mobile service data and handheld service data. Herein, the M/H service data may also be referred to as mobile service data (or mobile data) for simplicity. At this point, not only M/H service data but also any one type of mobile or portable (or handheld) service data may be included in the M/H service data. Therefore, the mobile service data will not be limited only to the M/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be serviced as the main service data.

Also, a data service using the mobile service data may include weather forecast services, traffic information services, stock information services, viewer participation quiz programs, real-time polls & surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

Reference will now be made in detail to the preferred embodiments of the present invention, examples of which are illustrated in the accompanying drawings. Wherever possible, the same reference numbers will be used throughout the drawings to refer to the same or like parts.

FIG. 1 illustrates a block view of a transmitting system according to a first embodiment of the present invention.

As shown in FIG. 1, the transmitting system broadly includes a Packet Timing & PCR Adjustment 100 receiving main data, a Pre-Processor 110 pre-processing mobile service data, a packet multiplexer (MUX) 120, a Post-Processor 130, a Sync multiplexer (MUX) 140, a Pilot Inserter 150, a modulator 160, and a transmission unit 170. Since a displacement of a packet including mobile service data become different from the displacement of a packet not including any mobile data during a time-division process, the Packet Timing & PCR Adjustment 100 is included to compensate such difference in displacement.

The Pre-Processor 110 performs additional encoding on the mobile service data being inputted. The mobile service data being processed by the Pre-Processor 110 may swiftly and robustly respond to noise and change in channel. The Pre-Processor 110 may include a Reed-Solomon (RS) frame encoder 111, a Block processor 112, a group formatter 113, a signaling encoder 114, and a packet formatter 115.

The Reed-Solomon (RS) frame encoder 111 may create at least one RS frame after performing data randomization on the mobile service data. The at least one RS frame may include a primary RS frame and a secondary RS frame according to the FEC code. The RS frame encoder may include a number of RS frame encoders according to the number of RS frames and may independently (or individually) perform encoding on the primary RS frame and the secondary RS frame. The RS frame is divided into a plurality of RS frame portions to be output.

The main function of a Block processor 112 is an outer-encoding of the SCCC for the output of the RS Frame encoder 111. The operations of the Block processor 112 include RS Frame Portion to SCCC Block conversion, byte-to-bit conversion, convolutional encoding, symbol interleaving, symbol-to-byte conversion and SCCC Block to mobile data Block conversion.

The block processor 112 converts an RS frame portion into an SCCC block. The block processor 112 converts a mobile service data byte contained in the SCCC block into bit-based mobile service data. The block processor 112 performs convolution encoding of ½, ⅓, or ¼ rate on the bit-based mobile service data. In this case, the ½ rate means an encoding process in which two bits are output in response to an input of one bit, the ⅓ rate means an encoding process in which three bits are output in response to an input of two bits, and the ¼ rate means an encoding process in which four bits are output in response to an input of four bits. Output bits are contained in a symbol. The block processor 112 performs interleaving of the convolution-encoded output symbol. The block processor 112 converts an interleaved symbol into byte-based data, and converts an SCCC block into a mobile data block.

The group formatter 113 forms a group using the output data of the block processor 112.

The group formatter 113 maps FEC-encoded mobile service data to an interleaved form of a group format. At this time, the above-mentioned mapping is characterized in that FEC-encoded mobile service data is inserted into either a data block of a corresponding group or a group region according to a coding rate of each FEC-encoded mobile service data received from the block processor 112.

In addition, the group formatter 106 inserts signaling data, a data byte used for initializing the trellis encoder, and a known data sequence. Further, the group formatter 106 inserts main service data, and a place-holder for an MPEG-2 header and a non-systematic RS parity. The group formatter 113 may insert dummy data to generate a group of a desired format. After inserting various data, the group formatter 113 performs deinterleaving of data of the interleaved group. After performing the deinterleaving operation, the group returns to an original group formed before the interleaving operation.

The signaling encoder 114 may perform Forward Error Correction (FEC) encoding on the signaling information being inserted in the group, which is generated from the group formatter 113. Herein, the signaling information may include a Transmission Parameter Channel (TPC) and a Fast Information Channel (FIC).

The Packet Formatter 115 is the last process in the pre-processor 100. The packet formatter 115 shall first remove the main data place holders and the RS parity place holders.

The packet formatter 115 next shall replace the 3-bytes MPEG header place holder with an MPEG header having a packet PID. An MPEG TS sync byte is then inserted before each 187-byte data packet. Therefore, the packet formatter 115 may output 118 mobile-data-encapsulating TS packets per group.

The Post-processor 130 performs post-processing in order to modulate the main data according to the VSB method. The receiver may differentiate (or identify) and process the pre-processed mobile service data and main data multiplexed by the packet multiplexer (MUX) 120 of the transmitter.

The Post-processor 130 includes a modified data randomizer (or data randomizer) 131, an RS encoder 132, a Data interleaver 133, a non-systematic RS encoder 134, a parity replacer 135, and a Trellis Encoding Module (or Trellis encoder) 136.

The modified data randomizer 131 is the first block of the post-processor. The modified data randomizer 131 performs data-randomizing on the main service data and the MPEG header and may allow the data-randomizing on the mobile service data to be bypassed.

Furthermore, only a portion of the mobile service data packet may be randomized. For example, when the pre-processor 110 performs randomizing in advance on the mobile service data, the modified data randomizer 131 may discard (or delete) the synchronization byte among the 4-byte MPEG header included in the mobile service data packet and may perform randomizing only on the remaining 3 bytes, thereby outputting the randomized 3 bytes to the RS encoder 132. More specifically, with the exception of the MPEG header, the remaining portion of the data may be outputted to the RS encoder 132 without being randomized. Also, the modified data randomizer 131 may or may not perform randomizing on the known data sequence, TCM initialization data place-holder, and signaling data, which are included in the mobile service data packet.

The RS encoder 132 performs RS-encoding on the data randomized by the modified data randomizer 131 or the data bypassing the modified data randomizer 131, so as to add 20 bytes of RS parity to the corresponding data, thereby outputting the processed data to the data interleaver 133.

If the inputted data corresponds to a main data packet, the RS encoder shall perform the same systematic RS encoding process, adding 20 bytes of RS FEC data at the end of each of these 187-byte packets. If the inputted data corresponds to a mobile service data packet, the RS encoder shall perform a non-systematic RS encoding process. In this case, 20 bytes of RS FEC data obtained from the non-systematic RS encoding process shall be inserted in a predetermined parity byte location within each mobile data packet.

The Data interleaver 133 receives the data outputted from the RS encoder 132, and, then, the Data interleaver 133 may convolutionally interleave the data in byte units. The output of the data interleaver 133 is inputted to the non systematic RS encoder 134 and the parity replacer 135.

In order to process the data outputted from the Trellis Encoding Module 136, which is positioned in a further end of the parity replacer 135, in to known data sequence defined based upon an agreement between the transmitting end and the receiving end, the memory included in the Trellis Encoding Module 136 is required to be initialized.

Depending upon the state of the Trellis Encoding Module 136, the value of the initialization data is decided, and the initialization data are generated accordingly. The generated initialization data are inputted to the Trellis Encoding Module 136 instead of the TCM initialization placeholder (i.e., substituting the TCM initialization placeholder).

Therefore, due to the influence of the substituted initialization data, a process of recalculating the RS parity and replacing the RS parity being outputted from the data interleaver 133 with the newly calculated RS parity is required.

The Non-systematic RS encoder 134 receives a mobile service data packet including the TCM initialization placeholder, which is to be replaced with the initialization data by the data interleaver 133, and the Non-systematic RS encoder 134 also receives initialization data from the Trellis Encoding Module 136. Among the data of the inputted mobile service data packet, the TCM initialization placeholder may be replaced with the initialization data, and non-systematic RS encoding may be performed on the mobile service data packet. Thereafter, the mobile service data packet is outputted to the parity replacer 135.

If the data outputted from the data interleaver 133 correspond to data included in the main data packet, or if the data outputted from the data interleaver 133 correspond to data included in a mobile service data packet, which does not include a TCM initialization placeholder that is to be replaced, the parity replacer 135 selects the output data of the data interleaver 133 and outputs the selected data to the Trellis Encoding Module 136. Alternatively, if the data outputted from the data interleaver 133 correspond to data included in a mobile service data packet including a TCM initialization placeholder, the parity replacer 135 selects the data outputted from the non-systematic RS encoder 134 and outputs the selected data to the Trellis Encoding Module 136.

The Trellis Encoding Module 136 includes 12 trellis encoders and converts the byte-unit data being outputted from the parity replacer 135 into symbol-unit data. Then, the Trellis Encoding Module 136 performs a 12-way interleaving process on the converted data so as to Trellis-encoding the 12-way interleaved data, thereby outputting the processed data to the sync multiplexer (MUX) 140.

The sync MUX 140 inserts a field sync and a segment sync, which are outputted from the Trellis Encoding Module 136, in the received data, thereby outputting the processed data to the pilot inserter 150. The pilot inserter 150 inserts a pilot signal in the data outputted from the sync MUX 140.

The modulator 160 may modulate the data outputted from the pilot inserter 150 in a VSB method. Thereafter, the transmission unit 170 transmits the signal modulated by the modulator 160 to the receiver.

Figure 2:
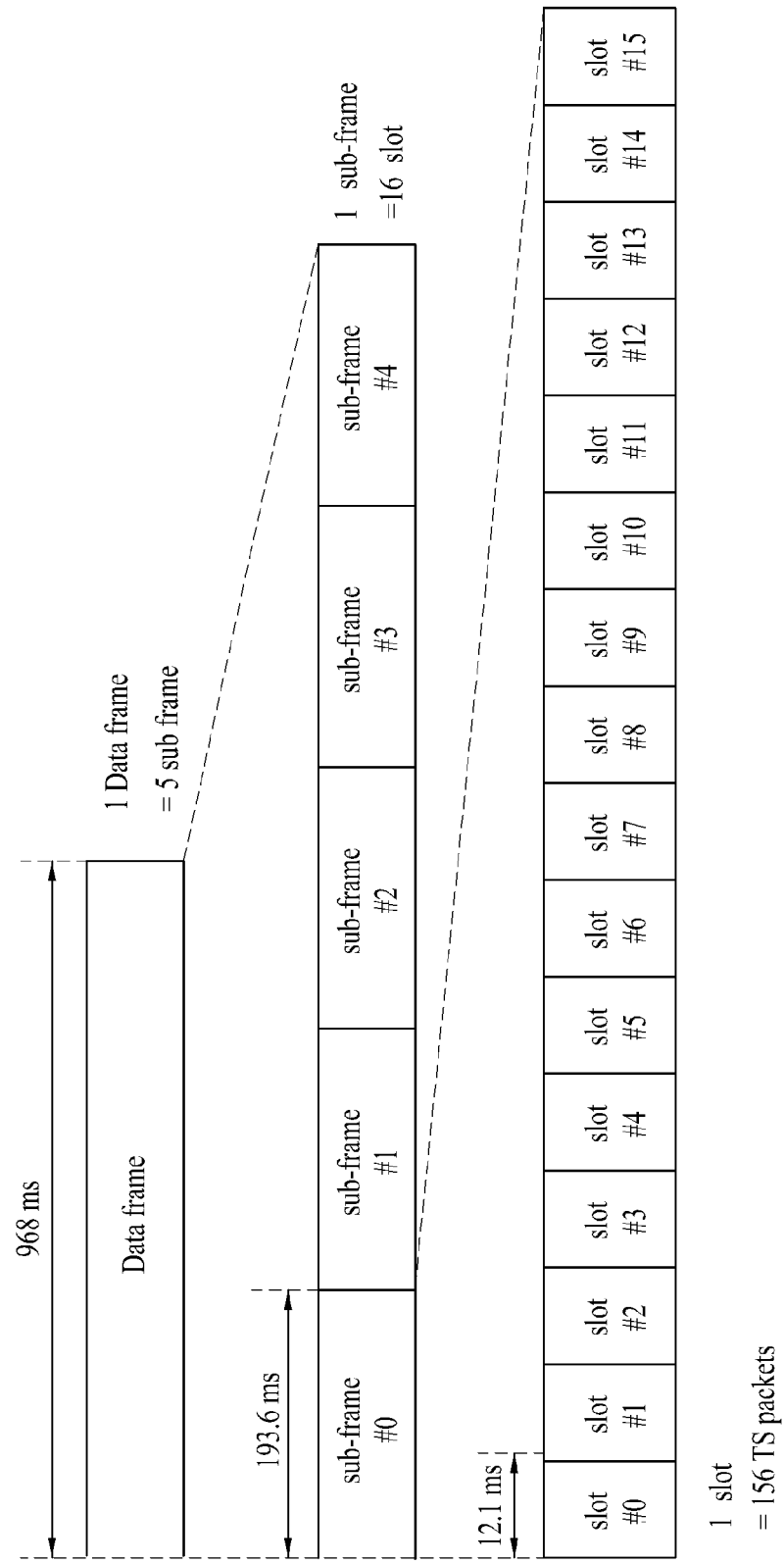
FIG. 2 illustrates a transmission frame structure for transmitting/receiving mobile service data according to one embodiment of the present invention.

FIG. 2 illustrates a transmission frame structure for transmitting/receiving mobile service data according to one embodiment of the present invention.

In the embodiment of the present invention, the mobile service data are first multiplexed with main service data in transmission frame units and, then, modulated in a VSB mode and transmitted to the receiving system.

The term "transmission frame" mentioned in the embodiment of the present invention may be defined as the concept of a time during which main service data and mobile service data are transmitted. For example, one transmission frame may be defined as a time consumed for transmitting 20 VSB transmission frames.

At this point, one transmission frame consists of K1 number of sub-frames, wherein one sub-frame includes K2 number of slots. Also, each slot may be configured of K3 number of data packets. In the embodiment of the present invention, K1 will be set to 5, K2 will be set to 16, and K3 will be set to 156 (i.e., K1=5, K2=16, and K3=156). The values for K1, K2, and K3 presented in this embodiment either correspond to values according to a preferred embodiment or are merely exemplary. Therefore, the above-mentioned values will not limit the scope of the present invention.

In the example shown in FIG. 2, one transmission frame consists of 5 sub-frames, wherein each sub-frame includes 16 slots. In this case, the transmission frame according to the present invention includes 5 sub-frames and 80 slots.

Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of payload data as payload data of a segment, a data packet prior to being interleaved may also be used as a data segment.

156 data packets contained in a slot may be composed of 156 main service data packets, may be composed of 118 mobile service data packets and 38 main service data packets, or may be composed of (118+M) mobile service data packets and L main service data packets. In this case, the sum of M and L may be set to 38 according to one embodiment of the present invention. In addition, M may be zero '0' or a natural number of 38 or less.

One group is transmitted during a single slot. In this case, the transmitted group may include 118 mobile service data packets or (118+M) mobile service data packets.

That is, a group may be defined as a set of data units including mobile service data present in one slot. In this case, the mobile service data may be defined as pure mobile service data, or may be defined as the concept that includes data for transmitting mobile service data, such as signaling data, known data, etc.

Figure 3:
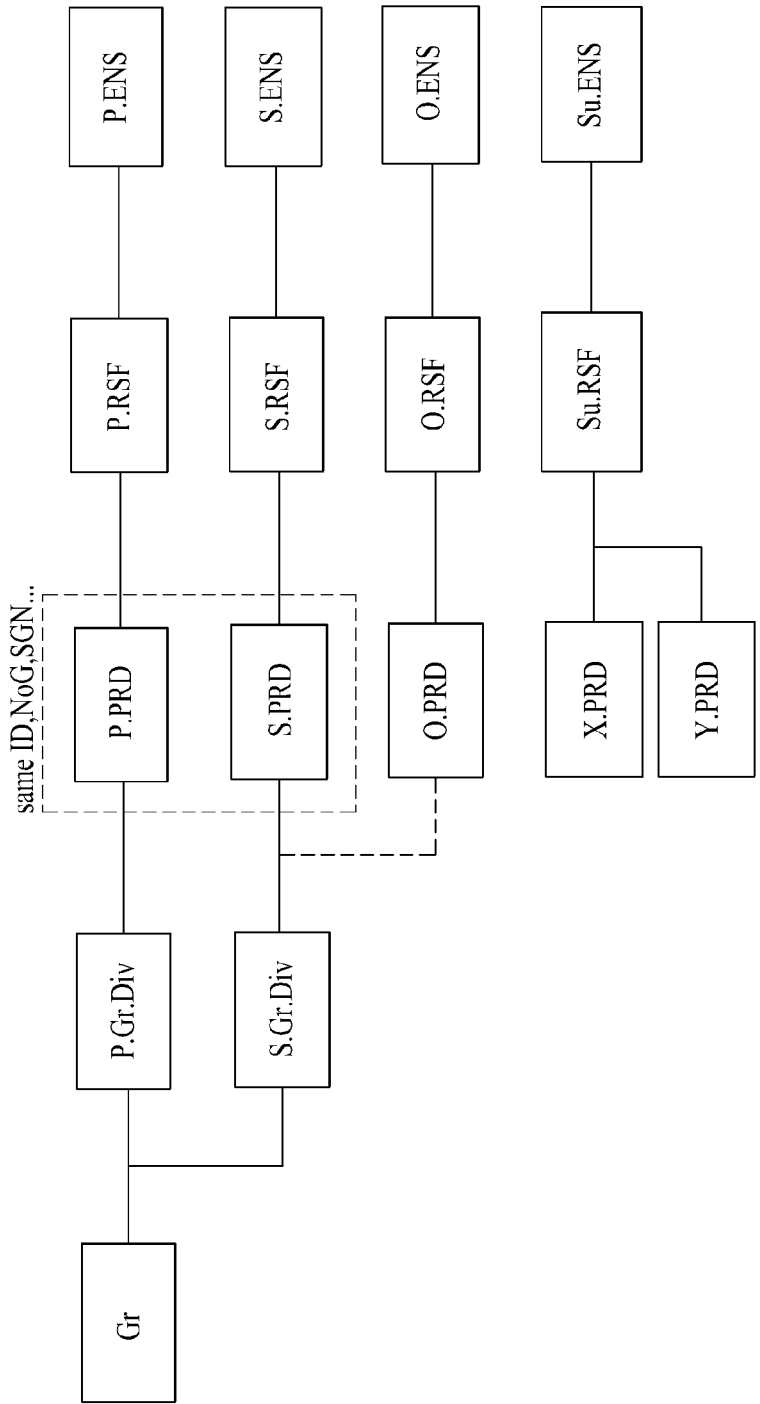
FIG. 3 illustrates an embodiment of a relationship between a group division, a parade, and an ensemble according to the present invention.

FIG. 3 illustrates an embodiment of a relationship between a group division, a parade, and an ensemble according to the present invention.

A Group Division is a region of data group (or group) within a Slot. The Group Division is categorized into the Primary Group Division or the Secondary Group Division. The parade is a set of group divisions having the same FEC parameters.

The collection of Primary Group Division within a transmission Frame forms the Primary Parade, while the collection of Secondary Group Division forms the Secondary or Overlay Parade.

All secondary group divisions are transmitted through the same slots as primary group divisions which are paired with the secondary group divisions. As shown in FIG. 2, the secondary parade has the same parade identifier (ID) as the corresponding primary parade.

The parade is a set of group divisions having the same FEC parameters.

The overlay parade is a set of secondary group divisions. In this case, the secondary group divisions are not paired with primary group divisions. The RS frame is a 2D data frame created through RS-CRC encoding of an RS frame payload.

A primary RS frame is created through RS-CRC encoding of a primary RS frame payload. The primary RS frame is transmitted through a primary parade. A secondary RS frame is created through RS-CRC encoding of a secondary RS frame payload. The secondary RS frame is transmitted through a secondary parade. An overlay RS frame is created through RS-CRC encoding of an overlay RS frame payload. The overlay RS frame is transmitted through an overlay parade. A super RS frame is created through RS-CRC encoding of a super RS frame payload. The super RS frame is transmitted through a super parade.

An ensemble is a set of RS frames having the same FEC code and each frame encapsulates a set of IP streams.

A primary ensemble is a set of consecutive primary RS frames. A secondary ensemble is a set of consecutive secondary RS frames. An overlay ensemble is a set of consecutive overlay RS frames. A super ensemble is a set of consecutive super RS frames.

As shown in FIG. 2, the primary ensemble, the primary RS frame, and the primary parade may be mapped 1:1:1 and the secondary ensemble, the secondary RS frame, and the secondary parade may also be mapped 1:1:1. The overlay ensemble, the overlay RS frame, and the overlay parade may also be mapped 1:1:1. On the other hand, the super ensemble, the super RS frame, and the super parade may be mapped 1:1:2. The following are detailed examples.

A primary RS frame payload may be RS-CRC encoded to create a primary RS frame and the primary RS frame may be transmitted through a primary parade. Here, the primary parade may be transmitted through allocation to a plurality of groups and, specifically, may be transmitted through allocation to primary group divisions of the groups.

A secondary RS frame payload may be RS-CRC encoded to create a secondary RS frame and the secondary RS frame may be transmitted through a secondary parade. Here, the secondary parade may be transmitted through allocation to a plurality of groups and, specifically, may be transmitted through allocation to secondary group divisions of the groups.

An overlay RS frame payload may be RS-CRC encoded to create an overlay RS frame and the overlay RS frame may be transmitted through an overlay parade. Here, the overlay parade may be transmitted through allocation to a plurality of groups and, specifically, may be transmitted through allocation to the secondary group divisions of the groups.

Since one group is divided into a primary group division and a secondary group division, data of a primary parade may be allocated to the primary group division and data of a primary parade or data of an overlay parade may be allocated to the secondary group division. That is, one group may transmit data of a primary parade and data of a secondary parade or may transmit data of a primary parade and data of an overlay parade.

FIG. 4 illustrates an embodiment of a group according to the present invention.

As shown in FIG. 4(*a*), one group is included in a slot including 156 packets. That is, a specific number of packets in one slot constitute one group, where the packets include mobile service data.

A fixed number of 118 mobile service data packets in the group are divided into A, B, C, and D regions after being interleaved. Features of the regions are described later.

On the other hand, a variable number of M mobile service data packets, which may be included in the group, are included in a separate E region. In the case where the group of one slot includes 118 mobile service data packets, the E region is an additional region which includes a variable number of mobile service data packets.

The mapping type of mobile service data packets of the E region may be changed at the designer's discretion. That is, in an embodiment of the present invention, when the number of mobile service data packets is less than 38 (i.e., M<38) as shown in FIG. 4(a), mobile service data packets may be mapped after a specific packet region in one slot is set as an empty region for main service data packets. In another embodiment, mobile service data packets may be mapped in the group so that the variable number of M mobile service data packets included in the E region are at specific intervals. The number of mobile service data packets may be changed at the designer's discretion. In an embodiment of the present invention, the number of mobile service data packets is 11, 20, 29, or 38.

FIG. 4(b) illustrates a format of the group of FIG. 4(a) after being interleaved. A data structure having the illustrated format is transmitted to the receiving system. That is, one data packet may be interleaved and spread over a number of data segments to be transmitted to the receiving system. Specifically, FIG. 4(b) illustrates an example in which one group is spread over 208 data segments. In this case, since one data packet contains the same amount of data as one data segment, a packet before data interleaving is conceptually equivalent to a segment.

Figure 5:
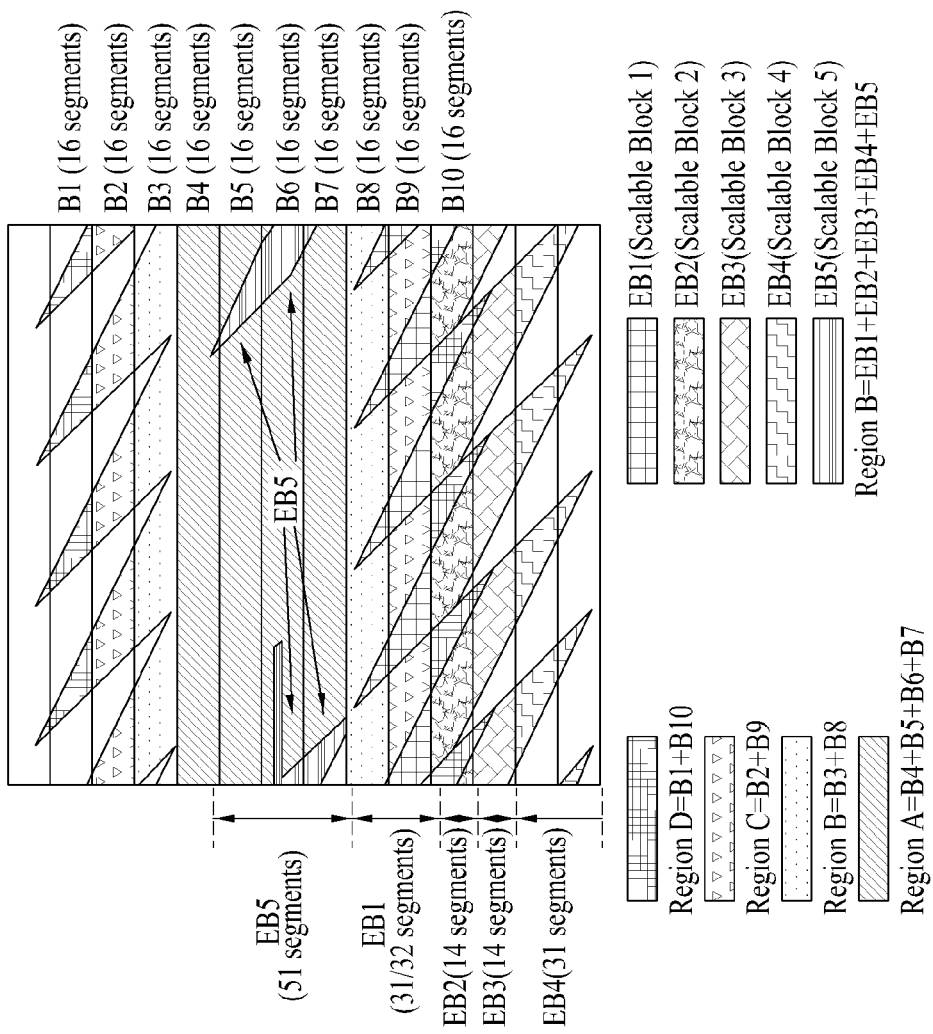
FIG. 5 illustrates regions and blocks of a group according to the present invention.

FIG. 5 illustrates regions and blocks of a group according to the present invention.

As shown in FIG. 5, one group may include 10 mobile data blocks B1 to B10. When it is assumed that one group includes at least A, B, C, and D regions, each of the 10 mobile data blocks B1 to B10 may be included in one of the A, B, C, and D regions according to characteristics of the mobile data block. In an embodiment of the present invention, each mobile data block is included in one of the A to D regions according to the degree of interference of main service data.

The purpose of dividing one group into a plurality of regions is to differentiate the uses of the regions. That is, each group is divided into a plurality of regions since a region which has little or no main service data interference may exhibit more robust reception performance than other regions. In addition, in the case where there is a need to consecutively insert long known data into mobile service data at regular intervals in a system in which data known by agreement between receiving/transmitting sides is transmitted by inserting the known data into a group, known data having a specific length can be inserted at regular intervals in regions in which main service data interference is not present (i.e., main service data is not mixed). However, it is difficult to insert known data in regions which has main service data interference at regular intervals and it is also difficult to consecutively insert long known data in such regions due to main service data interference.

A region including the mobile data blocks B4 to B7 in the group of FIG. 5 has no main service data interference and thus a long known data sequence may be inserted before and after (i.e., at either side of) each of the mobile data blocks. In the present invention, the region including the mobile data blocks B4 to B7 is referred to as an "A region (=B4+B5+B6+B7)". For the A region which has a known data sequence before and after each mobile data block as described above, the receiving system can obtain the most robust equalization performance among the A to D regions since the receiving system can perform equalization using channel information that can be obtained from the known data.

A region including the mobile data blocks B3 and B8 in the group of FIG. 5 has little main service data interference and thus a long known data sequence may be inserted in the region. However, since main service data interference may be present in the region, unlike the A region, a long known data sequence may be inserted only at one side of each mobile data block. In the present invention, the region including the mobile data blocks (M/H blocks) B3 and B8 is referred to as a "B region (=B3+B8)". For the B region which has a known data sequence only at one side of each mobile data block as described above, the receiving system can obtain more robust equalization performance than the C and D regions since the receiving system can perform equalization using channel information that can be obtained from the known data.

A region including the mobile data blocks B2 and B9 in the group of FIG. 5 has greater main service data interference than the B region and thus a long known data sequence cannot be inserted before and after each of the mobile data blocks. In the present invention, the region including the mobile data blocks B2 and B9 is referred to as a "C region (=B2+B9)".

A region including the mobile data blocks B1 and B10 in the group of FIG. 5 has greater main service data interference than the C region and thus a long known data sequence cannot also be inserted before and after each of the mobile data blocks. In the present invention, the region including the mobile data blocks B1 and B10 is referred to as a "D region (=B1+B10)". The reception performance of the C and D regions may be low when channels are rapidly changing since the C and D regions are distant from the known data sequence.

On the other hand, in an embodiment of the present invention, an E region including a variable number of M mobile service data packets may be formed using additional blocks. Full channel capability can be achieved through the E region. In an embodiment of the present invention, mobile service data additionally transmitted through the E region is distributed over 4 or 5 blocks. The E region is characterized in that each block of the E region includes a plurality of segments and the number of the M mobile service data packets does not exceed 38.

In the case where the group does not include main service data, an area, in which a place-holder for an RS parity and an MPEG header for backward compatibility with conventional digital broadcasting systems is present, may be included in a block which is classified as belonging to the E region. That is, since the group does not require an RS parity and an MPEG header for backward compatibility when the group does not include main service data, an area reserved for main service data is allocated as an area for mobile service data and forms a block included in the E region.

Although FIG. 5 illustrates that 5 blocks are included in the E region, the number of blocks included in the E region may be changed at the designer's discretion. Specifically, the number of segments included in each block of the E region may be changed at the designer's discretion and the number of blocks included in the E region may be changed accordingly.

FIG. 6 illustrates a table of group types associated with the size of the E region according to the present invention.

Mobile service data that may be allocated to one group may be mainly divided into two mobile modes. One of the two mobile modes may be referred to as a "first mode" or a "Core Mobile Mode (CMM)" and the other may be referred to as a "second mode" or an "Extended Mobile Mode (EMM)". Both or a combination of the first mobile mode and the second mobile mode may be referred to as a "Scalable Full Channel Mobile Mode (SFCMM)" and only the second mobile mode may be referred to as an "SFCMM". The SFCMM may include information indicating the number of mobile service data packets included in one slot. Since a group including mobile service data is transmitted during one slot, the SFCMM may include information indicating the number of mobile service data packets included in the group.

The first mobile mode is a mode which is compatible with the conventional mobile broadcast receiver and the second mobile mode is a mode which is not compatible with or may achieve compatibility with the conventional mobile broadcast receiver.

That is, mobile service data of only the first mobile mode may be allocated to one group, mobile service data of only the second mobile mode may be allocated to one group, or both mobile service data of the first mobile mode and mobile service data of the second mobile mode may be allocated to one group.

The table of FIG. 6 shows group types at a left portion and shows group divisions and the number of mobile service data packets included in one slot, corresponding to each of the group types, at middle and right portions.

Each group type may be further divided according to whether or not an E region is present in the group and a mobile mode allocated to the E region.

The group type 0 is not further divided since no E region is present and mobile service data of only the first mobile mode is transmitted in the group. A primary group division in a group of the group type 0 may include A, B, C, and D regions or may include A and B regions, and a secondary group division thereof may not be present or may include C and D regions.

In the case of the group type 1, mobile service data of the second mobile mode is allocated only to an E region of the group and mobile service data of the first mobile mode is allocated to A, B, C, and D regions. The group type 1 may be further divided into 5 group types (i.e., group types, 1-0, 1-1, 1-2, 1-4, and 1-8) according to the size of the E region. A primary group division in a group of the group type 1 may include A, B, C, and D regions and a secondary group division may include an E region. This may be changed at the designer's discretion.

An E region of the group type 1-0(G1-0) may include 38 data packets, an E region of the group type 1-1(G1-1) may include 37 data packets, an E region of the group type 1-2 (G1-2) may include 36 data packets, and an E region of the group type 1-4(G1-4) may include 34 data packets. Finally, an E region of the group type 1-8(G1-8) may include 30 data packets.

In the case of the group type 2, mobile service data of the second mobile mode is allocated to C, D, and E regions of the group and mobile service data of the first mobile mode is allocated to A and B regions. The group type 2 may also be further divided into 5 group types (i.e., group types, 2-0, 2-1, 2-2, 2-4, and 2-8) according to the size of the E region. A primary group division in a group of the group type 2 may include A and B regions and a secondary group division may include C, D, and E regions. This may be changed at the designer's discretion.

An E region of the group type 2-0(G2-0) may include 38 data packets, an E region of the group type 2-1(G2-1) may include 37 data packets, an E region of the group type 2-2 (G2-2) may include 36 data packets, and an E region of the group type 2-4(G2-4) may include 34 data packets. Finally, an E region of the group type 2-8(G2-8) may include 30 data packets.

In the case of the group type 3, mobile service data of only the second mobile mode is allocated to A, B, C, D, and E regions of the group. The group type 3 may also be further divided into 5 group types (i.e., group types, 3-0, 3-1, 3-2, 3-4, and 3-8) according to the size of the E region. In this case, a primary group division in a group of the group type 3 includes A, B, C, and D regions and a secondary group division is not present.

An E region of the group type 3-0 (G3-0) may include 38 data packets, an E region of the group type 3-1 (G3-1) may include 37 data packets, an E region of the group type 3-2 (G3-2) may include 36 data packets, and an E region of the group type 3-4 (G3-4) may include 34 data packets. Finally, an E region of the group type 3-8 (G3-8) may include 30 data packets.

That is, the group type 2 and the group type 3 have the same group format.

The group type 4 (G3) is not further classified into lower group types and 156 data packets are all used for mobile service data. Here, mobile service data may also be allocated to the location of RS parity data and an MPEG header in the 156 data packets.

In other words, in the case where the group does not include main service data, the RS parity and the MPEG header for backward compatibility need not be used, such that an area reserved for the RS parity and the MPEG header is allocated to an area for mobile service data and forms a block contained in the E region.

Here, the parade may include group divisions of groups having the same group type. For example, any primary parade may include group divisions of groups of group type 1-1. Namely, data of any parade is transmitted through allocation to group divisions of groups having the same group type. For example, data of one parade is transmitted through allocation to group divisions of groups having the same group type.

A primary parade and a secondary parade according to an embodiment of the present invention have the same parade identifier and have the same Number Of Group (NOG). The NOG is the number of groups in one subframe. For example, an NOG of a secondary parade needs to be 4 when an NOG of a primary parade is 4. That is, the secondary parade is always paired with the primary parade and depends on the primary parade. Therefore, secondary group divisions are transmitted through the same slots as primary group divisions which are paired with the secondary group divisions.

On the other hand, the overlay parade is not paired with the primary parade. That is, while both the secondary parade and the overlay parade are transmitted through secondary group divisions of groups, the overlay parade does not depend on the primary parade. Therefore, the primary parade and the overlay parade may have different parade identifiers and may have the same or different NOG values. That is, the primary parade and the overlay parade may have different NOG boundaries. However, the overlay parade may include secondary group divisions of groups having the same group type. That is, data of the overlay parade is transmitted through secondary group divisions of groups having the same group type. Accordingly, signaling information of the overlay parade is required for the receiving system to receive and process the overlay parade. The signaling information may be the number of overlay parades allocated to one subframe, an identifier of each overlay parade, or the like. In an embodiment of the present invention, signaling information of the overlay parade is transmitted through insertion into at least one of a field synchronization area and a signaling information area in the group.

One group may include only a primary group division and may also include both a primary group division and a secondary group division. Data of a primary parade is allocated to a primary group division and data of a secondary parade or an overlay parade is allocated to a secondary group division. That is, data of one or two parades may be allocated to one group.

FIG. 7 illustrates an embodiment of a group format of each group type before interleaving according to the present invention.

FIG. 7(a) illustrates a group format of group type 0, in which an E region is not included, mobile service data of the second mobile mode is not transmitted, and main data is allocated to an area corresponding to the E region.

FIG. 7(b) illustrates a group format of group type 1, in which an E region is included and mobile service data of the second mobile mode is allocated to the E region.

FIG. 7(c) illustrates a group format of group type 2, in which an E region is included and mobile service data of the second mobile mode is allocated to C, D, and E regions.

FIG. 7(d) illustrates a group format of group type 3, in which an E region is included and mobile service data of the second mobile mode is allocated to A, B, C, D, and E regions.

FIG. 8 illustrates an embodiment of an E region having various sizes according to the present invention.

FIG. 8(a) illustrates an example wherein 38 data packets are allocated to the E region and main service data is not allocated to the group. That is, 38 data packets included in the E region are used for mobile service data of the second mobile mode.

FIG. 8(b) illustrates an example wherein 37 data packets are allocated to the E region and main service data is allocated to one data packet of the group. In an embodiment of the present invention, the last of the 38 data packets is excluded from the E region and the data packet excluded from the E region is used for main service data. That is, 37 data packets included in the E region are used for mobile service data of the second mobile mode.

FIG. 8(c) illustrates an example wherein 36 data packets are allocated to the E region and main service data is allocated to two data packets of the group. In an embodiment of the present invention, the first and last of the 38 data packets are excluded from the E region and the two data packets excluded from the E region are used for main service data. That is, 36 data packets included in the E region are used for mobile service data of the second mobile mode.

FIG. 8(d) illustrates an example wherein 34 data packets are allocated to the E region and main service data is allocated to four data packets of the group. In an embodiment of the present invention, the first two data packets and the last two data packets of the 38 data packets are excluded from the E region and the four data packets excluded from the E region are used for main service data. That is, 34 data packets included in the E region are used for mobile service data of the second mobile mode.

FIG. 8(e) illustrates an example wherein 30 data packets are allocated to the E region and main service data is allocated to eight data packets of the group. In an embodiment of the present invention, the first four data packets and the last four data packets of the 38 data packets are excluded from the E region and the eight data packets excluded from the E region are used for main service data. That is, 30 data packets included in the E region are used for mobile service data of the second mobile mode.

FIG. 8(f) illustrates an example wherein the E region is not allocated and main service data is allocated to 38 data packets of the group. That is, data packets used for mobile service data of the second mobile mode are not present. In this case, A, B, C, and D regions of the group may not be used for mobile service data of the second mobile mode. That is, the E region consists of data packets which are used for mobile service data of the second mobile mode among 38 data packets, other than 118 data packets, of the data packets of the group.

The locations of packets to which main service data is allocated in the E region may be changed at the designer's discretion.

FIGS. 9 to 19 illustrate group structures of the group type 1 in a packet domain (before interleaving) and a segment domain (after interleaving) according to the present invention.

Figure 9:
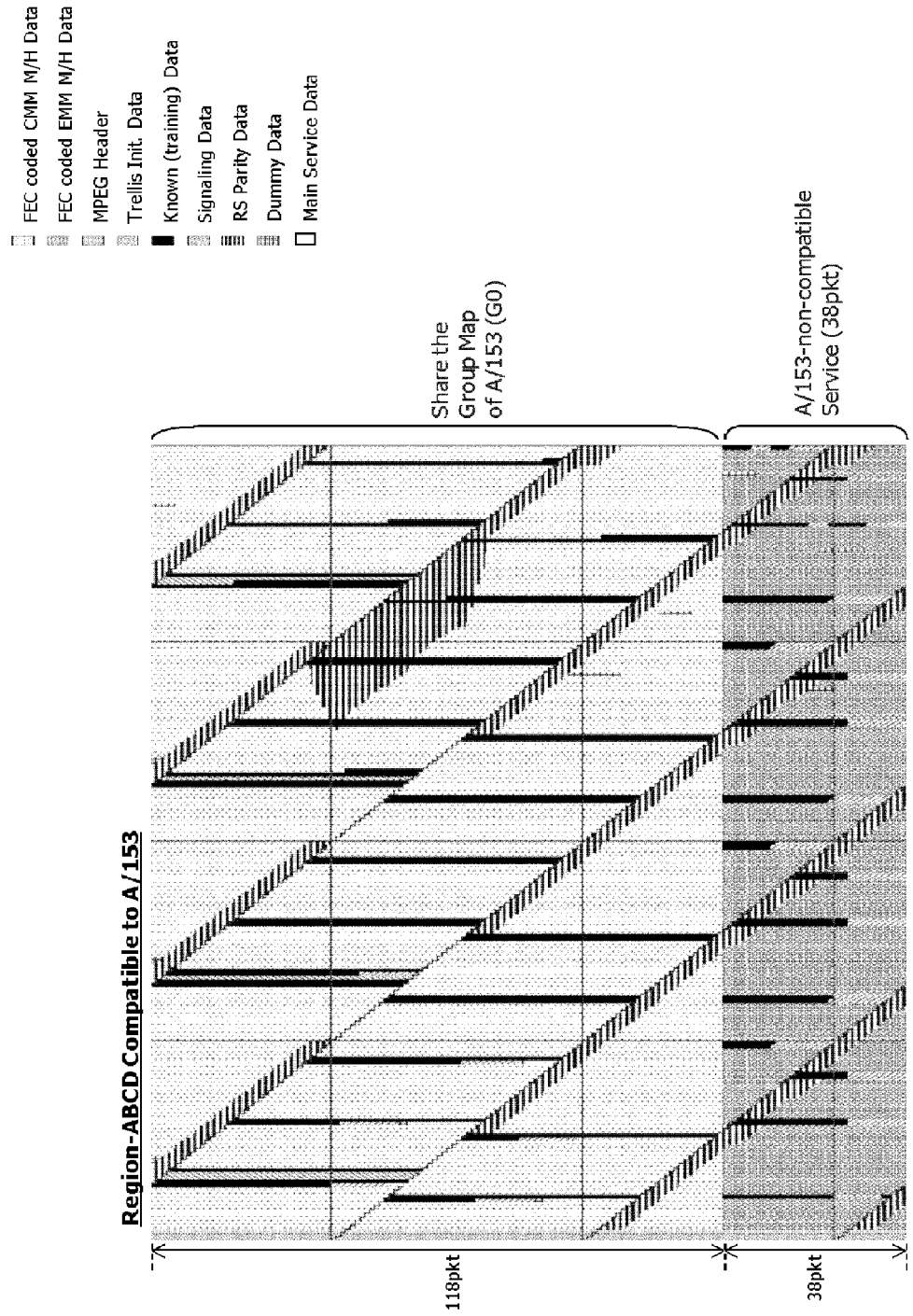
FIG. 9 illustrates an embodiment of a packet domain of group type 1-0.

FIG. 9 illustrates an embodiment of a group structure of the packet domain of the group type 1-0 according to the present invention. That is, FIG. 9 illustrates a group structure before data interleaving. In this case, main data packets are not inserted.

Figure 10:
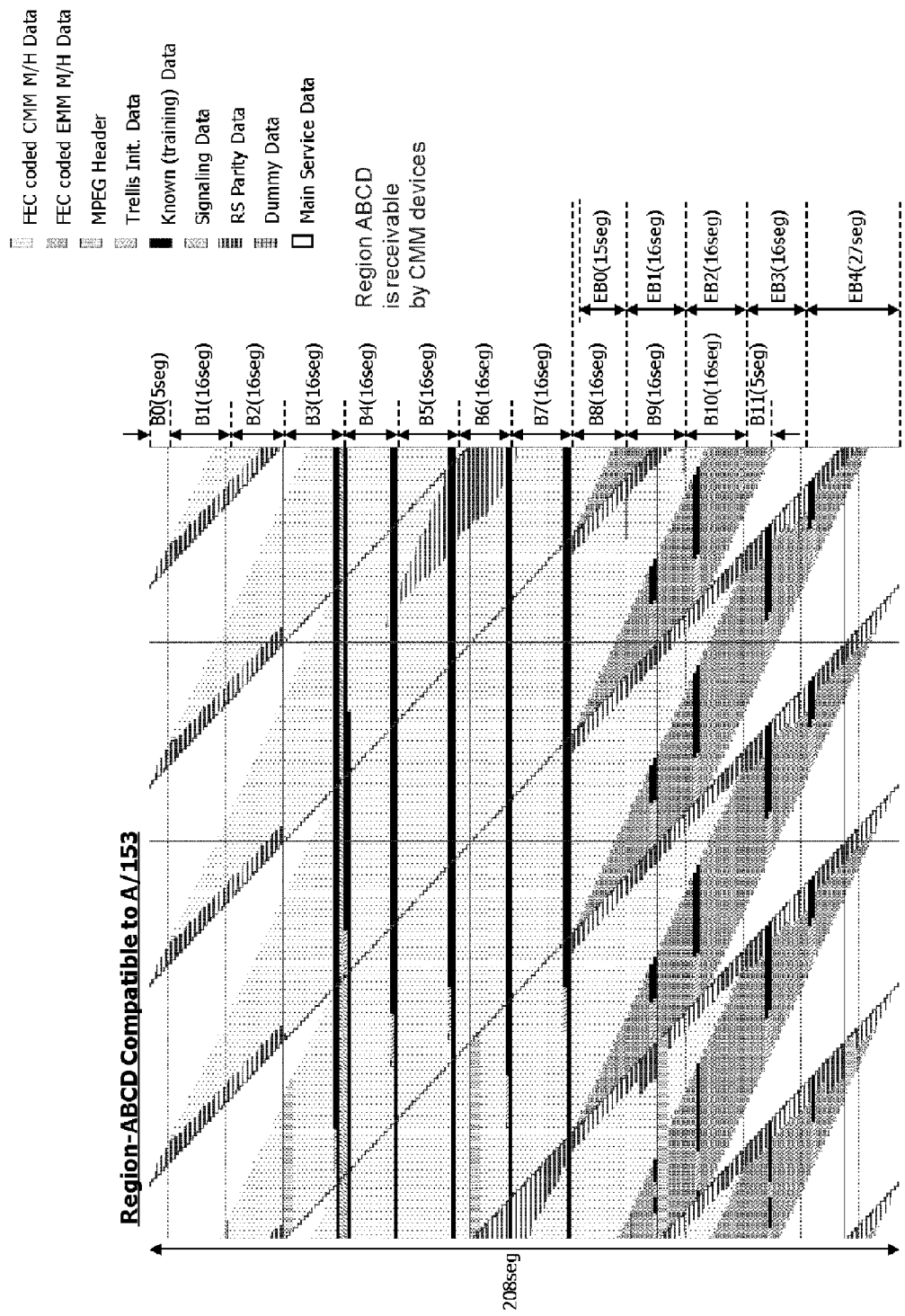
FIG. 10 illustrates an embodiment of a segment domain of group type 1-0.

FIG. 10 illustrates an embodiment of a group structure of the segment domain of the group type 1-0 according to the present invention. That is, FIG. 10 illustrates a group structure after data interleaving. In this case, the E region of the data group may include five blocks and known data may be inserted into the lower C and D regions and the E region of the data group.

Figure 11:
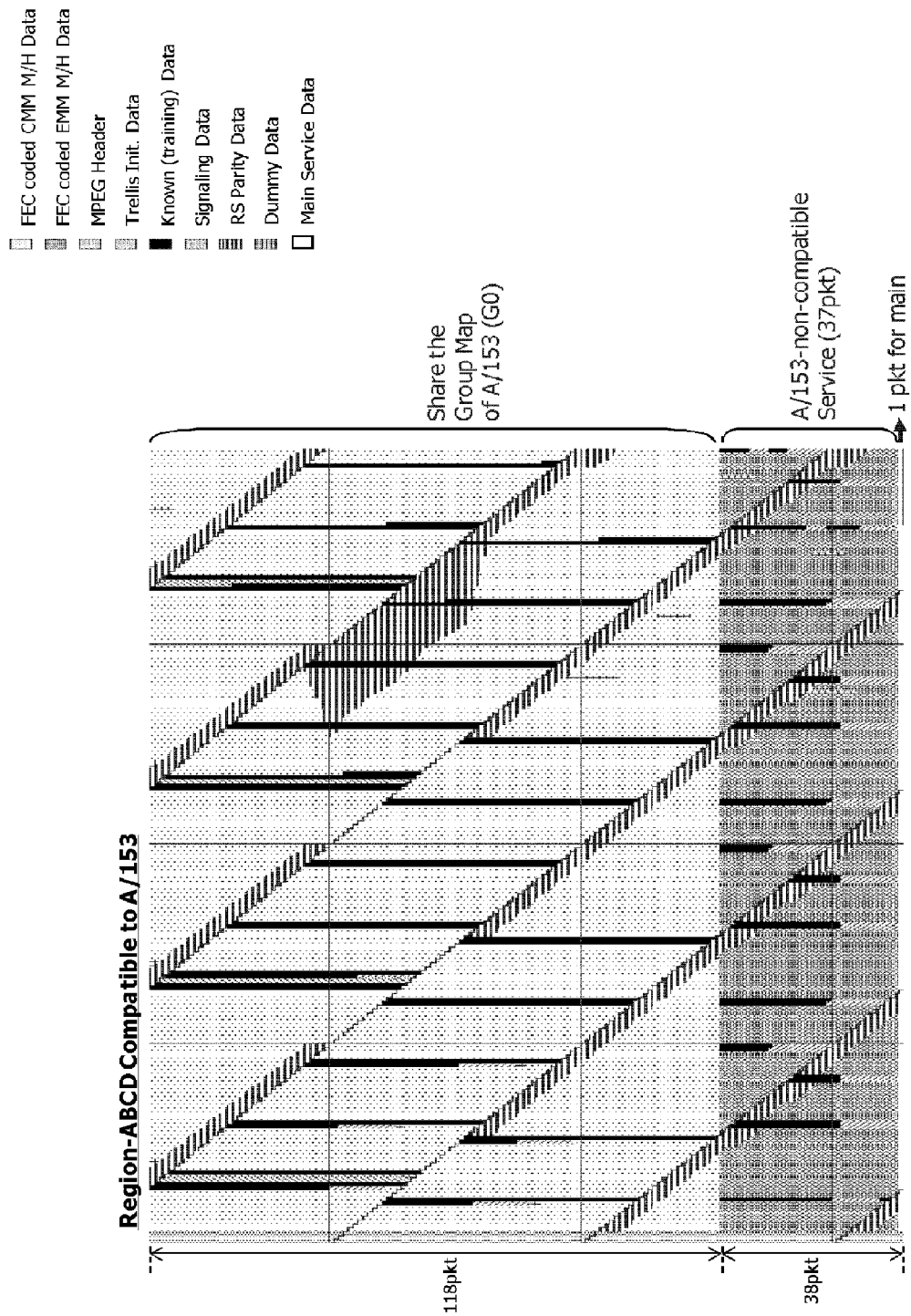
FIG. 11 illustrates an embodiment of a packet domain of group type 1-1.

FIG. 11 illustrates an embodiment of a group structure of the packet domain of the group type 1-1 according to the present invention. That is, FIG. 11 illustrates a group structure before data interleaving.

Figure 12:
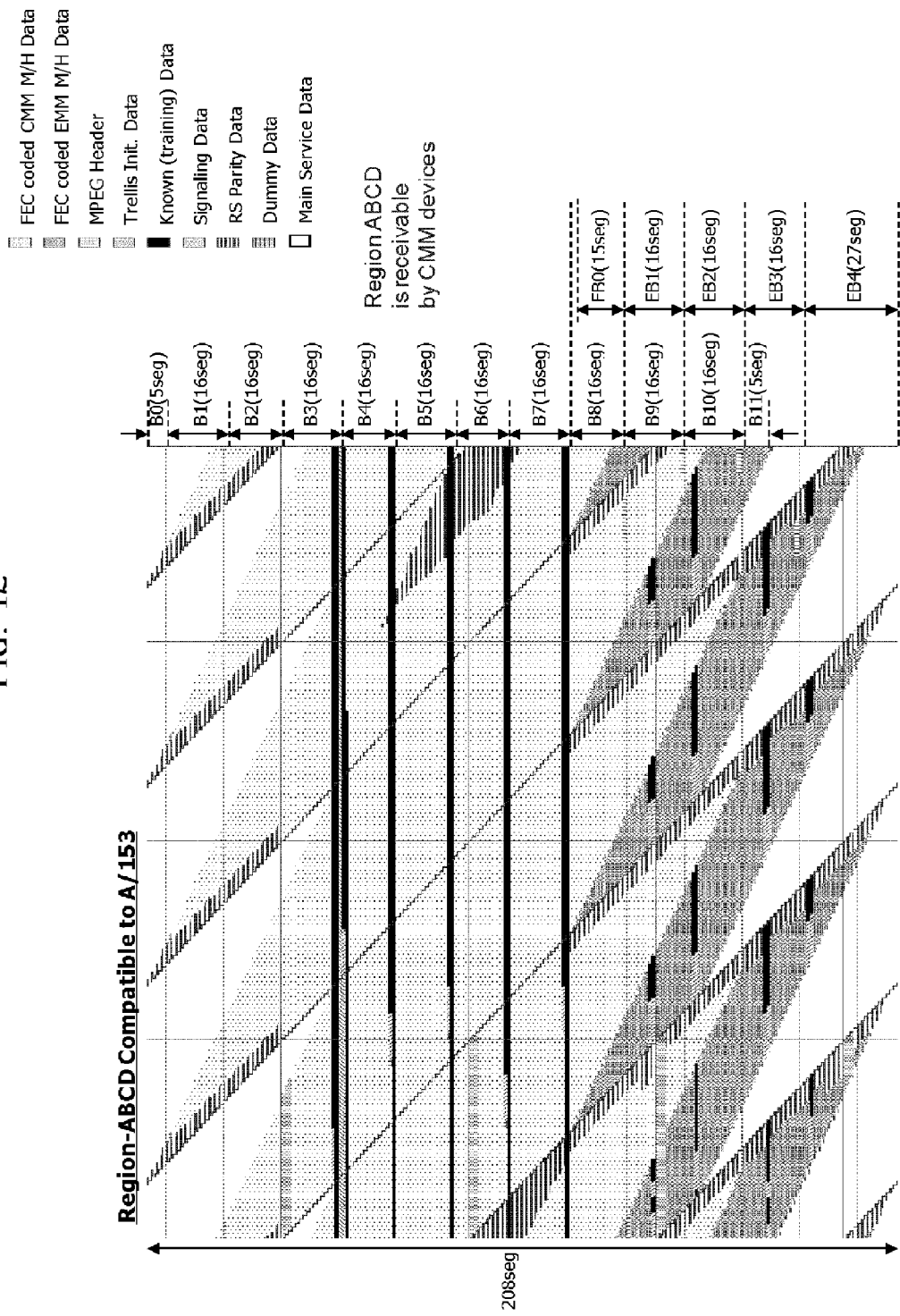
FIG. 12 illustrates an embodiment of a segment domain of group type 1-1.

FIG. 12 illustrates an embodiment of a group structure of the segment domain of the group type 1-1 according to the present invention. In this case, one main data packet may be inserted and the insertion location may be changed at the designer's discretion. That is, FIG. 12 illustrates a group structure after data interleaving. In this case, the E region of the data group may include five blocks and known data may be inserted into the lower C and D regions and the E region of the data group.

Figure 13:
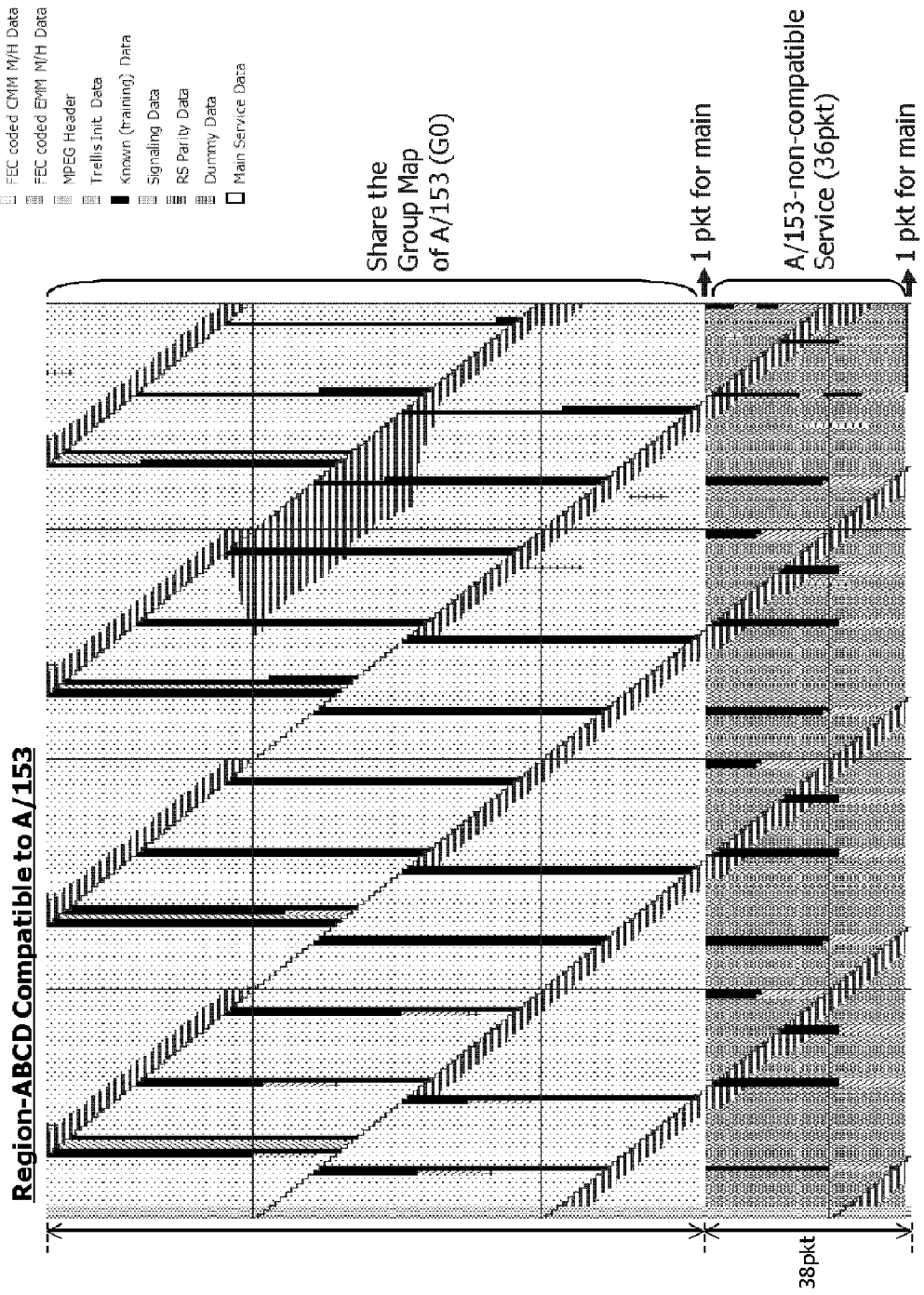
FIG. 13 illustrates an embodiment of a packet domain of group type 1-2.

FIG. 13 illustrates an embodiment of a group structure of the packet domain of the group type 1-2 according to the present invention. That is, FIG. 13 illustrates a group structure before data interleaving. In this case, two main data packets may be inserted and the insertion location may be changed at the designer's discretion.

Figure 14:
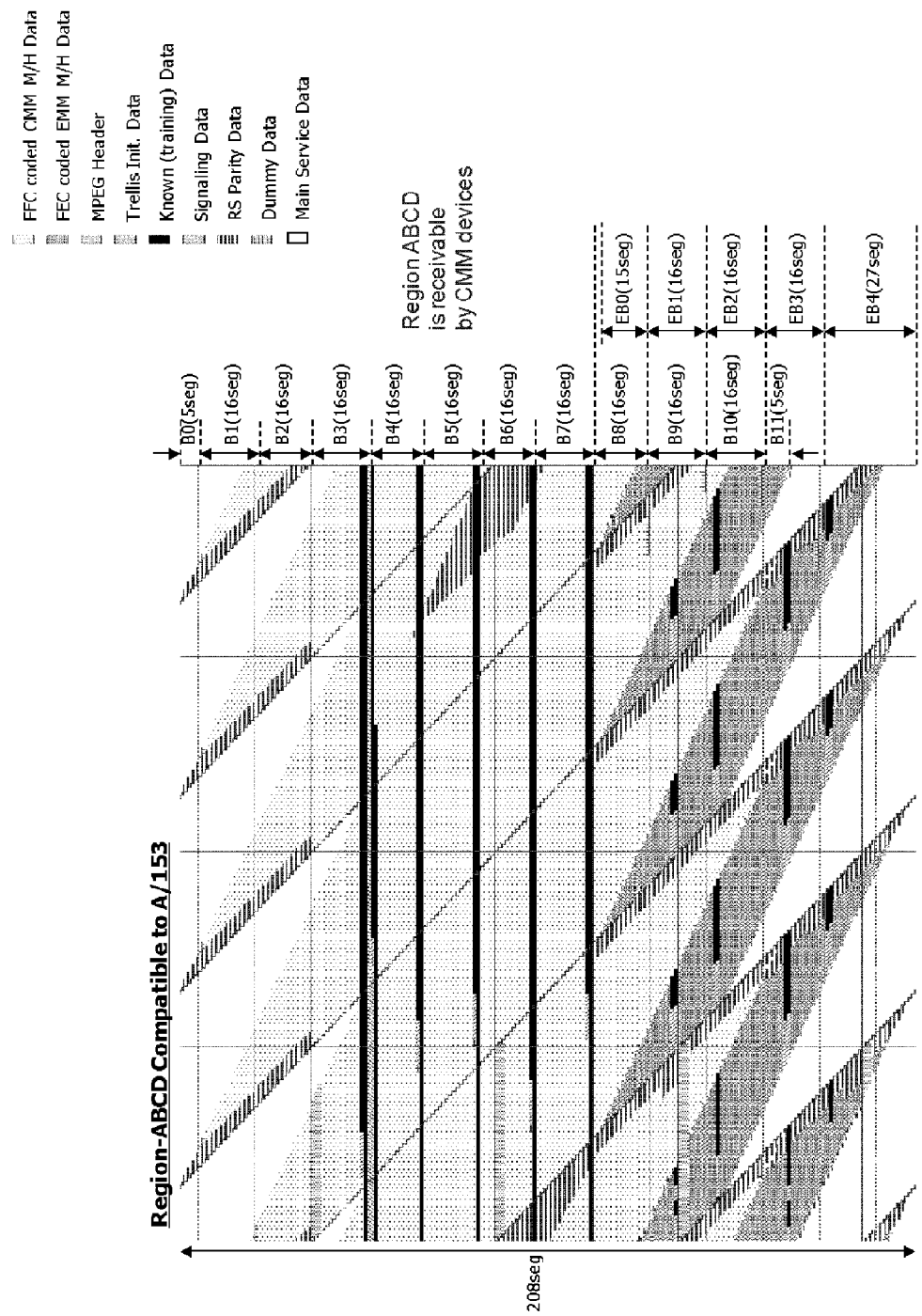
FIG. 14 illustrates an embodiment of a segment domain of group type 1-2.

FIG. 14 illustrates an embodiment of a group structure of the segment domain of the group type 1-2 according to the present invention. That is, FIG. 14 illustrates a group structure after data interleaving. In this case, the E region of the data group may include five blocks and known data may be inserted into the lower C and D regions and the E region of the data group.

Figure 15:
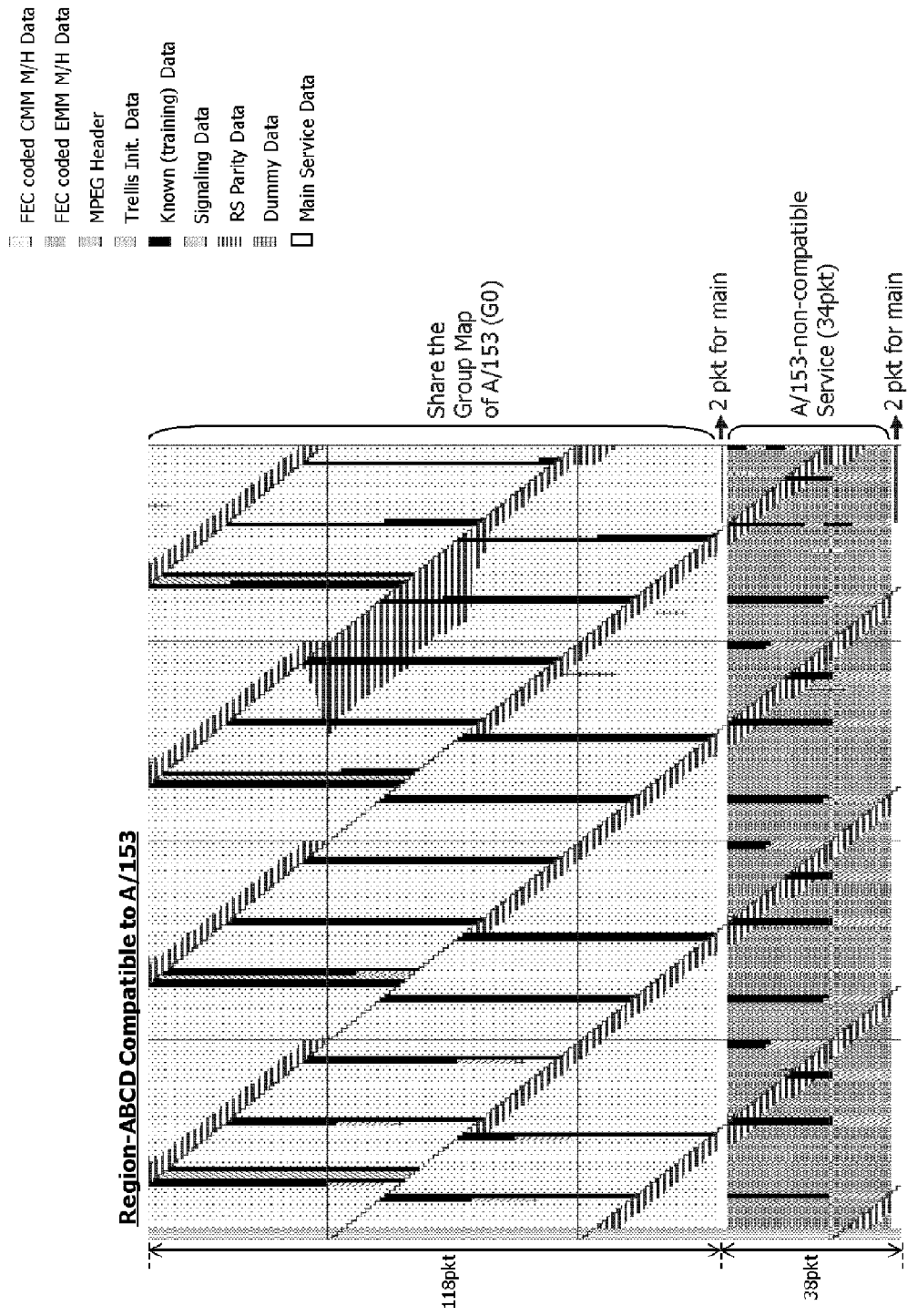
FIG. 15 illustrates an embodiment of a packet domain of group type 1-4.

FIG. 15 illustrates an embodiment of a group structure of the packet domain of the group type 1-4 according to the present invention. That is, FIG. 15 illustrates a group structure before data interleaving. In this case, four main data packets may be inserted and the insertion location may be changed at the designer's discretion.

Figure 16:
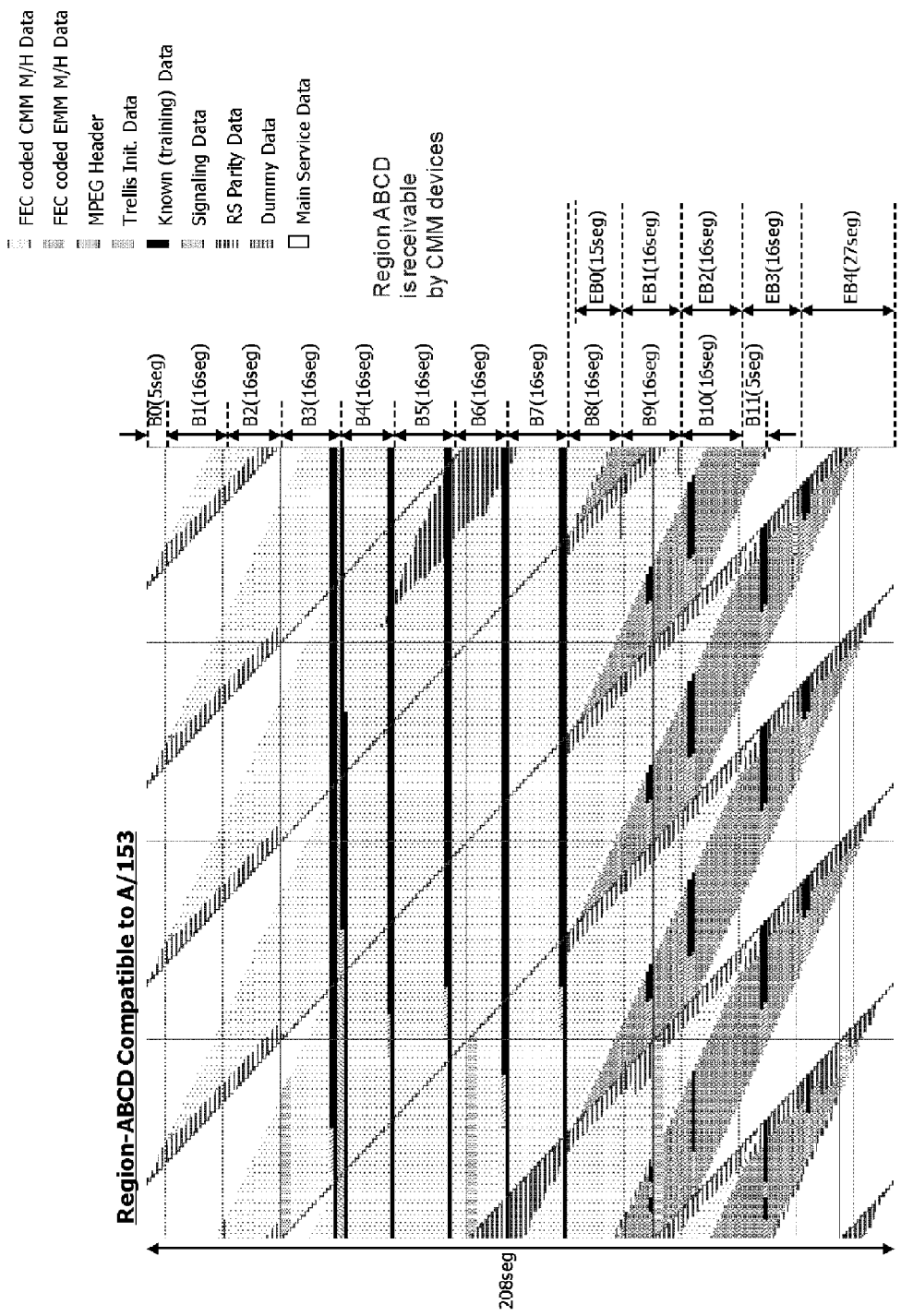
FIG. 16 illustrates an embodiment of a segment domain of group type 1-4.

FIG. 16 illustrates an embodiment of a group structure of the segment domain of the group type 1-4 according to the present invention. That is, FIG. 16 illustrates a group structure after data interleaving. In this case, the E region of the data group may include five blocks and known data may be inserted into the lower C and D regions and the E region of the data group.

Figure 17:
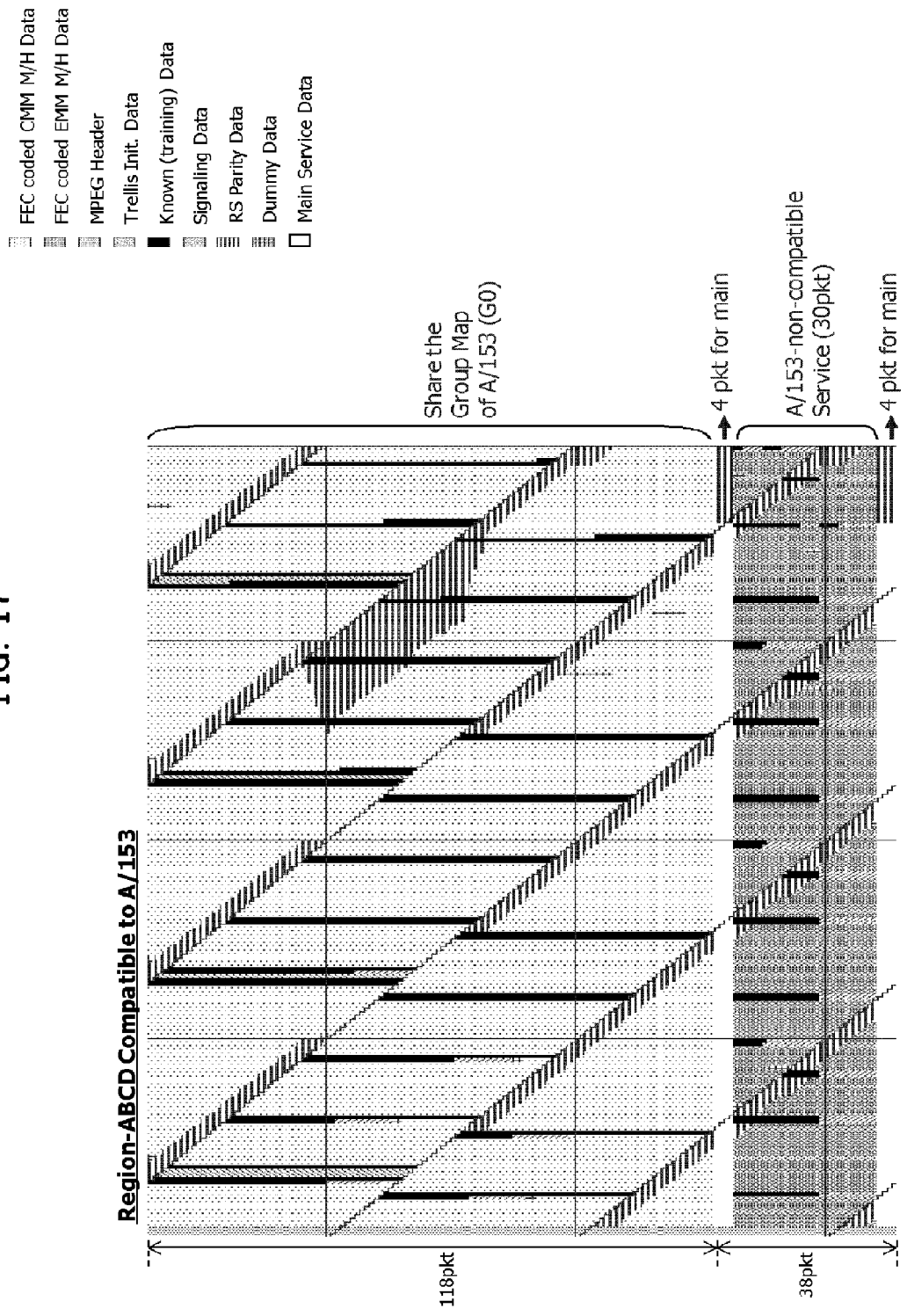
FIG. 17 illustrates an embodiment of a packet domain of group type 1-8.

FIG. 17 illustrates an embodiment of a group structure of the packet domain of the group type 1-8 according to the present invention. That is, FIG. 17 illustrates a group structure before data interleaving. In this case, eight main data packets may be inserted and the insertion location may be changed at the designer's discretion.

Figure 18:
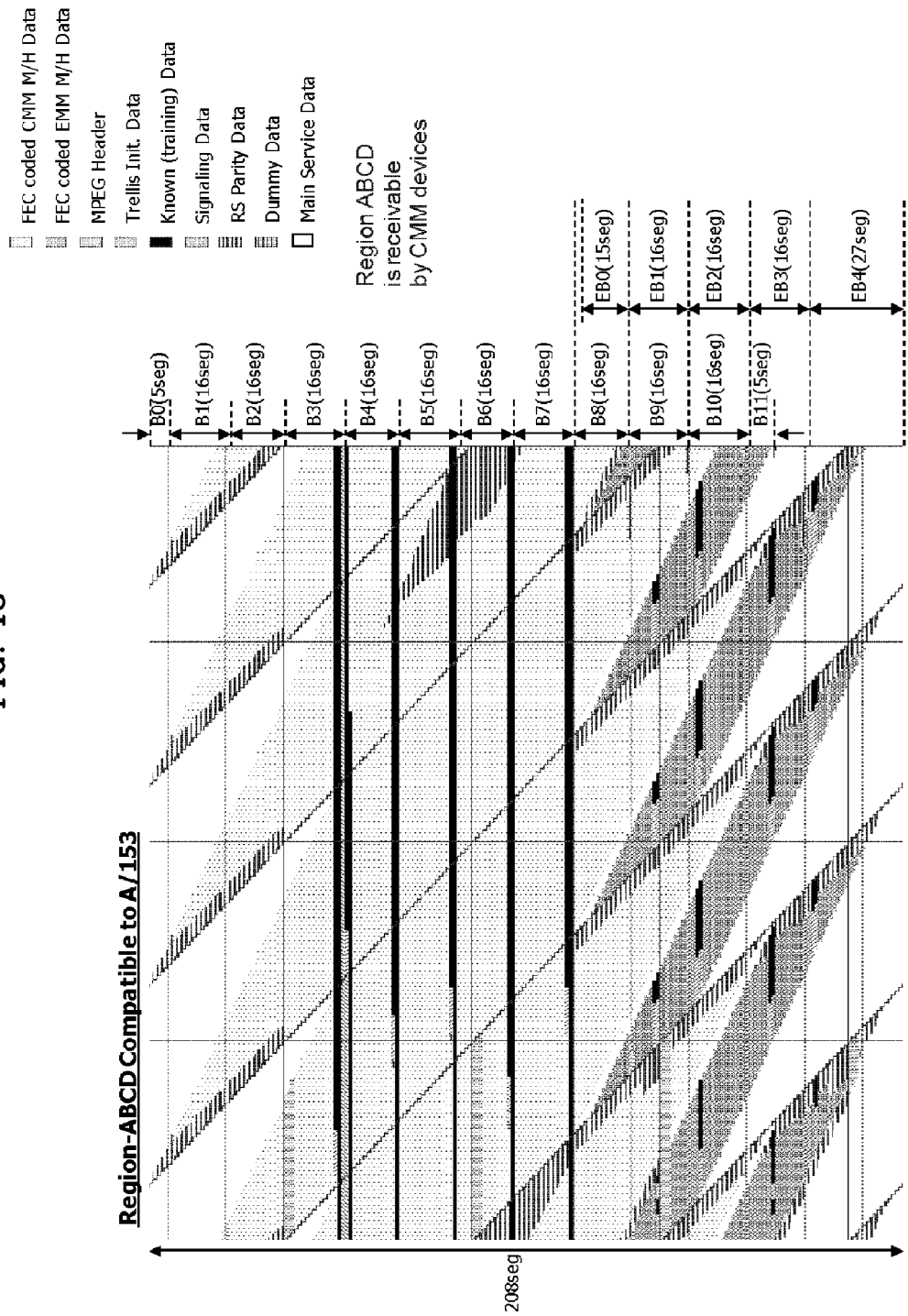
FIG. 18 illustrates an embodiment of a segment domain of group type 1-8.

FIG. 18 illustrates an embodiment of a group structure of the segment domain of the group type 1-8 according to the present invention. That is, FIG. 18 illustrates a group structure after data interleaving. In this case, the E region of the data group may include five blocks and known data may be inserted into the lower C and D regions and the E region of the data group.

As can be seen from the group structures of the segment domain of FIGS. 9 to 18, the group may include 12 mobile data blocks (MH blocks) B0 to B11 and 5 extended mobile data blocks EB0 to EB4.

Here, a receiving system for the first mobile mode may receive and process data of 12 mobile data blocks B0 to B11. In addition, a receiving system for the second mobile mode may receive all data of the 12 mobile data blocks B0 to B11 and the 5 extended mobile data blocks EB0 to EB4 and may process all mobile data of the first mobile mode and the second mobile mode. The receiving system does not need to receive data of the mobile data blocks B0 and B11 among the 12 mobile data blocks since they have no mobile data bytes.

FIGS. 19 to 28 illustrate group structures of the group type 2 in a packet domain and a segment domain according to the present invention.

Figure 19:
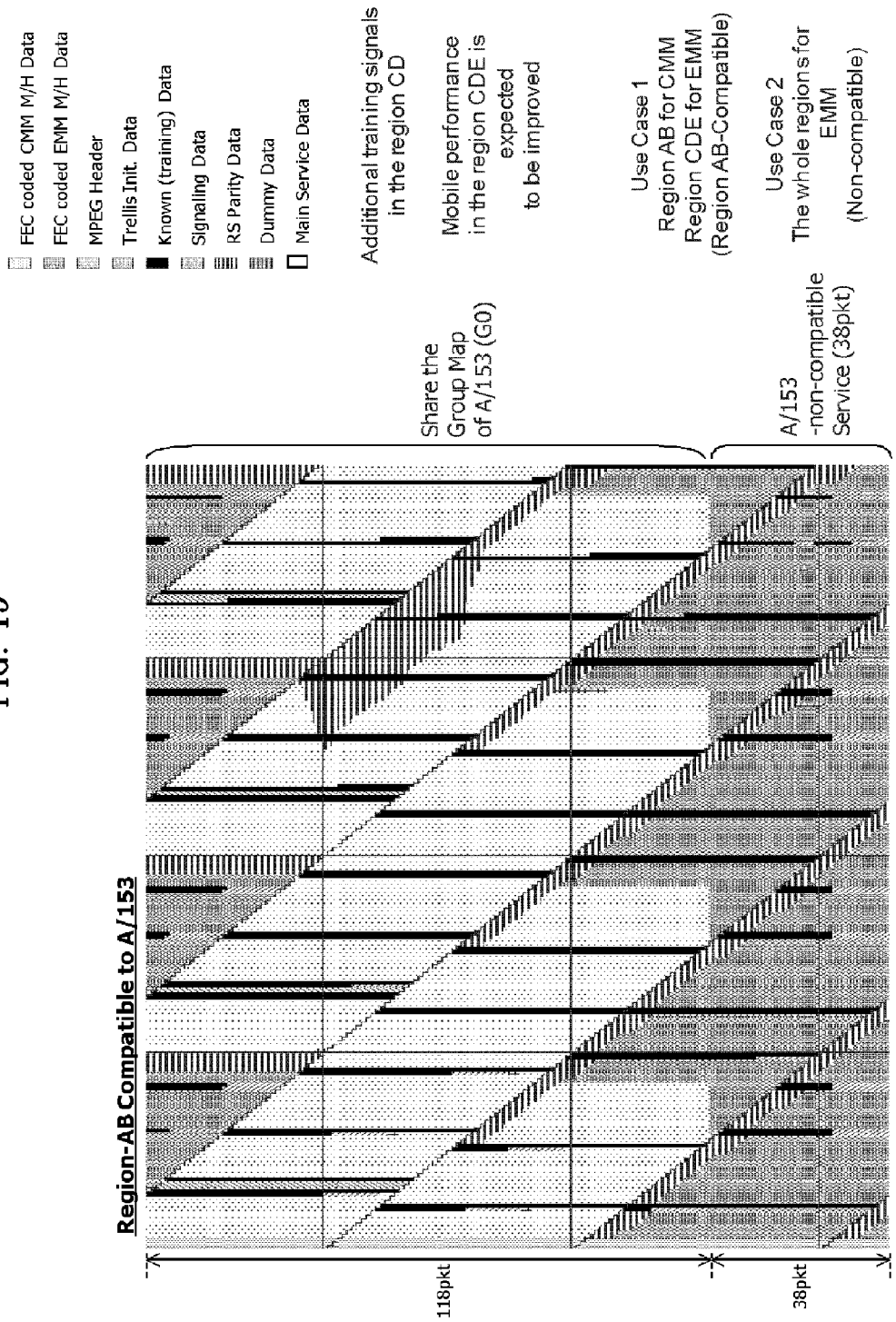
FIG. 19 illustrates an embodiment of a packet domain of group type 2-0.

FIG. 19 illustrates an embodiment of a group structure of the packet domain of the group type 2-0 according to the present invention. That is, FIG. 19 illustrates a group structure before data interleaving. In this case, main data packets are not inserted.

Figure 20:
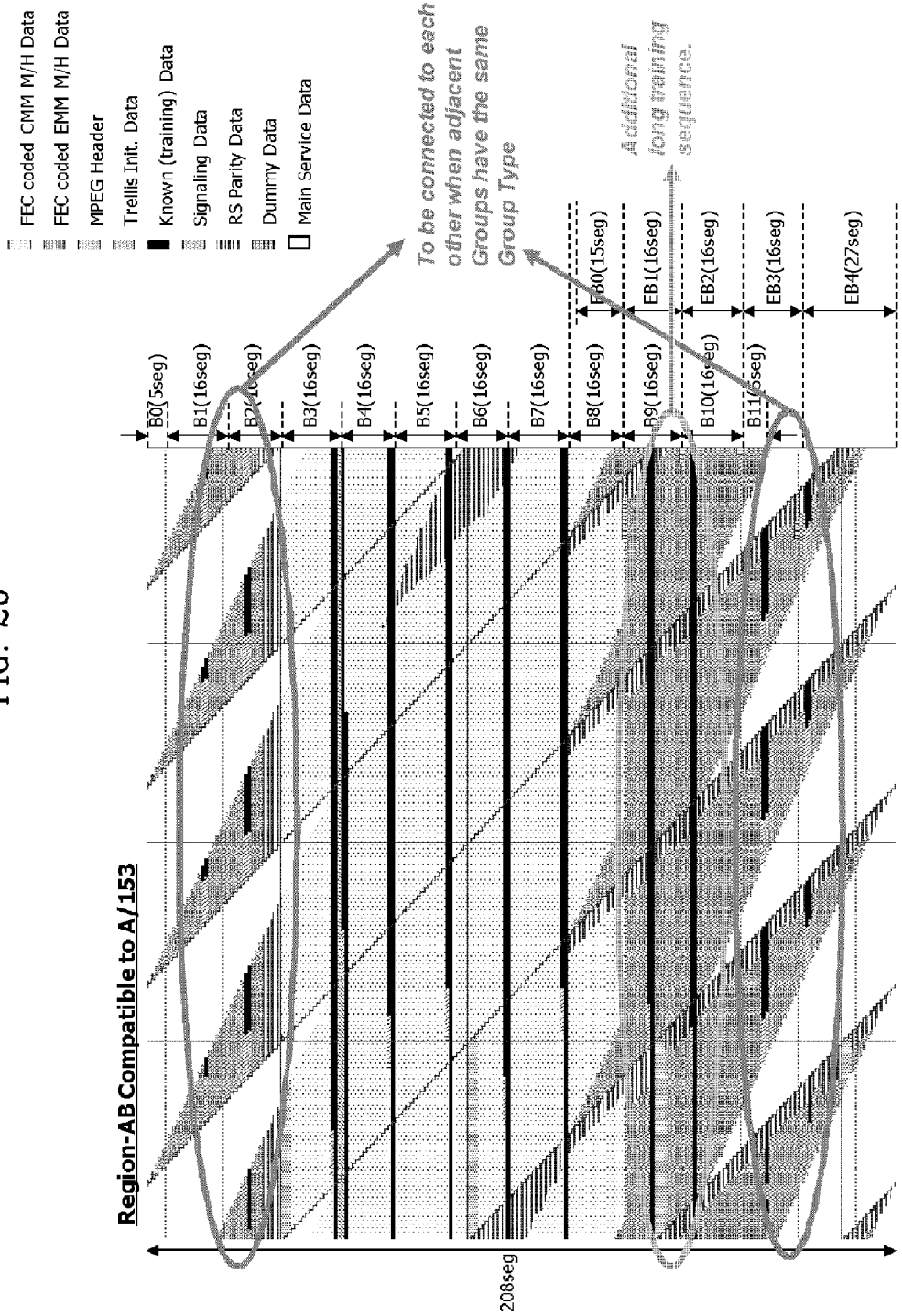
FIG. 20 illustrates an embodiment of a segment domain of group type 2-0.

FIG. 20 illustrates an embodiment of a group structure of the segment domain of the group type 2-0 according to the present invention. That is, FIG. 20 illustrates a group structure after data interleaving. In this case, the E region of the data group may include five blocks and long known data may be inserted into the C and D regions of the data group and short known data may be inserted into the E region of the data group. In this case, when another data group of the same type is concatenated with the data group, the short known data of the E region can be connected to known data of upper C and D regions of the concatenated data group to form long known data.

Figure 21:
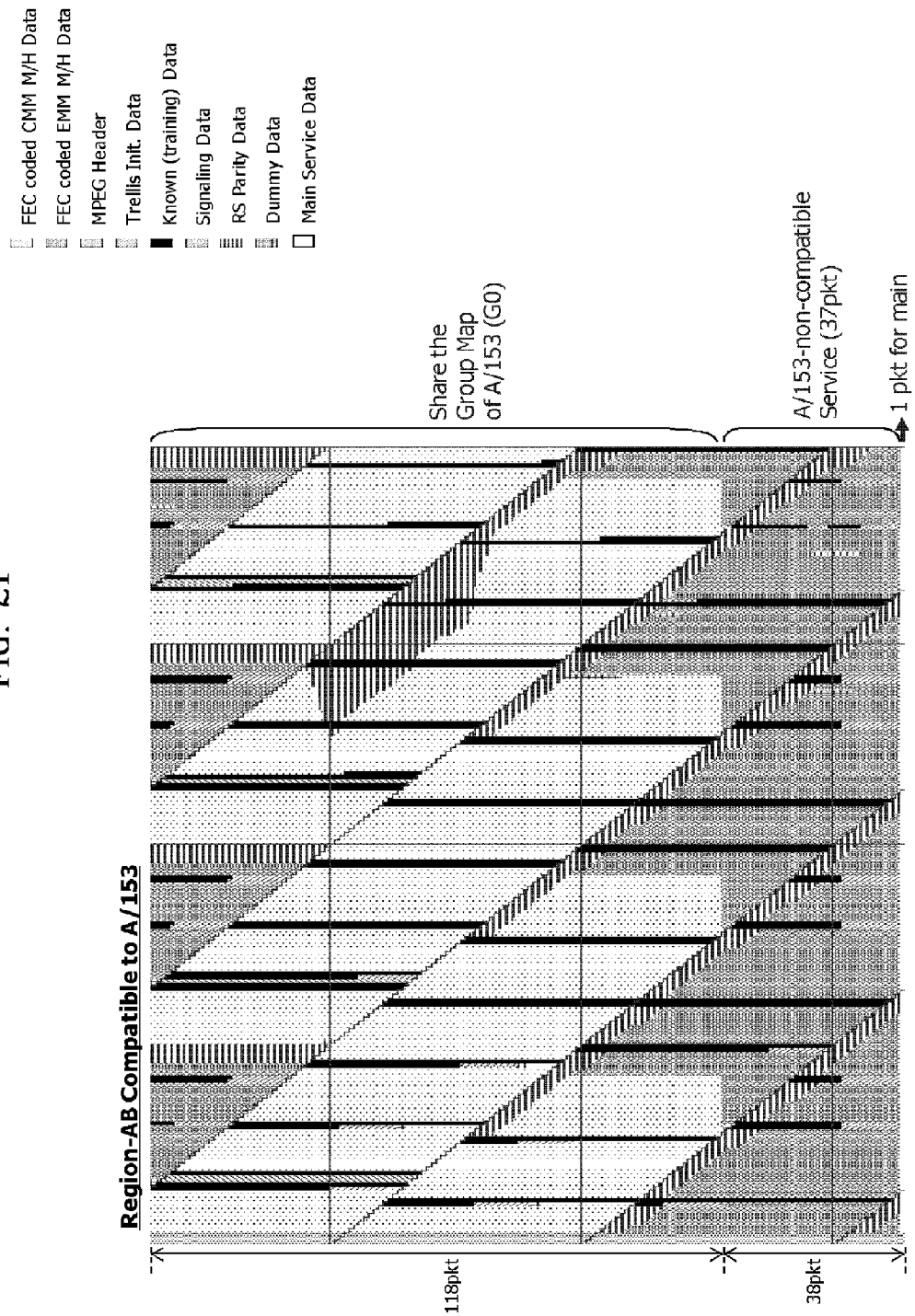
FIG. 21 illustrates an embodiment of a packet domain of group type 2-1.

FIG. 21 illustrates an embodiment of a group structure of the packet domain of the group type 2-1 according to the present invention. That is, FIG. 21 illustrates a group structure before data interleaving.

Figure 22:
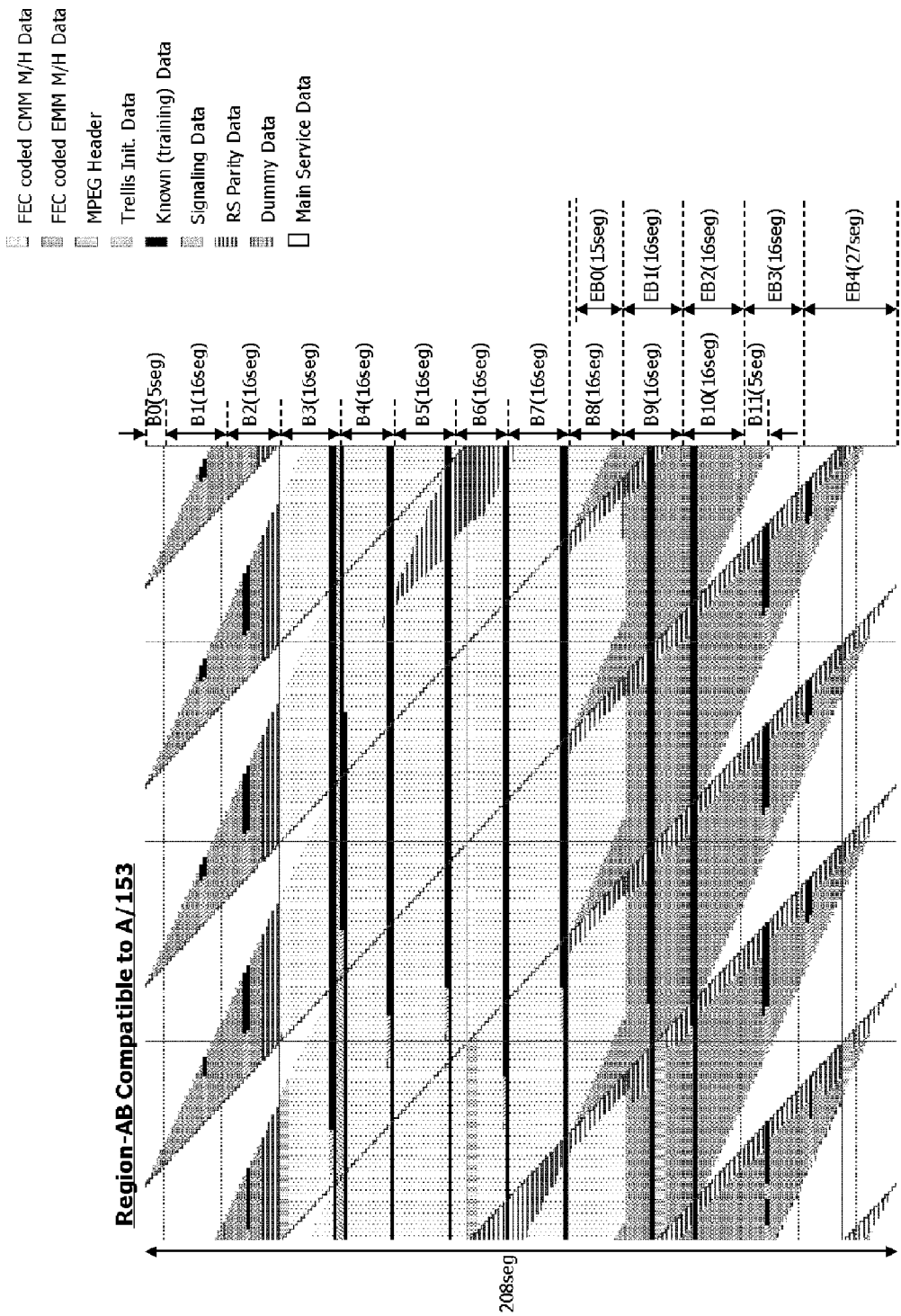
FIG. 22 illustrates an embodiment of a segment domain of group type 2-1.

FIG. 22 illustrates an embodiment of a group structure of the segment domain of the group type 2-1 according to the present invention. In this case, one main data packet may be inserted and the insertion location may be changed at the designer's discretion. That is, FIG. 22 illustrates a group structure after data interleaving. In this case, the E region of the data group may include five blocks and long known data may be inserted into the C and D regions of the data group and short known data may be inserted into the E region of the data group. In this case, when another data group of the same type is concatenated with the data group, the short known data of the E region can be connected to known data of upper C and D regions of the concatenated data group to form long known data.

Figure 23:
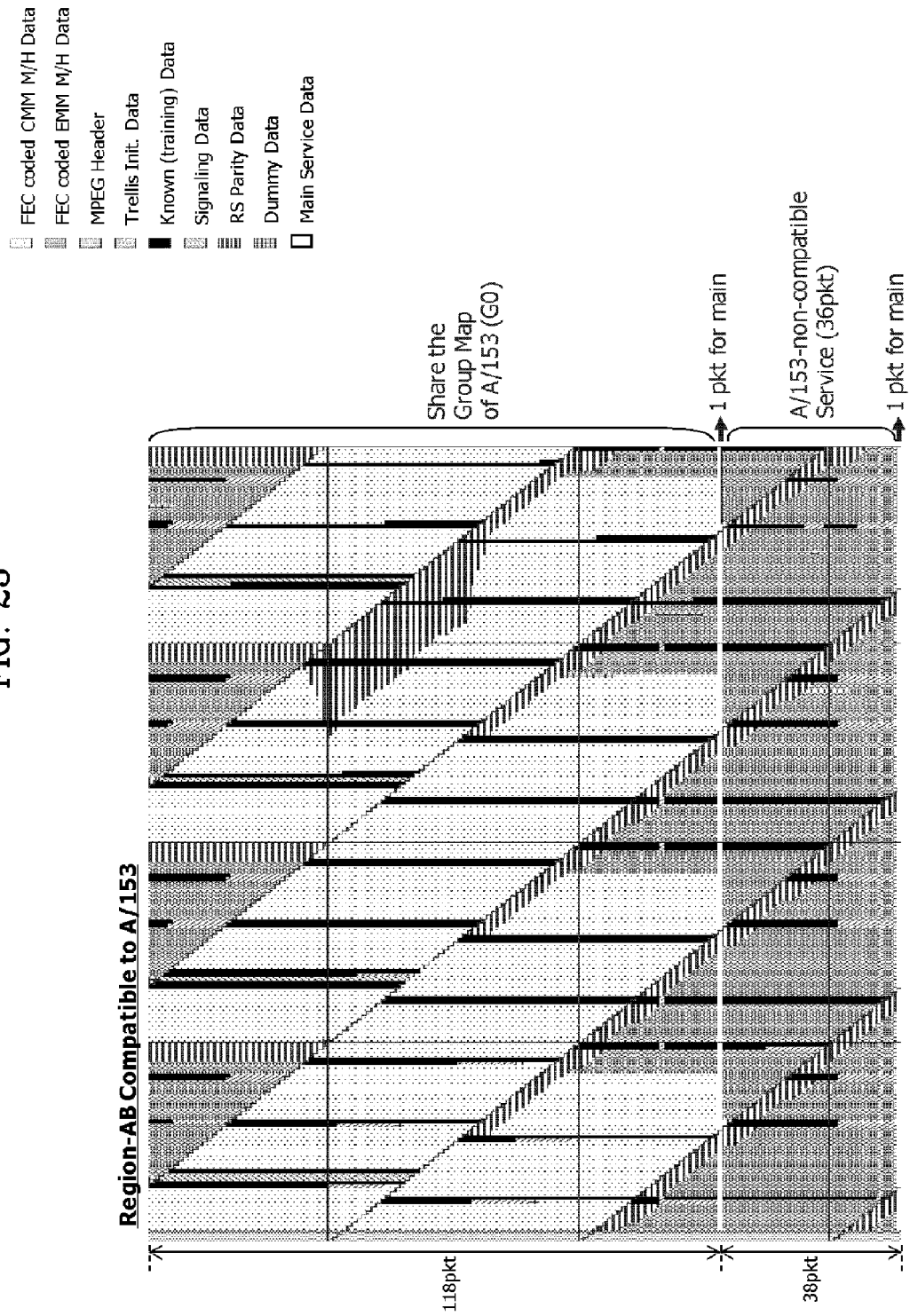
FIG. 23 illustrates an embodiment of a packet domain of group type 2-2.

FIG. 23 illustrates an embodiment of a group structure of the packet domain of the group type 2-2 according to the present invention. That is, FIG. 23 illustrates a group structure before data interleaving. In this case, two main data packets may be inserted and the insertion location may be changed at the designer's discretion.

Figure 24:
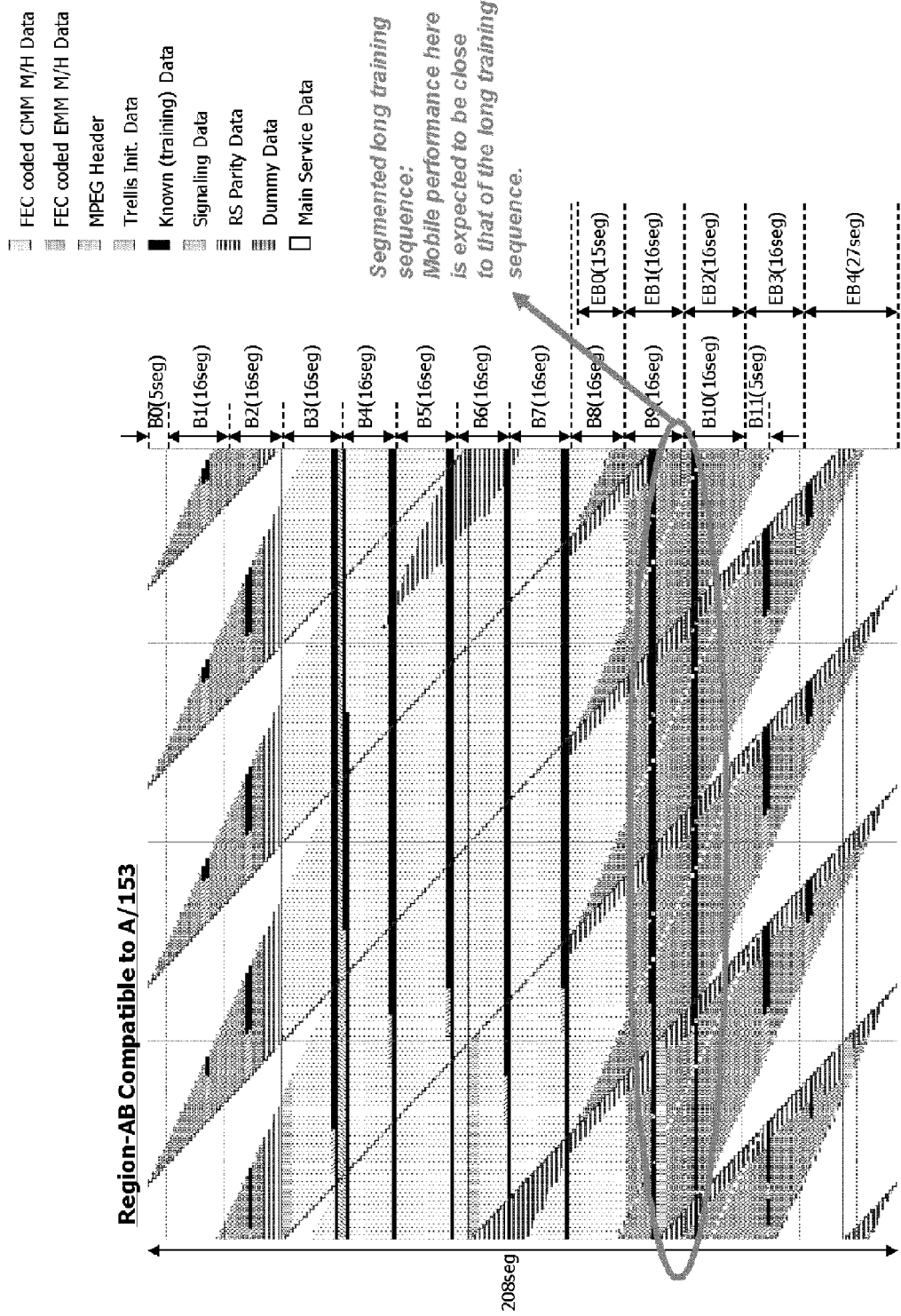
FIG. 24 illustrates an embodiment of a segment domain of group type 2-2.

FIG. 24 illustrates an embodiment of a group structure of the segment domain of the group type 2-2 according to the present invention. That is, FIG. 24 illustrates a group structure after data interleaving. In this case, the E region of the data group may include five blocks and long known data may be inserted into the C and D regions of the data group and short known data may be inserted into the E region of the data group. In this case, when another data group of the same type is concatenated with the data group, the short known data of the E region can be connected to known data of upper C and D regions of the concatenated data group to form long known data.

Figure 25:
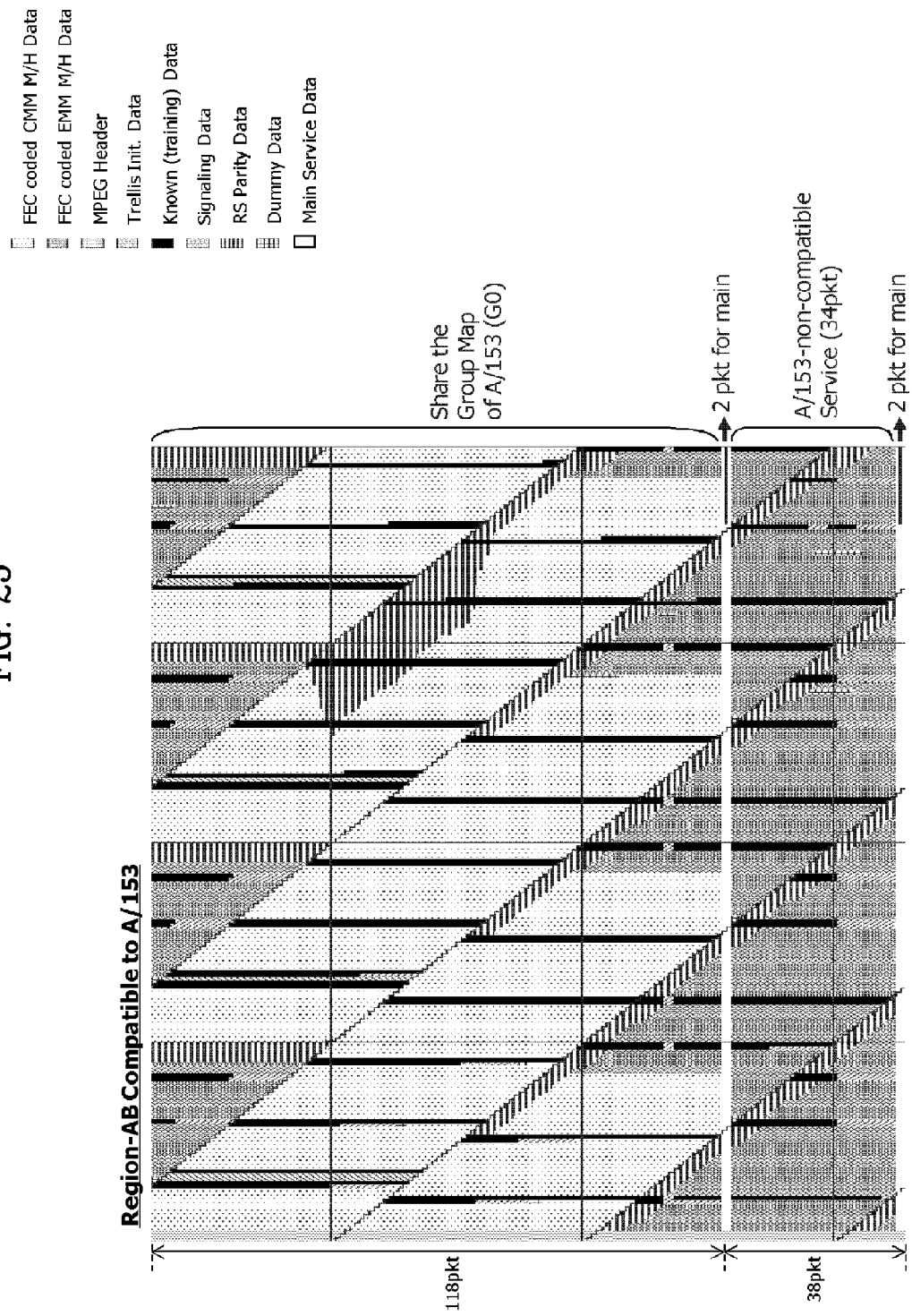
FIG. 25 illustrates an embodiment of a packet domain of group type 2-4.

FIG. 25 illustrates an embodiment of a group structure of the packet domain of the group type 2-4 according to the present invention. That is, FIG. 25 illustrates a group structure before data interleaving. In this case, four main data packets may be inserted and the insertion location may be changed at the designer's discretion.

Figure 26:
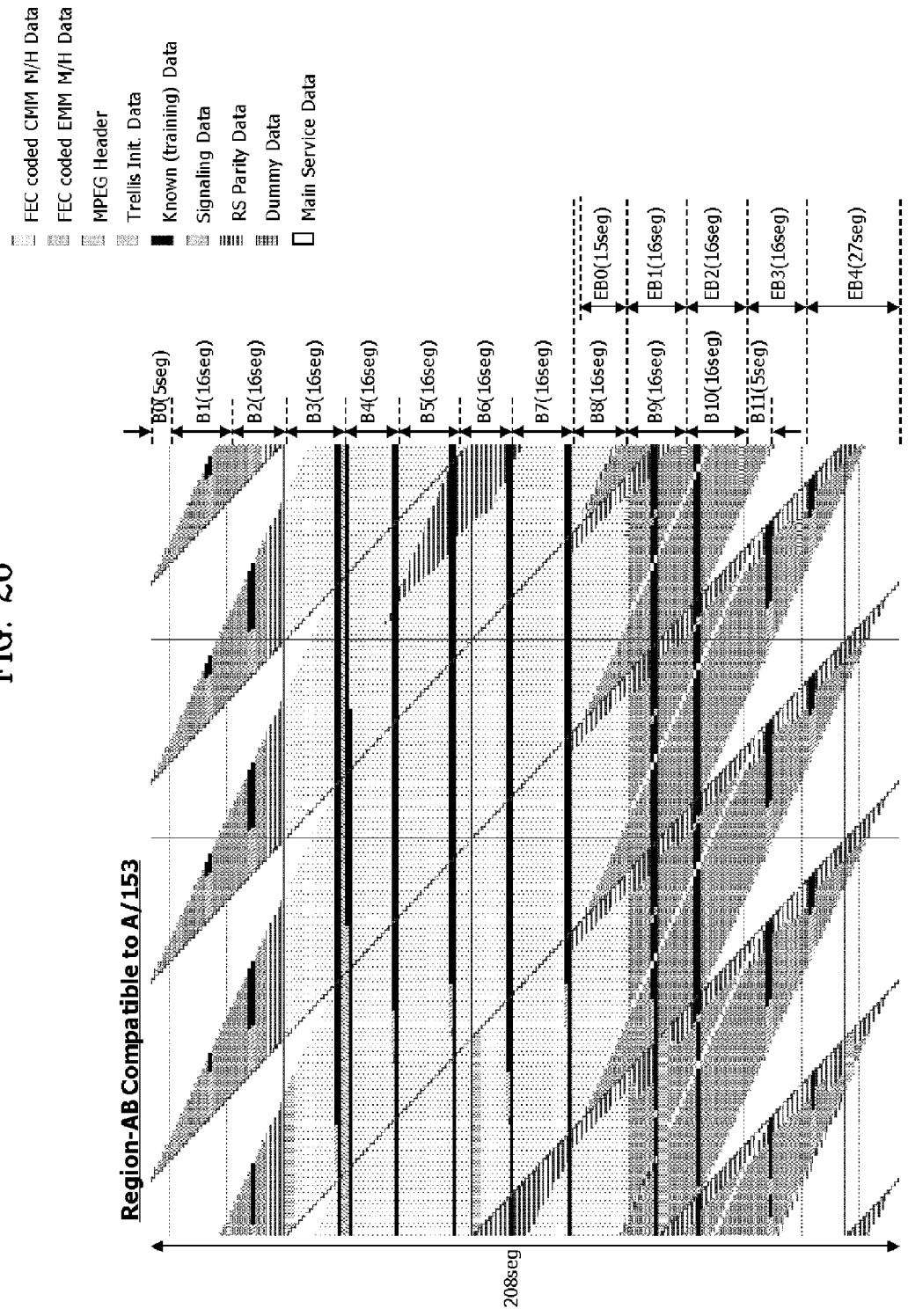
FIG. 26 illustrates an embodiment of a segment domain of group type 2-4.

FIG. 26 illustrates an embodiment of a group structure of the segment domain of the group type 2-4 according to the present invention. That is, FIG. 26 illustrates a group structure after data interleaving. In this case, the E region of the data group may include five blocks and long known data may be inserted into the C and D regions of the data group and short known data may be inserted into the E region of the data group. In this case, when another data group of the same type is concatenated with the data group, the short known data of the E region can be connected to known data of upper C and D regions of the concatenated data group to form long known data.

Figure 27:
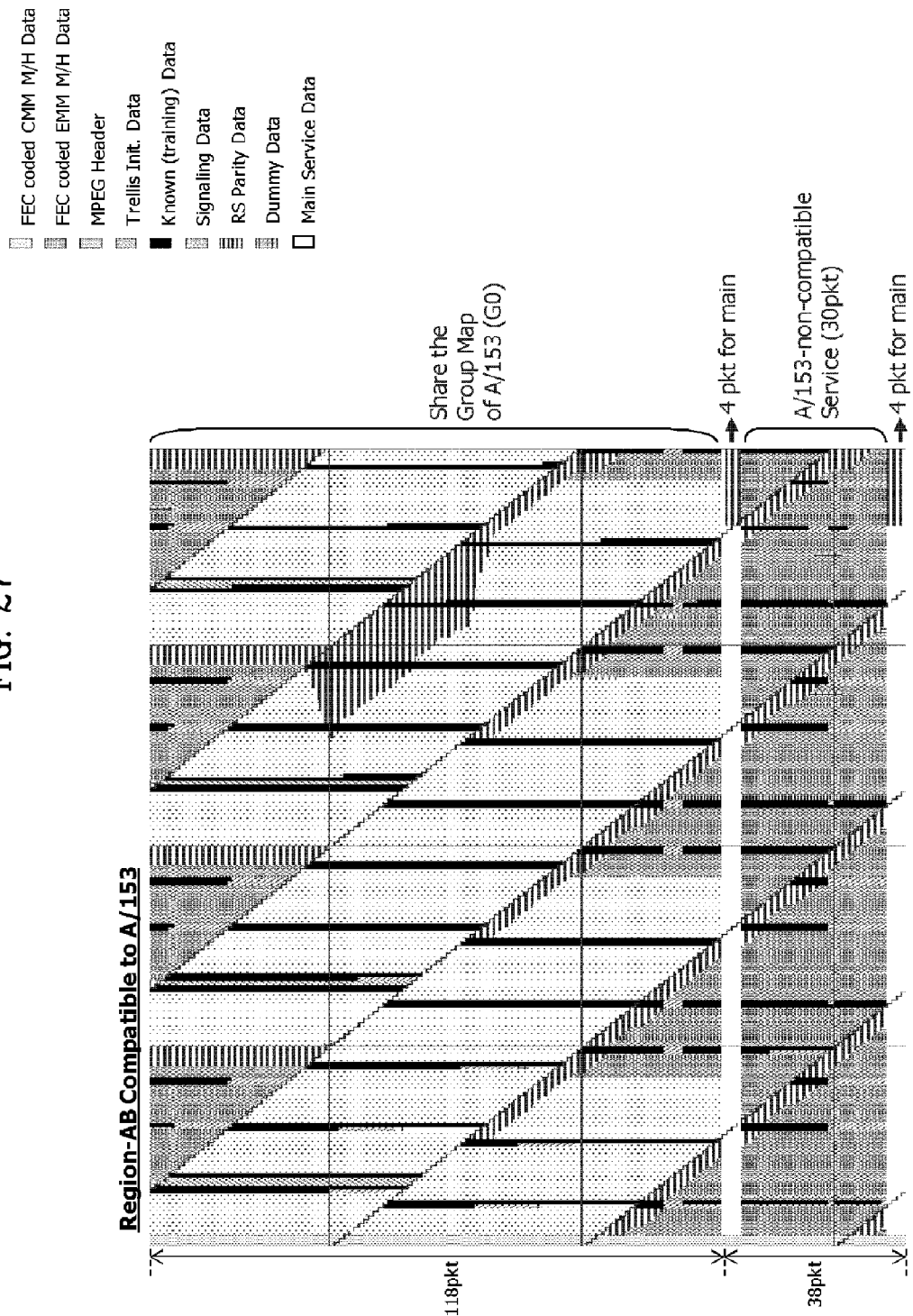
FIG. 27 illustrates an embodiment of a packet domain of group type 2-8.

FIG. 27 illustrates an embodiment of a group structure of the packet domain of the group type 2-8 according to the present invention. That is, FIG. 27 illustrates a group structure before data interleaving. In this case, eight main data packets may be inserted and the insertion location may be changed at the designer's discretion.

Figure 28:
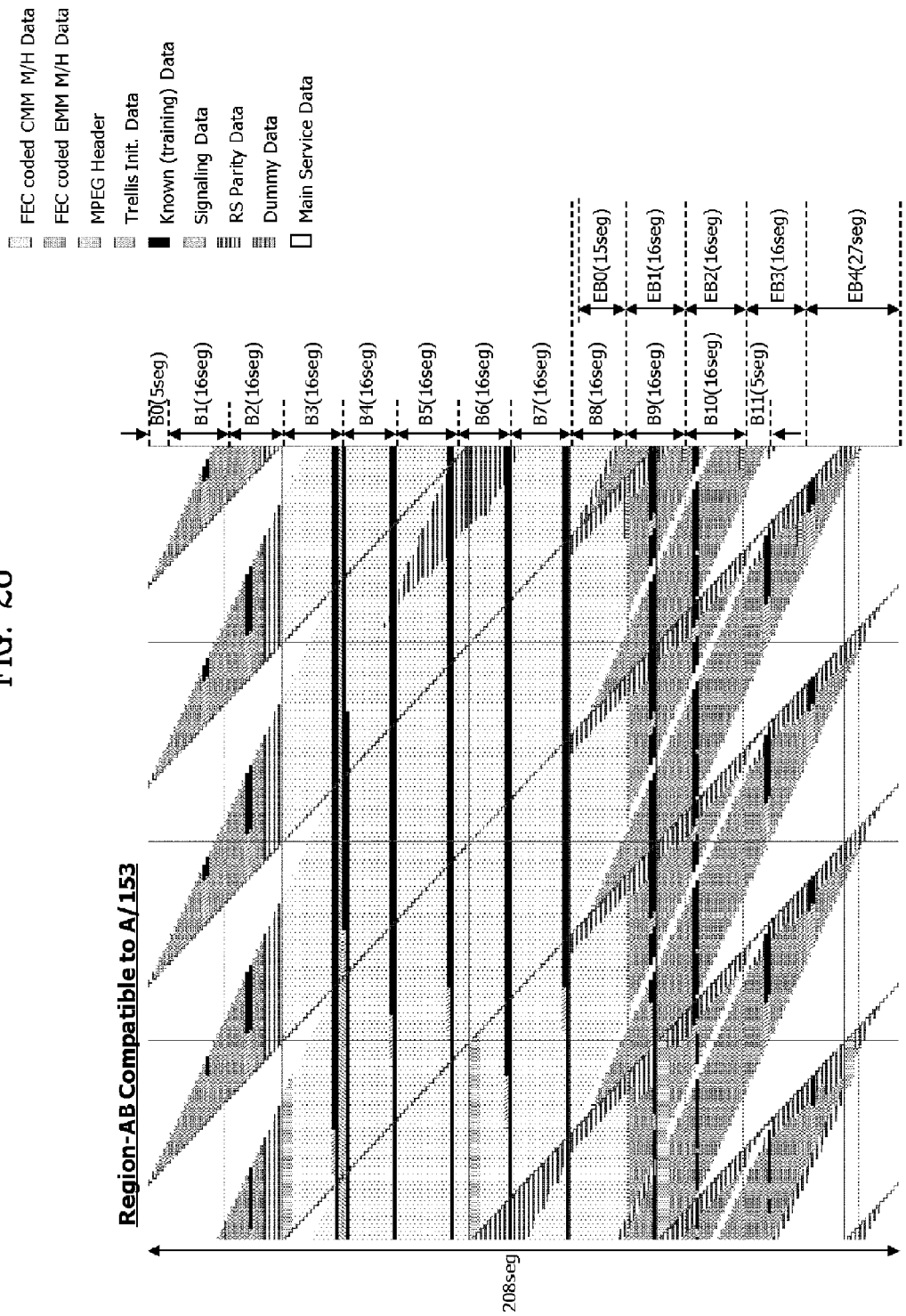
FIG. 28 illustrates an embodiment of a segment domain of group type 2-8.

FIG. 28 illustrates an embodiment of a group structure of the segment domain of the group type 2-8 according to the present invention. That is, FIG. 28 illustrates a group structure after data interleaving. In this case, the E region of the data group may include five blocks and long known data may be inserted into the C and D regions of the data group and short known data may be inserted into the E region of the data group. In this case, when another data group of the same type is concatenated with the data group, the short known data of the E region can be connected to known data of upper C and D regions of the concatenated data group to form long known data.

As can be seen from the group structures of the segment domain of FIGS. 19 to 28, the group includes 12 mobile data blocks B0 to B11 for the first mobile mode and also includes 5 extended mobile data blocks EB0 to EB4 for the second mobile mode.

Here, a receiving system for the first mobile mode may receive and process data of only 6 mobile data blocks B3 to B8 and may also receive and process data of the remaining mobile data blocks for the second mobile mode, together with the data of the 6 mobile data blocks B3 to B8, if the mobile service data for the second mobile mode is compatible. In addition, a receiving system for the second mobile mode may receive all data of the 12 mobile data blocks B0 to B11 and the 5 extended mobile data blocks EB0 to EB4 and may process all mobile data of the first mobile mode and the second mobile mode.

In this case, long known data may be inserted into the mobile data blocks B9 and B10 since mobile data blocks are additionally allocated to the E region, thereby reducing main service data interference. In addition, when another group is concatenated with the group, short known data included in the mobile data blocks B1 and B2 and the mobile data blocks EB3 and EB4 can be connected to short known data included in the concatenated group, thereby serving as long known data. This can further improve reception performance.

Figure 29:
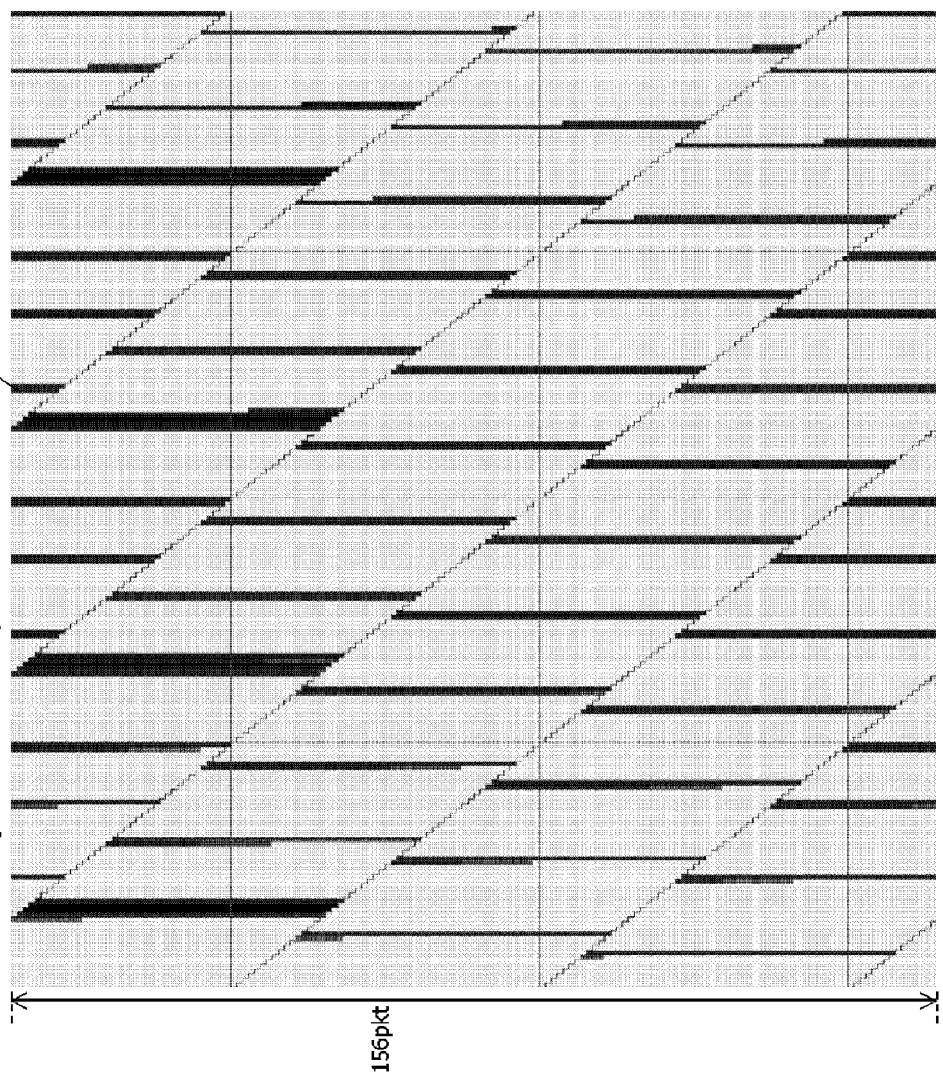
FIG. 29 illustrates an embodiment of a packet domain of group type 3.
Figure 30:
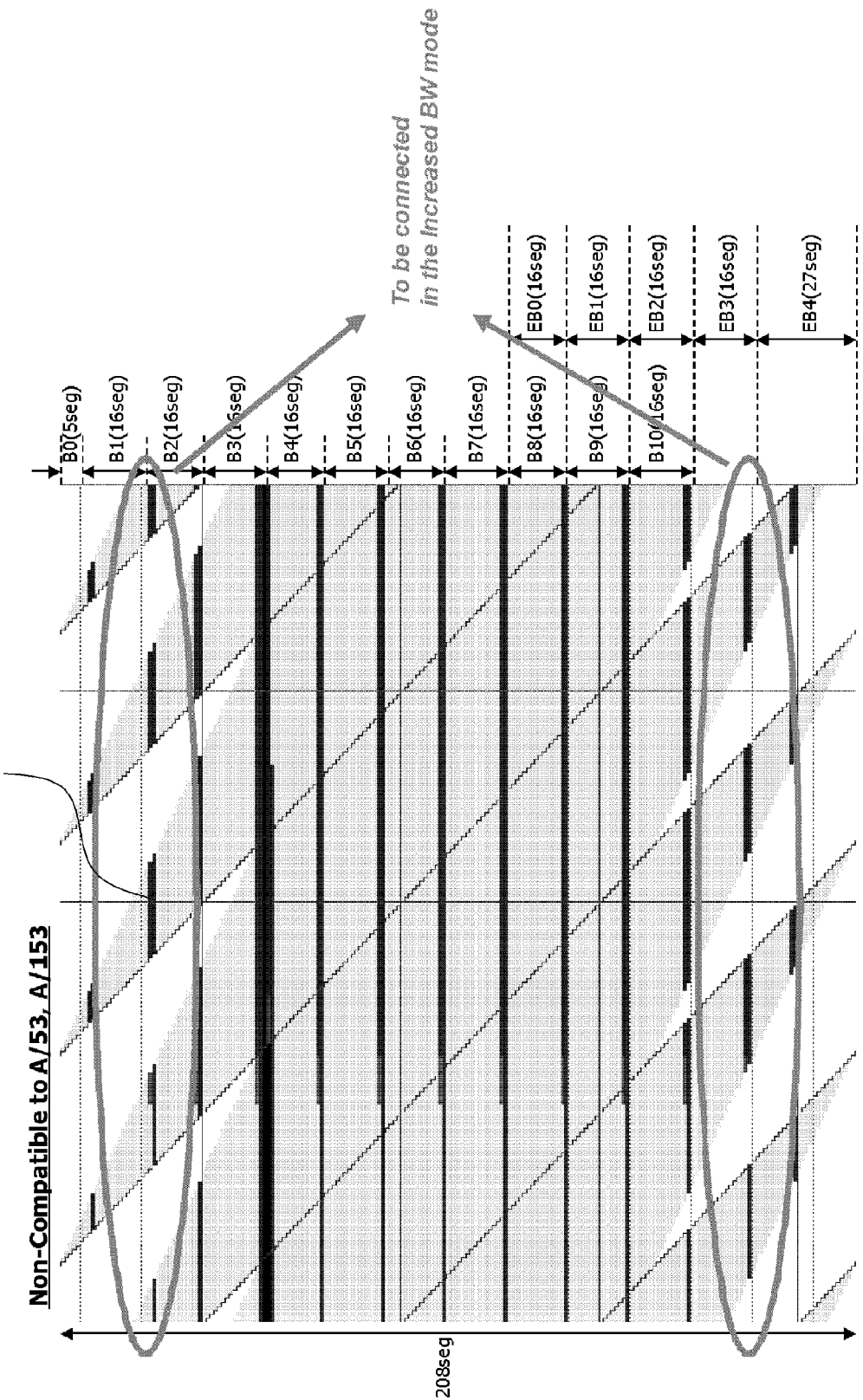
FIG. 30 illustrates an embodiment of a segment domain of group type 3.

FIGS. 29 and 30 illustrate group structures of the group type 3 in a packet domain and a segment domain according to the present invention.

The group of the group type 3 includes a primary group division including A, B, C, D, and E regions and does not include a secondary group division. That is, in the primary group division, mobile service data for the second mobile mode is allocated to the A, B, C, D, and E regions and mobile service data for the first mobile mode is not allocated. In this case, a receiving system for the first mobile mode can receive and process the group type 3 if the mobile service data for the second mobile mode is compatible. In addition, a receiving system for the second mobile mode can receive and process all data of 12 mobile data blocks B0 to B11 and 5 extended mobile data blocks EB0 to EB4.

FIG. 31 illustrates a relationship between a plurality of parades and slots according to the present invention.

Figure 31A:
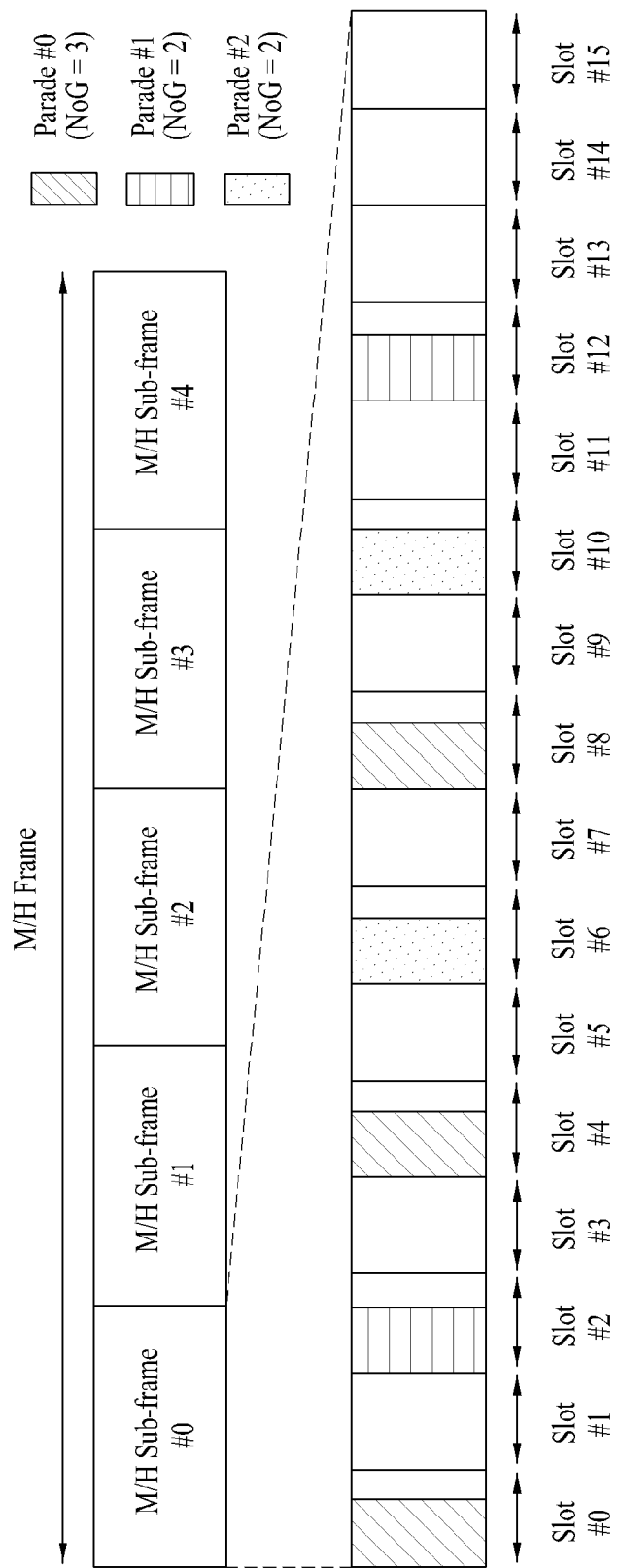
FIGS. 31A and 31B illustrate a relationship between a plurality of parades and slots according to the present invention.

FIG. 31A illustrates an embodiment of allocation of a plurality of parades to one subframe in a transport frame according to the present invention.

A method for allocating a plurality of groups to each slot may be equally or differently applied to each transport frame and may also be equally or differently applied to each subframe included in a transport frame.

In an embodiment of the present invention, one transport frame includes 5 subframes and each subframe includes 16 slots. In this case, the number of groups allocated to one transport frame is a multiple of 5 when group allocation is equally applied to every subframe included in the transport frame.

In an embodiment, a plurality of groups which constitute one parade are allocated so as to be spaced as far apart from one another as possible in one subframe. In this manner, it is possible to robustly cope with burst errors that may occur in one subframe.

When three groups are allocated to one subframe as shown in FIG. 31A, the three groups are allocated to a first slot (Slot #), a fifth slot (Slot #), and a ninth slot (Slot #). When 16 groups are allocated to one subframe using this allocation rule, the 16 groups are allocated to slots in the subframe in the order of Slots #0, #4, #8, #12, #2, #6, #10, #14, #1, #5, #9, #13, #3, #7, #11, and #15.

The rule for allocating groups to one subframe as described above may be mathematically expressed by the following Equation 1.

$$j=(4i+O) \bmod 16, \qquad \text{Equation 1}$$

where
O=0 if i<4,
O=2 else if i<8,
O=1 else if i<12,
O=3 else.

In Equation 1, "j" denotes a slot number in one subframe which may have a value between 0 and 15. "i" denotes a group number which may have a value between 0 and 15.

As shown in FIG. 31A, groups of one parade may be allocated to one subframe and groups of a plurality of parades may also be allocated to one subframe. Groups of a plurality of parades are allocated in the same manner as when groups of one parade are allocated.

One Sub-Frame is expanded to show the detailed Parade pattern in 31-(a) of FIG. 31. All five Sub-Frames follow the same pattern. The 31-(a) of FIG. 31 shows three Parades in a transmission Frame. The first Parade has 3 Groups per Sub-Frame and its Group positions are determined by substituting the Group number i from 0 to 2 in 수학식 1. The second Parade has 2 Groups per Sub-Frame and its allocated Slot numbers are determined by substituting the Group number i from 3 to 4. In a similar manner, the Group positions of the third Parade are obtained by substituting the Group number i from 5 to 6.

Slot allocation for Parades shall be determined by first taking all the Groups of one Parade in sequence as input to Equation 1, followed by the Groups of the second Parade, and so forth.

In an embodiment of the present invention, an overlay parade is first allocated when a plurality of parades is allocated to one subframe.

Figure 31B:
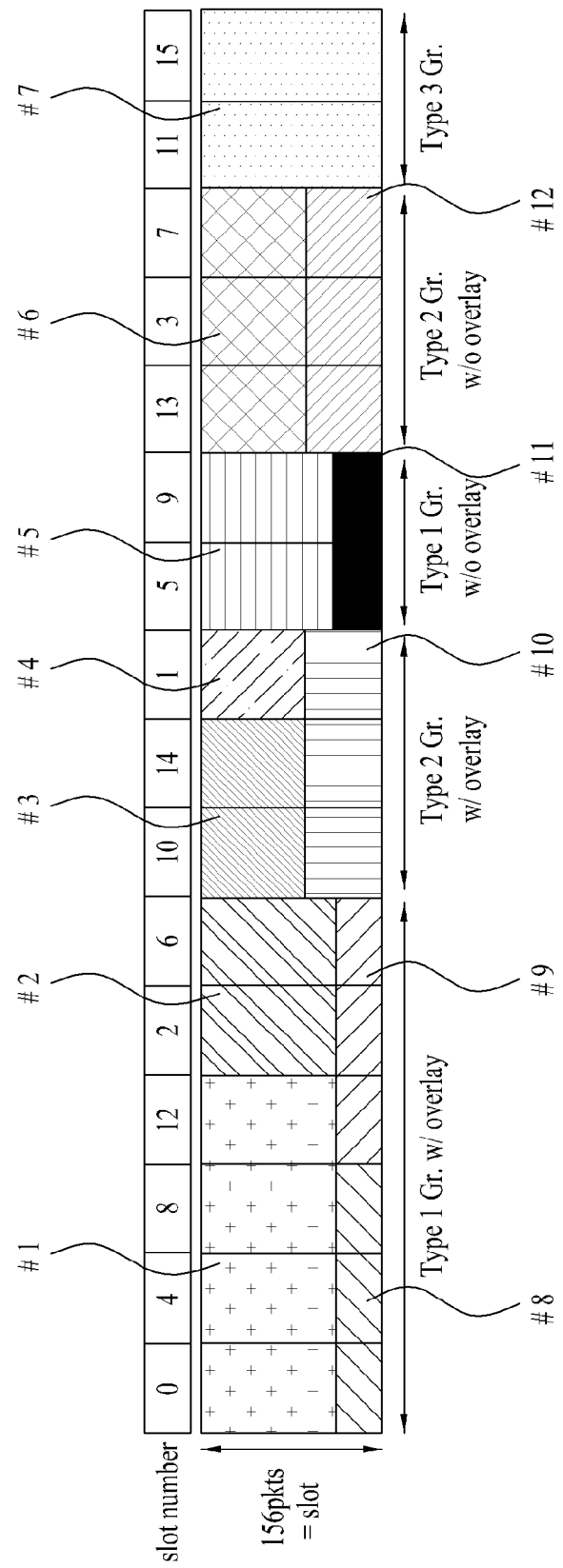

FIG. 31B illustrates another embodiment of allocation of a plurality of parades to one subframe in a transport frame according to the present invention.

Specifically, FIG. 31B illustrates the case where 7 primary parades (Parade #1 to #7), 3 primary parades (Parade #8 to #10), and 2 primary parades (Parade #11 to #12) are allocated to 16 slots.

Here, groups of the group type 1 are allocated to slots #0, #4, #8, #12, #2, and #6, groups of the group type 2 are allocated to slots #10, #14, and #1, groups of the group type 1 are allocated to slots #5 and #9, groups of the group type 2 are allocated to slots #13, #3, and #7, and groups of the group type 3 are allocated to slots #11 and #15. That is, secondary group divisions of groups allocated to the slots #0, #4, #8, #12, #2, and #6 include E regions and mobile service data of the second mobile mode is transmitted through the E regions.

In an example, data of primary parade #1 is allocated to primary group divisions of groups transmitted through the slots #0, #4, #8, and #12 and data of primary parade #2 is allocated to primary group divisions of groups transmitted through the slots #2 and #6. That is, the NOG of the primary parade #1 is 4 and the NOG of the primary parade #2 is 2. On the other hand, data of overlay parade #8 is allocated to secondary group divisions of groups transmitted through the slots #0, #4, and #8 and data of overlay parade #9 is allocated to secondary group divisions of groups transmitted through the slots #12, #2, and #6. That is, the NOG of the overlay parade #8 is 3 and the NOG of the overlay parade #9 is 3. In this manner, the overlay parade does not depend on the primary parade and the NOG of the overlay parade is also different from that of the primary parade. Here, it can be seen that the overlay parade and the primary have different parade identifiers although they may have the same NOG.

In another example, a single overlay parade may also be constructed of a set of secondary group divisions of groups allocated to the slots #0, #4, #8, #12, #2, and #6 since the groups allocated to the slots #0, #4, #8, #12, #2, and #6 have the same group type (for example, group type 1).

In addition, data of primary parade #3 is allocated to primary group divisions of groups transmitted through the slots #10 and #14 and data of primary parade #4 is allocated to a primary group division of a group transmitted through the slot #1. That is, the NOG of the primary parade #3 is 2 and the NOG of the primary parade #4 is 1. On the other hand, data of overlay parade #10 is allocated to secondary group divisions of groups transmitted through the slots #10, #14, and #1. That is, the NOG of the overlay parade #10 is 3.

In another example, data of primary parade #5 is allocated to primary group divisions of groups transmitted through the slots #5 and #9 and data of primary parade #11 is allocated to secondary group divisions of the groups transmitted through the slots #5 and #9. That is, the NOG of the primary parade #5 and the NOG of the secondary parade #11 are both 2. In this manner, the secondary parade is paired with the primary parade and has the same NOG and parade identifier as the primary parade.

In another example, data of primary parade #6 is allocated to primary group divisions of groups transmitted through the slots #13, #3, and #7 and data of secondary parade #13 is allocated to secondary group divisions of the groups transmitted through the slots #13, #3, and #7. That is, the NOG of the primary parade #6 and the NOG of the secondary parade #12 are all 3.

In another example, groups transmitted through the slots #11 and #15 include only primary group divisions and data of primary parade #7 is allocated to the primary group divisions. That is, primary group divisions of groups transmitted through the slots #11 and #15 include A, B, C, D, and E regions and mobile service data of the second mobile mode is allocated to the A, B, C, D, and E regions.

In this manner, groups of a plurality of parades may be allocated to one M/H frame and groups are sequentially allocated to one subframe at intervals of 4 slots in a left to right direction. In addition, when a plurality of parades allocated to one subframe includes an overlay parade, groups of the overlay parade are first allocated to the subframe. In the case of FIG. 11, groups of the group type 1 including secondary group divisions, to which data of overlay parade #8 is allocated, are first allocated, and groups of the group type 1 including secondary group divisions, to which data of overlay parade #9 is allocated, are then allocated, and groups of the group type 2 including secondary group divisions, to which data of the overlay parade #10 is allocated, are then allocated. When the number of overlay parades allocated to one subframe is two or more, the order of allocation of the overlay parades may be defined arbitrarily and may also be determined by agreement.

Figure 32:
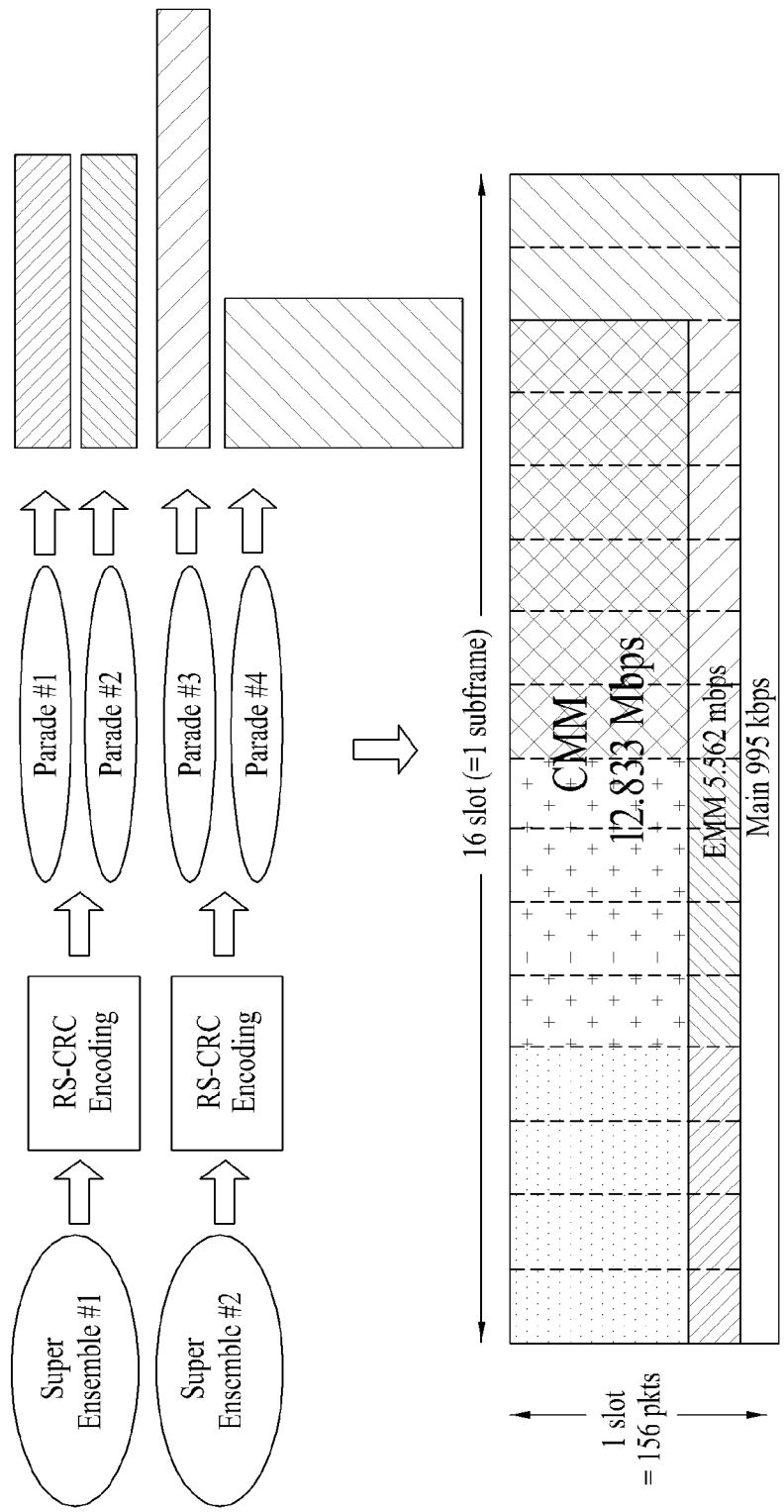
FIG. 32 is a conceptual diagram illustrating a relationship between a super ensemble, a super RS frame, and two parades.

FIG. 32 is a conceptual diagram illustrating a relationship between a super ensemble, a super RS frame, and two parades. A super RS frame payload is RS-CRC encoded into a super RS frame. The super RS frame is transmitted through two parades. The two parades have the same or different types. That is, super RS frame payload #1 is RS-CRC encoded to create super RS frame #1 and the super RS frame #1 is transmitted through parade #1 and parade #2. Here, the types of the parade #1 and parade #2 may be different. For example, the parade #1 may be a secondary parade and the parade #2 may be an overlay parade. Namely, the parade #1 and the parade #2 may constitute one super RS frame.

In addition, super RS frame payload #2 is RS-CRC encoded to create super RS frame #2 and the super RS frame #2 is transmitted through parade #3 and parade #4. Here, the types of the parade #3 and parade #4 may also be different. For example, the parade #3 may be a secondary parade and the parade #4 may be a primary parade. Namely, the parade #3 and the parade #4 may constitute one super RS frame.

The types of two parades carrying one super RS frame are independent of each other as described above.

FIG. 33 illustrates an embodiment of an RS frame encoder 111 included in a preprocessor in a transmitting system according to the present invention.

The RS frame encoder 111 may construct an RS frame payload by combining a plurality of randomized mobile service data packets input to the RS frame encoder 111 and then may perform at least one of an error correction process and an error detection encoding process on each RS frame payload to create an RS frame. This procedure imparts robustness to mobile service data while distributing burst errors that may occur due to radio environment changes so that it is possible to cope with poor radio environments which rapidly change.

In an embodiment, the RS frame encoder 111 applies RS encoding for the error correction encoding and applies Cyclic Redundancy Check (CRC) encoding for the error detection encoding. Parity data to be used for error correction is generated when the RS encoding is performed and CRC data to be used for error detection is generated when CRC encoding is performed.

RS encoding is a type of Forward Error Correction (FEC), which is a technology for correcting errors that have occurred during transmission. CRC data generated through the CRC encoding may be used to indicate whether or not mobile service data has been damaged by errors during transmission through a channel. In the present invention, error detection methods other than CRC encoding may also be used or an error detection method may be used to increase overall error correction performance of the receiving side.

In an embodiment of the present invention, the RS frame encoder 111 performs randomization on mobile service data of the first mobile mode and/or mobile service data of the second mobile mode to create an RS frame payload and RS-CRC encodes the RS frame to create an RS frame.

If the RS frame encoder 111 performs randomization on mobile service data of the first mobile mode and mobile service data of the second mobile mode, the data randomizer 131 of the postprocessor 130 may omit the process for randomizing the mobile service data of the first mobile mode and mobile service data of the second mobile mode. The RS frame may include mobile service data of the first mobile mode or may include mobile service data of the second mobile mode. Alternatively, the RS frame may also include both mobile service data of the first mobile mode and mobile service data of the second mobile mode. When the RS frame includes mobile service data of the second mobile mode, groups to which data of the RS frame are allocated may be of one of the group types 1 to 3.

In the present invention, the RS frame encoder 111 may include one or more RS frame encoders. For example, the RS frame encoder may include a primary RS frame encoder, a secondary RS frame encoder, an overlay RS frame encoder, and a super RS frame encoder. In this case, the primary RS frame encoder RS-CRC encodes a primary RS frame payload to create a primary RS frame and the secondary RS frame encoder RS-CRC encodes a secondary RS frame payload to create a secondary RS frame. In addition, the overlay RS frame encoder RS-CRC encodes an overlay RS frame payload to create an overlay RS frame and the super RS frame encoder RS-CRC encodes a super RS frame payload to create a super RS frame. The primary RS frame, the secondary RS frame, the overlay RS frame, and the super RS frame may have different sizes and at least two of the RS frames may have the same size. In an embodiment, the sizes of the secondary RS frame, the overlay RS frame, and the super RS frame are different such that the column lengths thereof are equal while the row lengths (i.e., the values of "N") thereof are different.

FIG. 33(a) is a conceptual block diagram of the RS frame encoder.

The input demultiplexer separates the input Ensembles and routes the corresponding Ensemble(s) into each RS Frame encoder.

As shown in FIG. 33(a), there is the same number of RS Frame encoders as the number of Parades in a transmission Frame. Each RS Frame encoder builds one or two RS Frames for each Parade and separates each RS Frame into several portions. Each segmented portion of the RS Frame corresponds to the amount of data carried by a Group.

FIG. 33(b) is a detailed block diagram of the RS frame encoder.

Each RS Frame encoder shall include a data randomizer, an RS-CRC encoder and an RS Frame divider for the primary Ensemble, and a parallel set of these Blocks for the secondary Ensemble.

In the RS Frame encoder, one or two RS Frames are built depending on an RS Frame mode. The RS frame mode indicates whether the RS frame is a single frame mode or a dual frame mode. The RS frame mode may have a value of 00 when the RS frame is a single frame mode and a value of 01 when the RS frame is a dual frame mode. This may be changed at the designer's discretion.

FIG. 34 illustrates an embodiment of an RS frame encoding procedure and an RS frame portion dividing procedure.

Figure 34A:
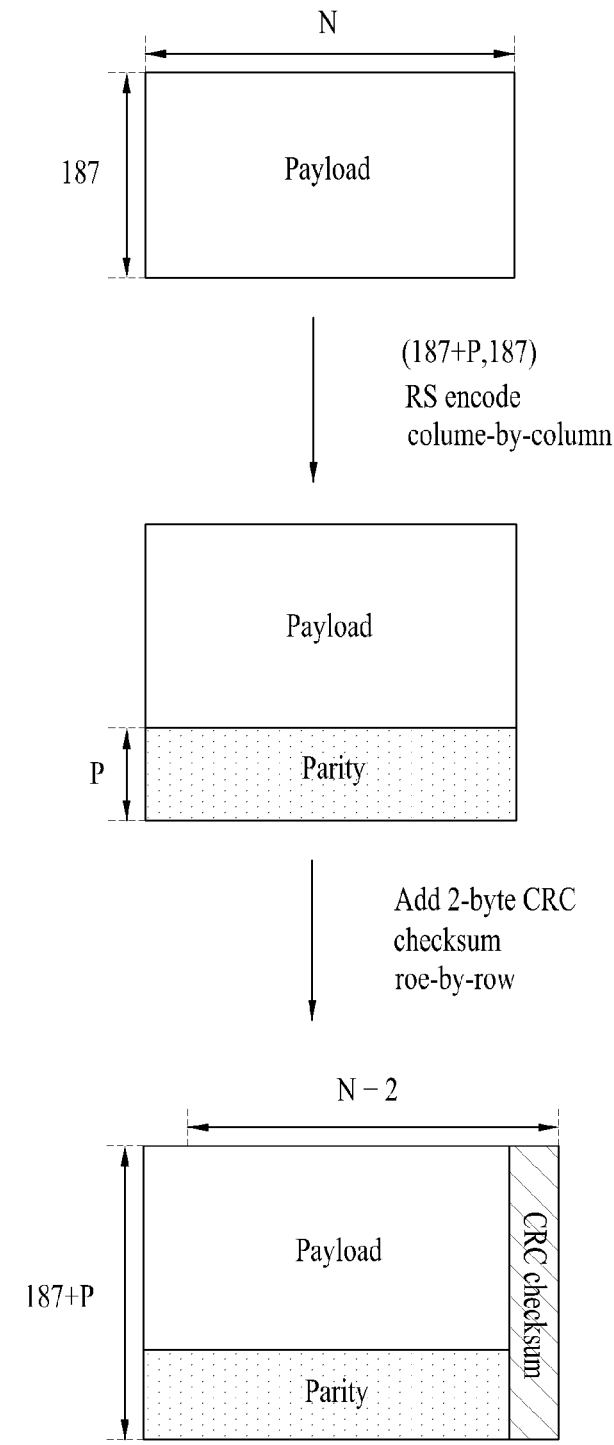
FIGS. 34A and 34B illustrate an embodiment of an RS frame encoding procedure and an RS frame portion dividing procedure.

FIG. 34A illustrates an RS frame CRC encoding procedure. The RS frame encoder 111 divides input mobile service data bytes into units of a specific length. The specific length is determined by the system designer. In the present invention, the specific length is described as being 187 bytes as an embodiment and the 187-byte unit is referred to as a "packet" for ease of explanation.

For example, when input mobile service data is MPEG Transport Stream (TS) packets, each being a 188-byte unit, the first synchronization byte of each of the input packet is removed to create a 187-byte packet. The synchronization byte is removed since all mobile service data packets have the same value. When the input RS frame data is not in the MPEG TS packet format, the data may be read in 187-byte units without the MPEG synchronization byte removal process to create an RS frame.

That is, N 187-byte packets are combined to create an RS frame payload. Here, the RS frame payload is created by inserting 187-byte packets sequentially in a row direction into an RS frame payload format having N (row)×187 (column) bytes.

Here, each of the N columns of the RS frame payload includes 187 bytes.

In this case, (Nc, Kc)-RS encoding may be performed on each column to generate Nc−Kc (=p) parity bytes and the generated P parity bytes may then be added to the column, next to the last byte of the column, to create one (187+P)-byte column. Here, Kc is 187 and Nc is 187+P. For example, when P is 48, (235, 187)-RS encoding may be performed to create one 235-byte column.

An RS frame having a size of N (row)×(187+P) (column) bytes may be created by performing such an RS encoding procedure on all N columns.

Each row of the RS frame payload includes N bytes. However, an error may be included in the RS frame depending on channel conditions between transmitting and receiving sides. CRC data (i.e., CRC code or CRC checksum) may be used to check whether or not an error has occurred in each row.

The RS frame encoder 111 may perform CRC encoding on RS-encoded mobile service data in order to generate the CRC data. The CRC data generated through the CRC encoding may be used to indicate whether or not the mobile service data has been damaged by an error during transmission through a channel.

A 2-byte CRC checksum is added to each row to create an RS frame having a size of (N+2) (row)×(187+P) (column) bytes.

Figure 34B:
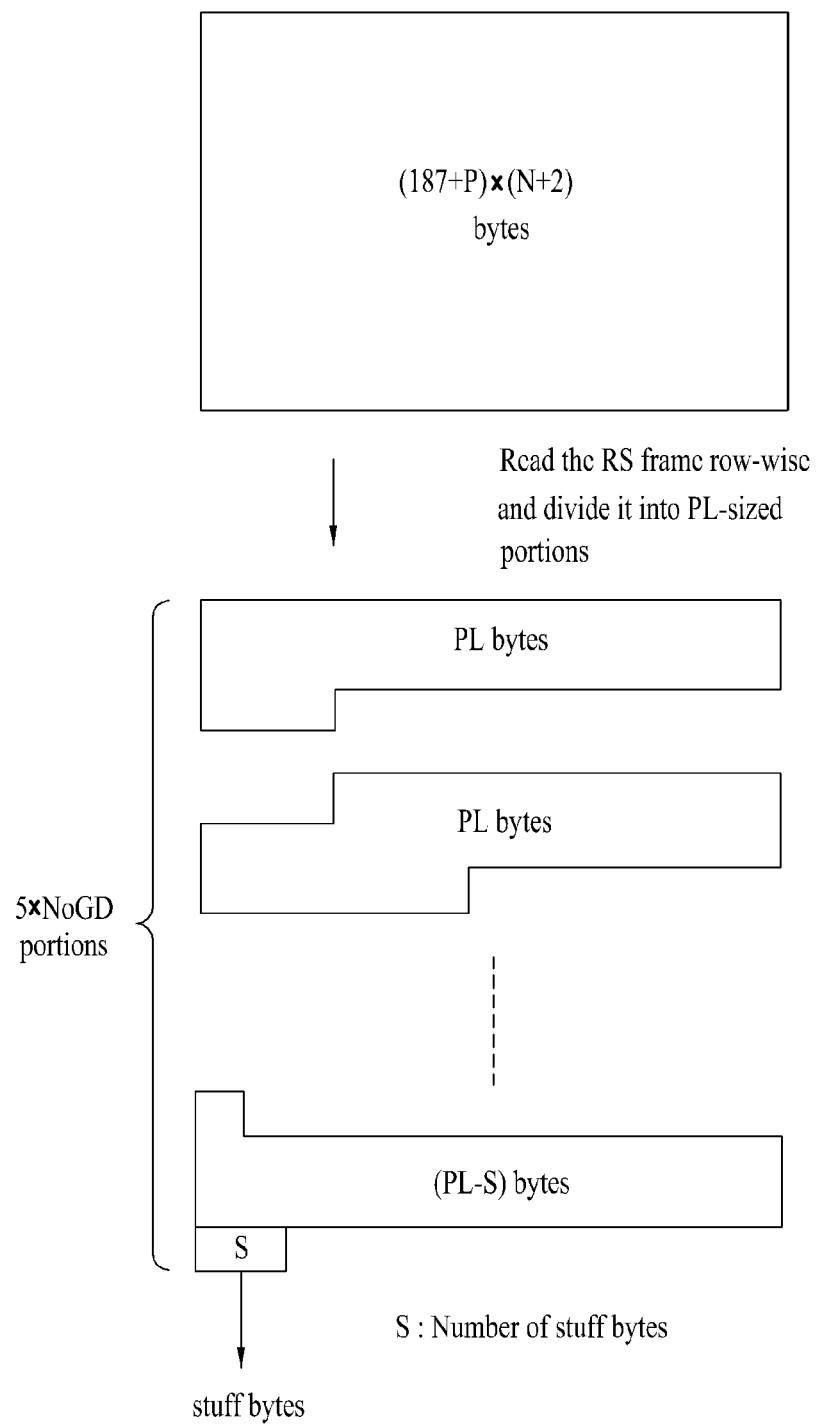

FIG. 34B illustrates an embodiment of a procedure in which an RS frame is divided into RS frame portions.

RS and CRC encoding, the RS Frame consists of (187+P)× (N+2) bytes of data.

As shown in FIG. 34B, the total number of bytes of a RS- and CRC-encoded RS Frame is slightly less than or equal to 5×NoG×PL, the RS Frame can be divided into ((5×NoG)−1) portions of size PL bytes plus one portion of size PL or smaller. Some padding bytes can be appended to the last portion of the encoded RS Frame data if necessary to make up a final PL-sized portion.

Through RS and CRC encoding, the encoded RS Frame shall be divided into a number of successive portions. Each portion shall contain PL bytes taken from the RS Frame (where PL is the RS Frame Portion Length). The number of portions shall be (5×NoG). The first ((5×NoG)−1) portions shall contain PL bytes. The last portion shall conclude with padding bytes if necessary to make it the same size (PL bytes) as the other portions. Each portion of PL-sized data shall be fed to a Block processor.

FIG. 35 illustrates another embodiment of a procedure in which an RS frame is divided into RS frame portions.

In the embodiment of FIG. 35A, the RS frame encoder 111 receives a primary ensemble and creates an RS frame for each parade. In this case, RS frame portions generated through division of an RS frame may be transmitted through A, B, C, D, and E regions of groups.

Figure 35B:
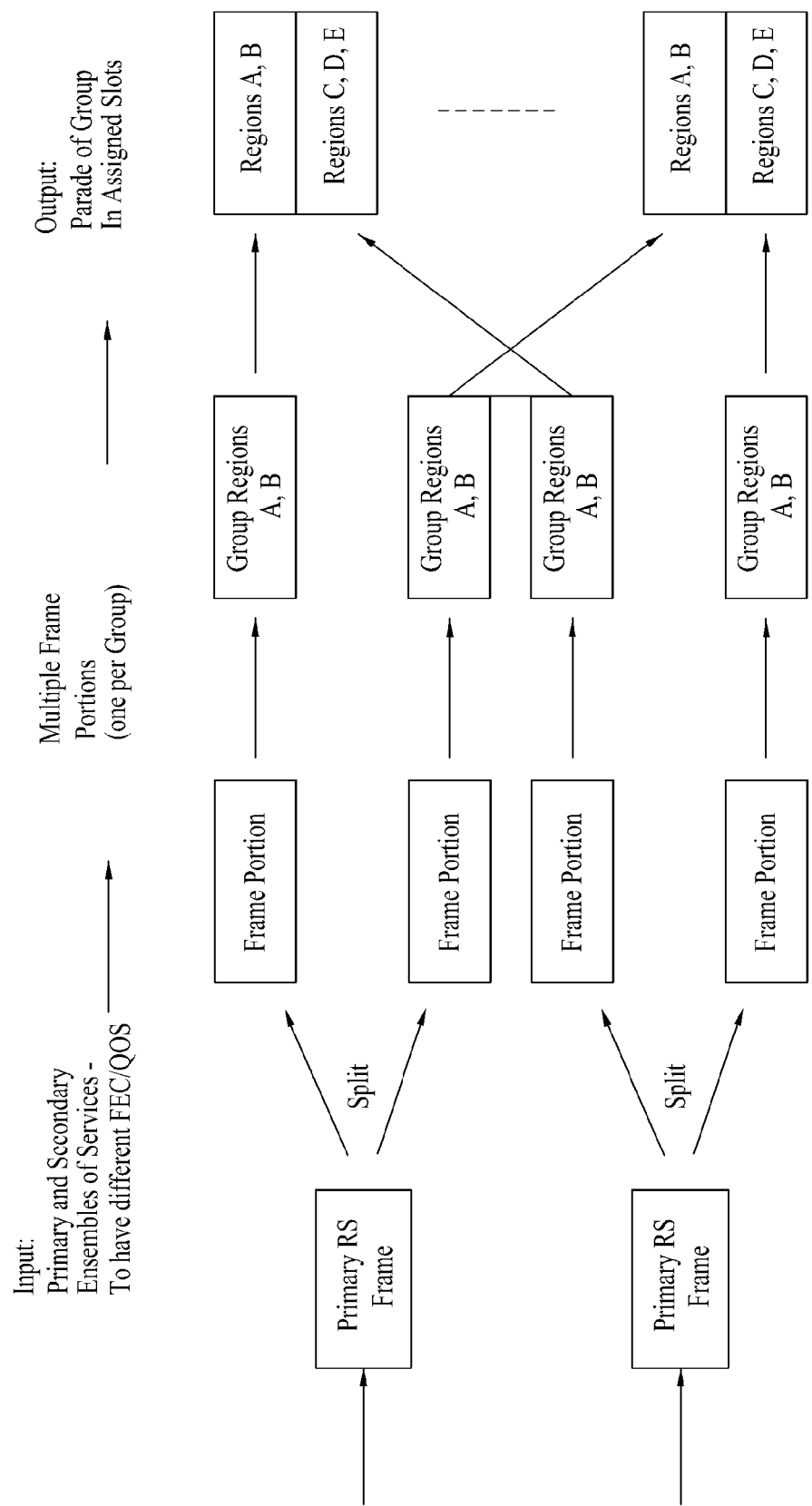

In the embodiment of FIG. 35B, the RS frame encoder 111 receives a primary ensemble and a secondary ensemble and creates two RS frames for each parade. In this case, primary RS frame portions generated through division of a primary RS frame may be transmitted through A and B regions of groups and secondary RS frame portions generated through division of a secondary RS frame may be transmitted through C, D, and E regions of groups.

Figure 36:
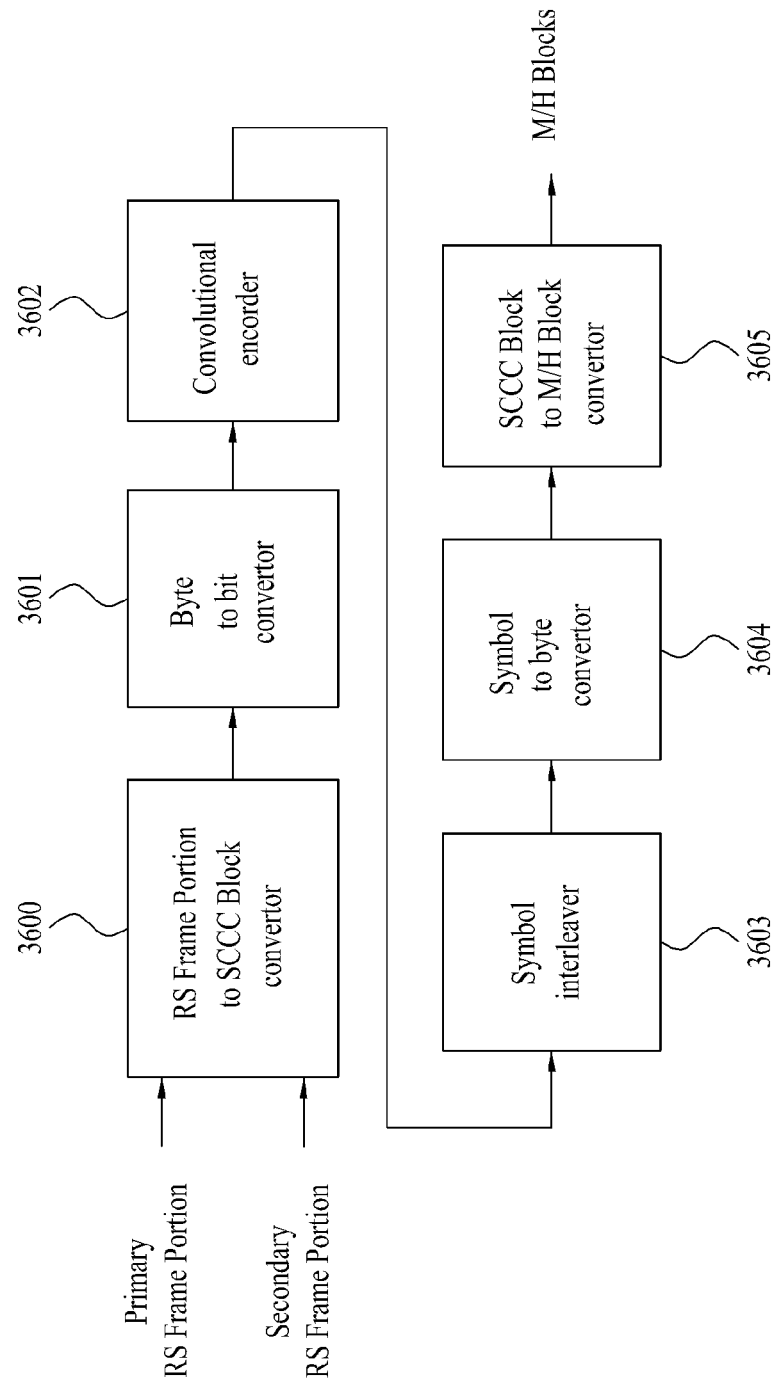
FIG. 36 is a block diagram illustrating a structure of the block processor 112 according to the present invention.

FIG. 36 is a block diagram illustrating a structure of the block processor 112 according to the present invention.

In the present invention, the block processor 112 may include an RS frame portion to SCCC block converter 3600, a byte-to-bit converter 3601, a convolutional encoder 3602, a symbol interleaver 3603, a symbol-to-byte converter 3604, and an SCCC block to mobile data block converter 3605.

The RS frame portion to SCCC block converter 3600 divides the received RS Frame Portion(s) into several SCCC blocks.

The byte-to-bit converter 3601 serves to convert parallel bytes to serial bits.

The convolutional encoder 3602 performs outer convolutional coding according to the SCCC code mode. The SCCC code mode indicates a code rate. In an embodiment of the present invention, the code rate is one of $\frac{1}{2}$, $\frac{1}{3}$, and $\frac{1}{4}$.

In an embodiment of the present invention, mobile service data of the first mobile mode is encoded at $\frac{1}{2}$ or $\frac{1}{4}$ code rate and mobile service data of the second mobile mode is encoded at $\frac{1}{3}$ code rate. Here, the block processor 112 may perform SCCC outer encoding in units of regions in groups, in units of group divisions, or in units of SCCC blocks.

The symbol interleaver 3603 scrambles the output symbols from the convolutional encoder. The symbol interleaver (3603) is a type of Block interleaver.

The symbol-to-byte converter 3604 converts the interleaved symbols into bytes.

The SCCC block to mobile data block converter 3605 maps SCCC block(s) including convolution-coded data to a mobile data block according to the SCCC block mode and outputs the resulting data.

Table 1 illustrates a relationship between the RS Frame mode, the SCCC block mode, RS Frame portions, and the SCCC code mode.

TABLE 1

| RS Frame Mode | SCCC Block Mode | RS Frame Portions | SCCC Code Mode (00 → ½ rate, 10 → ⅓ rate or 01 → ¼ rate) |
|---|---|---|---|
| 00 | 00 (Separate) | Primary only | Independent per Region (A, B, C, or D) |
| 00 | 01 (Paired) | Primary only | Identical for all Regions (A, B, C, and D) |
| 01 | 00 (Separate) | Primary + Secondary | Independent per Region (A, B, C, or D) (For A, B, ⅓ rate is not allowed) |
| 01 | 01 (Paired) | (not allowed) | (not allowed) |

The SCCC block mode indicates whether the SCCC block to mobile data block converter 3605 maps a single SCCC block to a single mobile data block (separate mode) or maps two SCCC blocks to a single mobile data block (paired mode). In the present invention, the SCCC block mode has a value of "00" when it is a separate mode and has a value of "01" when it is a paired mode. This can be changed at the designer's discretion.

The SCCC code mode indicates an SCCC code rate and has a value of "00" when the SCCC code rate is ½, "10" when the SCCC code rate is ⅓, and "01" when the SCCC code rate is ¼. This can be changed at the designer's discretion.

According to Table 1, when the RS frame mode is "00", RS frame portions may be transmitted through A, B, C, D, and E regions of groups since only a primary RS frame is present. In this case, when the SCCC block mode is "00", one of the code rates ½, ⅓, and ¼ may be independently (or individually) applied to each region and may also be independently applied to each region in units of SCCC blocks for transmission through the region at the designer's discretion. When the SCCC block mode is "01", one of the code rates ½, ⅓, and ¼ may be equally applied to every region.

When the RS frame mode is "01", a primary RS frame and a secondary RS frame are present. In this case, each code rate other than code rate ⅓ may be independently applied to A and B regions, through which the primary RS frame is to be transmitted, and each of the code rates ½, ⅓, and ¼ may be independently applied to C, D, and E regions on a region basis or on an SCCC block basis.

Figure 37:
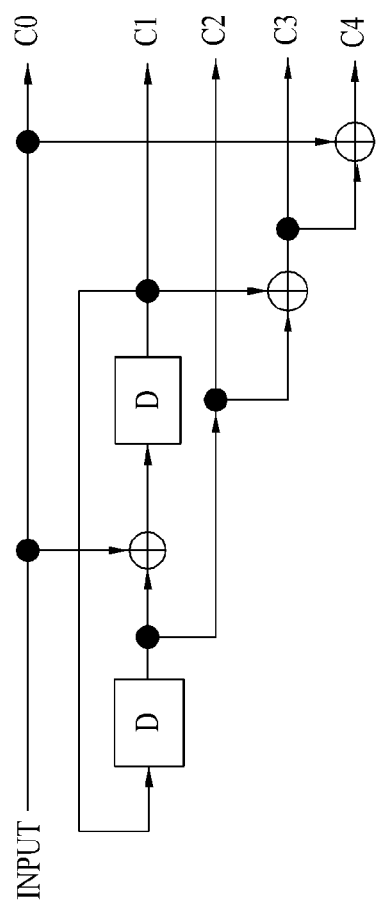
FIG. 37 illustrates an embodiment of outer convolutional coding of the convolutional encoder 3602 according to the present invention.

FIG. 37 illustrates an embodiment of outer convolutional coding of the convolutional encoder 3602 according to the present invention.

The blocks labeled "D" are unit-clock-time delays. A 1-bit input (S) shall be encoded into 5 output bits (C0, C1, C2, C3, C4) once perunit-clock cycle.

For ½-rate coding, the leftmost bit, C0, of each symbol (C0, C1) shall be the Most Significant Bit (MSB) for definition of processing order in subsequent stages and shall be passed first to succeeding processing stages.

For ⅓ rate coding, 2 input bits shall be encoded into 3 output symbols. The leftmost symbol of a symbol pair shall be output first. Also, similarly to ½-rate coding, the leftmost bit in a symbol shall be the MSB and shall be output before the LSB. For example, a first output symbol is composed of a (C0, C2) bit-pair and a second output symbol is composed of a (C4, C0) bit-pair and a third output symbol is composed of a (C2, C4) bit-pair. The first C0, C2 and C4 are generated from the first input bit; and the second C0, C2 and C4 are generated from the second input bit.

For the case of ¼ rate, two output symbols shall be constructed according to the associated Region. The leftmost symbol of a symbol pair shall be output first. Also, similarly to the ½-rate case, the leftmost bit in a symbol shall be the MSB and shall be output before the LSB. For example, in the ¼ rate mode of Region A (or B), a first output symbol is composed of a (C0, C2) bit-pair, and a second output symbol is composed of a (C1, C4) bit-pair, and the order of bits in the output is C0, C2, C1, C4.

The memory contents of the convolutional encoder shall be reset to zero before encoding each SCCC block.

Figure 38:
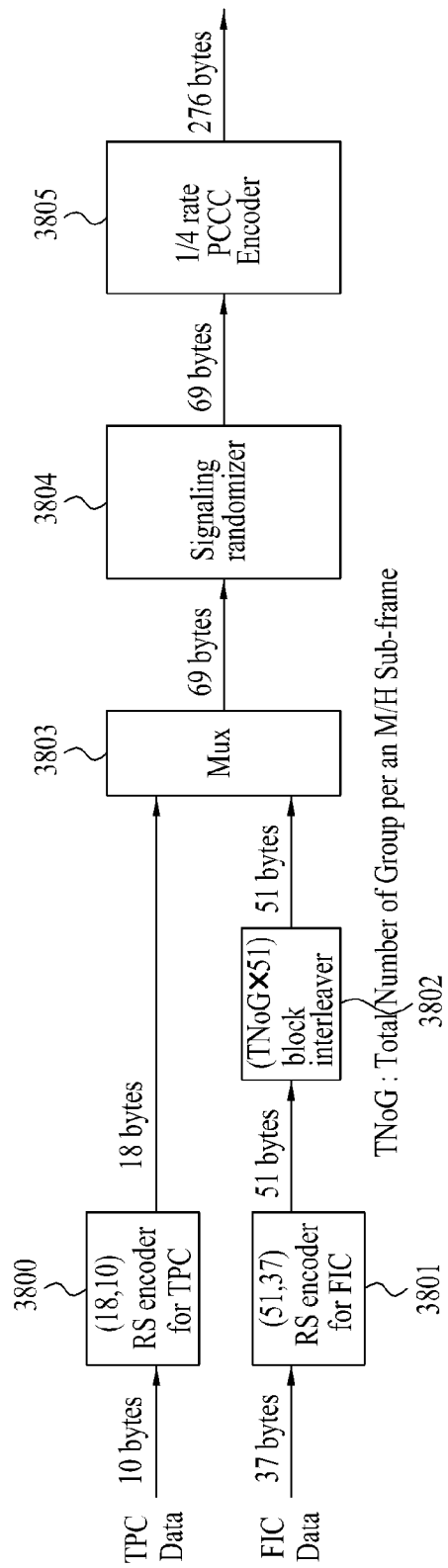
FIG. 38 is a block diagram illustrating a structure of the signaling encoder 114 according to the present invention.

FIG. 38 is a block diagram illustrating a structure of the signaling encoder 114 according to the present invention.

In an embodiment of the present invention, a signaling information area, into which signaling information is to be inserted, is allocated to a specific area in each group. The signaling information to be inserted into the signaling information area is FEC encoded through a signaling encoder 304 and is then input to the group formatter 113.

The signaling information may be mainly divided into data of two types of signaling channels. One of the two channels is a Transmission Parameter Channel (TPC) and the other is a Fast Information Channel (FIC).

The TPC data is signaling information including transmission parameters such as RS frame information, RS encoding information, FIC information, group information, SCCC information, and M/H frame information. This TPC data is simply an embodiment for better understanding of the present invention and signaling information items included in the TPC data may be easily changed through signaling information item addition or removal by those skilled in the art and thus the present invention is not limited to this embodiment.

The FIC data is provided to enable fast service acquisition at the receiver and includes cross layer information between a physical layer and an upper layer.

In the present invention, the signaling encoder 114 may include a TPC encoder 3800, an FIC encoder 3801, a block interleaver 3802, a multiplexer 3803, a signaling randomizer 3804, and a ¼ rate PCCC encoder 3805.

The TPC encoder 3800 receives 10-byte TPC data and performs (18, 10)-RS encoding to add 8-byte parity data to the 10-byte TPC data. The RS-encoded 18-byte TPC data is output to the multiplexer 3803.

The FIC encoder 3801 receives 37-byte FIC data and performs (51, 37)-RS encoding to add 14-byte parity data to the 37-byte FIC data. The RS-encoded 51-byte FIC data is input to the block interleaver 3802. The block interleaver 3802 interleaves the input FIC data in preset block units. For example, the block interleaver 3802 is a variable-length block interleaver which interleaves input RS-encoded FIC data in each subframe in units of TNoG (column)×51 (row) blocks and then outputs the resulting data to the multiplexer 3803. Here, TNoG is the total number of groups allocated to one subframe. The block interleaver 3802 is synchronized with first FIC data of each subframe.

The Block interleaver (3802) shall write the incoming RS codewords of 51 bytes row-by-row from left to right and top-to-bottom and shall output the data in units of 51 bytes by reading column by column from top-to-bottom and left-to-right.

The multiplexer 3803 multiplexes the RS-encoded TPC data from the TPC encoder 561 and the block-interleaved FIC data from the block interleaver 3802 in the time domain and outputs the multiplexed 69-byte data to the signaling randomizer 3804.

The signaling randomizer 3804 randomizes and outputs the multiplexed data to the ¼ PCCC encoder 3805. Here, the signaling randomizer 3084 may use the same polynomial equations as those used for randomization of mobile service data. In addition, initialization is performed for each group.

A ¼ rate PCCC (Parallel Concatenated Convolutional Code) Encoder (3805) shall have six identical even component encoders and six identical odd component encoders.

On the other hand, to allow the receiving system to receive and process an overlay parade, it is necessary to transmit signaling information associated with the overlay parade to the receiving system. In an embodiment of the present invention, a partial area of the field synchronization area is allocated to a signaling channel (specifically, Field Sync Signaling Channel (FSSC)) for the overlay parade and signaling information of the overlay parade is inserted into the signaling channel to be transmitted. In an embodiment of the present invention, 32 symbols (i.e., 64 bits) among the last 104 symbols of the field sync segment are allocated to the signaling channel for the overlay parade. Here, signaling information of the primary parade and the secondary parade may be inserted into the TPC data to be transmitted.

FIG. 39 illustrates a syntax structure of a TPC data field for signaling digital broadcast data according to an embodiment of the present invention.

The TPC data may include a sub-frame_number field, a slot_number field, a parade_id field, a starting_group_number (SGN) field, a number_of_groups (NoG) field, a parade_repetition_cycle (PRC) field, an RS_frame_mode field, an RS_code_mode_primary field, an RS_code_mode_secondary field, an SCCC_block_mode field, an SCCC_outer_code_mode_A field, an SCCC_outer_code_mode B field, an SCCC_outer_code_mode_C field, an SCCC_outer_code_mode_D field, an FIC_version field, a parade_continuity_counter field, a TNoG field and a TPC_protocol_version field.

The Sub-Frame_number field shall be the current Sub-Frame number within the Transmission frame, which is transmitted for Transmission frame synchronization. Its value shall range from 0 to 4.

The Slot_number field is the current Slot number within the Sub-Frame, which is transmitted for Transmission frame synchronization. Its value shall range from 0 to 15.

The Parade_id field identifies the Parade to which this Group belongs. The value of this field may be any 7-bit value. Each Parade in a DATA transmission shall have a unique Parade_id. Communication of the Parade_id between the physical layer and the management layer shall be by means of an Ensemble_id formed by adding one bit to the left of the Parade_id. If the Ensemble_id is for the primary Ensemble delivered through this Parade, the added MSB shall be '0'. Otherwise, if it is for the secondary Ensemble, the added MSB shall be '1'.

The starting_Group_number (SGN) field shall be the first Slot_number for a Parade to which this Group belongs.

The number_of_Groups (NoG) field shall be the number of Groups in a Sub-Frame assigned to the Parade to which this Group belongs, minus 1, e.g., NoG=0 implies that one Group is allocated to this Parade in a Sub-Frame.

The Parade_repetition_cycle (PRC) field shall be the cycle time over which the Parade is transmitted, minus 1, specified in units of Transmission frames.

The RS_Frame_mode field represents that one parade transmits one RS frame or two RS frames.

The RS_code_mode_primary field shall be the RS code mode for the primary RS frame.

The RS_code_mode_secondary field shall be the RS code mode for the secondary RS frame.

The SCCC_Block_mode field represents how DATA blocks within a group are assigned to SCCC block.

The SCCC_outer_code_mode_A field corresponds to the SCCC outer code mode for Region A within a group.

The SCCC_outer_code_mode_B field corresponds to the SCCC outer code mode for Region B within the group.

The SCCC_outer_code_mode_C field corresponds be the SCCC outer code mode for Region C within the group.

The SCCC_outer_code_mode_D field corresponds to the SCCC outer code mode for Region D within the group.

The FIC_version field represents a version of FIC data.

The Parade_continuity_counter field counter may increase from 0 to 15 and then repeat its cycle. This counter shall increment by 1 every (PRC+1) Transmission frames. For example, as shown in Table 12, PRC=011 (decimal 3) implies that Parade_continuity_counter increases every fourth Transmission frame.

The TNoG field may be identical for all sub-frames in a Transmission frame.

The tpc_protocol_version field is a 5-bit unsigned integer field that represents the version of the structure of the TPC syntax.

TPC data according to the present invention may be extended such that it includes mobile service data of the E region. In this case, a version of the TPC syntax structure indicated by a 'tpc_protocol_version' field may be changed to another version.

TPC data is information for signaling. In the case where the E region is allocated to a transmission area of mobile service data in the group, the TPC data may further include associated information indicating the above case. One embodiment of the present invention assumes that scalable mode information is contained in TPC data. That is, scalable information indicating an M value from among information of (118+M) mobile service data packets is contained in the TPC data, such that the reception end can receive information about the group structure. For example, if the scalable mode is set to '000', M may be '11'. If the scalable mode is set to '001', M may be '20'. If the scalable mode is set to '010', M may be '29'. If the scalable mode is set to '011', M may be '38'. If the scalable mode is set to '111', M may be '38' in all groups transmitted during 16 slot in a sub frame.

In accordance with still another embodiment of the present invention, scalable mode information contained in TPC data may be classified into scalable mode information of a current frame and scalable mode information of the next frame. That is, TPC data contained in the current frame provides the possibility of estimating data to be received in the reception end through the next frame's scalable mode information, such that the receiver acting as the reception end can stably receive data.

However, the information included in the TPC data presented herein is merely exemplary. And, since the adding or deleting of information included in the TPC may be easily adjusted and modified by one skilled in the art, the present invention will, therefore, not be limited to the examples set forth herein.

FIG. 40 illustrates an embodiment of a bitstream syntax structure of signaling overlay data sig_overlay_data( ) for overlay parade related signaling information according to the present invention.

Figure 40A:
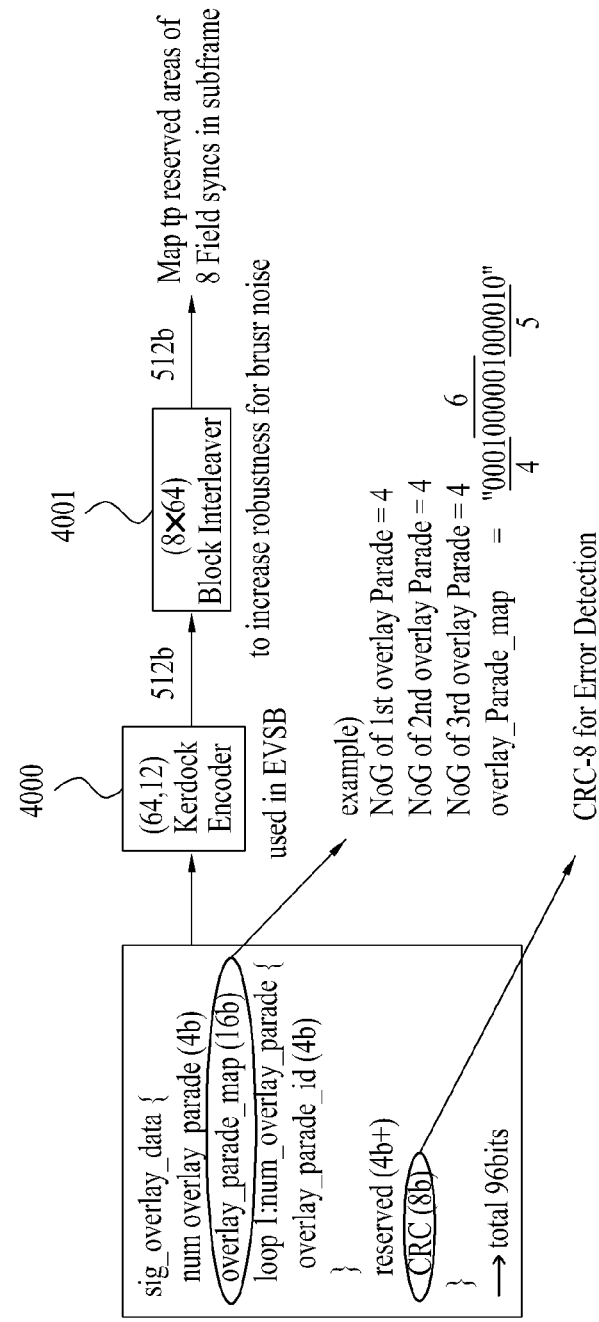
FIGS. 40A and 40B illustrate an embodiment of a bitstream syntax structure of signaling overlay data sig_overlay_data( ) for overlay parade related signaling information according to the present invention.

Signaling overlay data sig_overlay_data( ) shown in FIG. 40A provides signaling information of all overlay parades transmitted through one subframe.

A (4-bit) num_overlay_parade field in the signaling overlay data sig_overlay_data( ) indicates the number of overlay parades transmitted through one subframe.

A (16-bit) overlay_parade map field indicates the NOG of each overlay parade transmitted through the subframe. In an embodiment of the present invention, one of the 16 bits, which corresponds to the NOG of a corresponding overlay parade, is set to "1" to indicate the NOG of the overlay parade.

For example, let us assume that the num_overlay_parade field value is 3, i.e., that 3 overlay parades are transmitted through the subframe. In addition, let us assume that the NOG of the first overlay parade is 4, the NOG of the second overlay parade is 6, and the NOG of the third overlay parade is 5. In this case, the fourth of the 16 bits of the overlay_parade_map field is set to "1", the sixth bit, counted from the fourth bit, is set to "1", and the fifth bit, counted from the sixth bit, is set to "1" and the overlay_parade_map field is then inserted into an FSSC of a corresponding field synchronization segment. That is, when the overlay_parade_map field value is "0001000001000010", the receiving system can determine that the NOG of the first overlay parade is 4, the NOG of the second overlay parade is 6, and the NOG of the third overlay parade is 5. In another example, the overlay_parade_map field value is "01001000010000" when the NOG of the first overlay parade is 2, the NOG of the second overlay parade is 3, and the NOG of the third overlay parade is 5.

The loop is performed a number of times corresponding to the num_overlay_parade field value to provide an identifier for each overlay parade. For example, when the num_overlay_parade field value is 3, the loop is repeated 3 times to provide three overlay parade identifiers. To accomplish this, the loop includes a (16-bit) overlay_parade_id field.

Then, an 8-bit CRC code for error correction is inserted.

Here, if the signaling information of the overlay parade signaled through the signaling overlay data sig_overlay_data( ) is less than 96 bits, a reserved field is used to increase the signaling information to 96 bits.

Figure 40B:
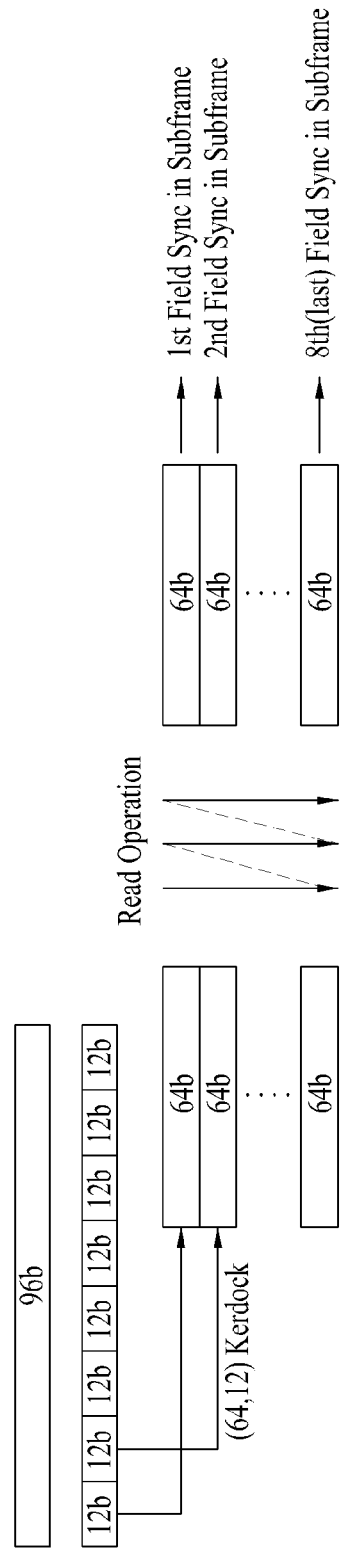

As shown in FIG. 40B, the 96 bits are divided into 12-bit units which are then input to a (64, 12) Kerdock encoder 4000. The (64, 12) Kerdock encoder 4000 encodes 12 input bits using a Kerdock coding algorithm to create 64 bits and outputs the 64 bits to an (8×64) block interleaver 4001.

The block interleaver 4001 is a variable-length block interleaver that interleaves overlay parade signaling data, which has been Kerdock encoded and then has been input in units of 64 bits, in units of 8×64 blocks as shown in FIG. 40.

The block interleaver 4001 writes the 64-bit overlay parade signaling data in a left to right direction and then in a downward direction on a row by row basis and reads the overlay parade signaling data in a downward direction and then in a left to right direction on a column by column basis and outputs the read overlay parade signaling in units of 64 bits.

That is, as shown in FIG. 40A, the provided 96-bit overlay parade signaling information is converted into 512 bits via the Kerdock encoder 4000 and the block interleaver 4001. In an embodiment of the present invention, the 512-bit overlay parade signaling information is divided into eight 64-bit units and the eight 64-bit units are then sequentially inserted into eight field Syncs in a corresponding subframe as shown in FIG. 40B.

On the other hand, in an embodiment of the present invention, 2 bits of the TPC data are used to indicate whether or not an overlay parade is present and version information of the overlay parade. In the present invention, the 2 bits are referred to as an "overlay_group_status_field".

That is, since the overlay parade configuration may vary in each M/H frame, the overlay_group_status field indicates whether an overlay parade is present in the corresponding M/H frame. When an overlay parade is present, the overlay_group_status field also indicates version information of the overlay parade.

For example, when the overlay_group_status_field has a value of "00", this indicates that an overlay parade is not present in the corresponding M/H frame. In this case, the receiving system does not need to analyze field synchronization to obtain overlay parade signaling information. When the overlay_group_status_field has one of the values of "01", "10", and "11", this indicates that an overlay parade is present in the M/H frame. Here, let us assume that the overlay_group_status_field in the current M/H frame has a value of "01". Also, let us assume that the overlay parade configuration has changed in a next M/H frame. In this case, the overlay_group_status_field may be changed to "10" in the next M/H frame.

Figure 41:
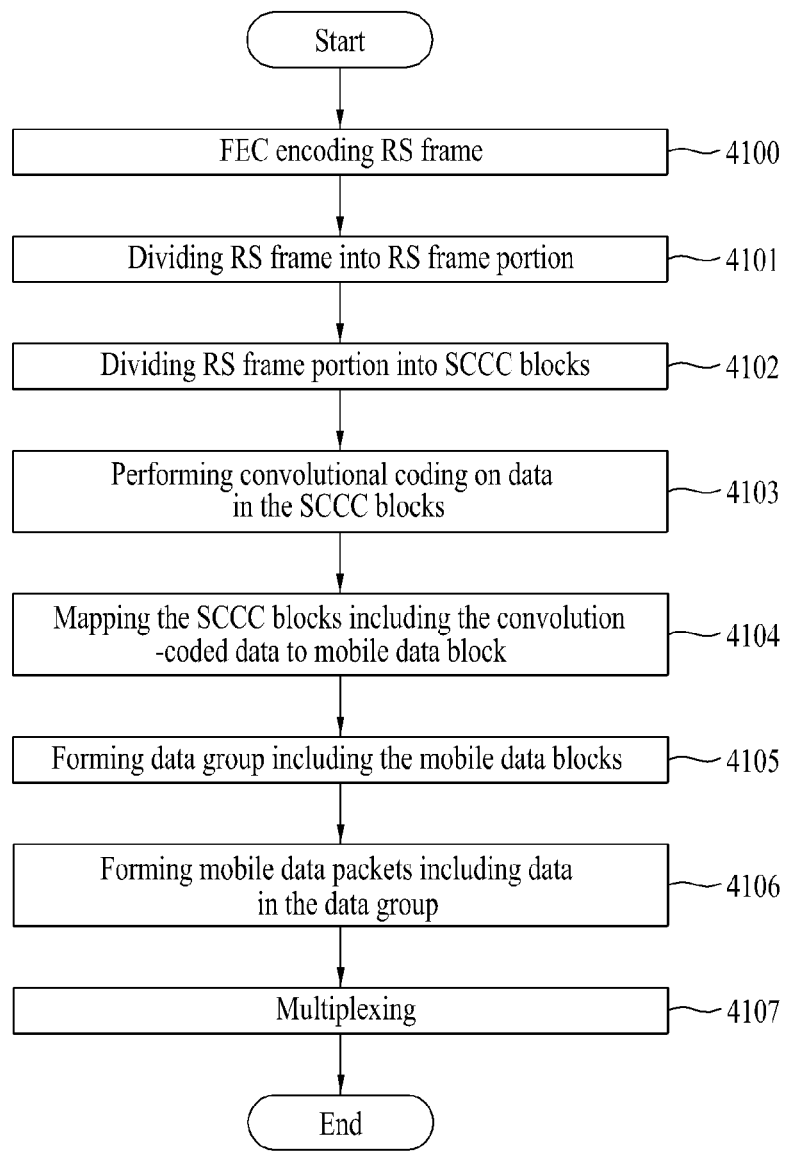
FIG. 41 is a flow chart illustrating an embodiment of a transmission method according to the present invention.
Figure 42:
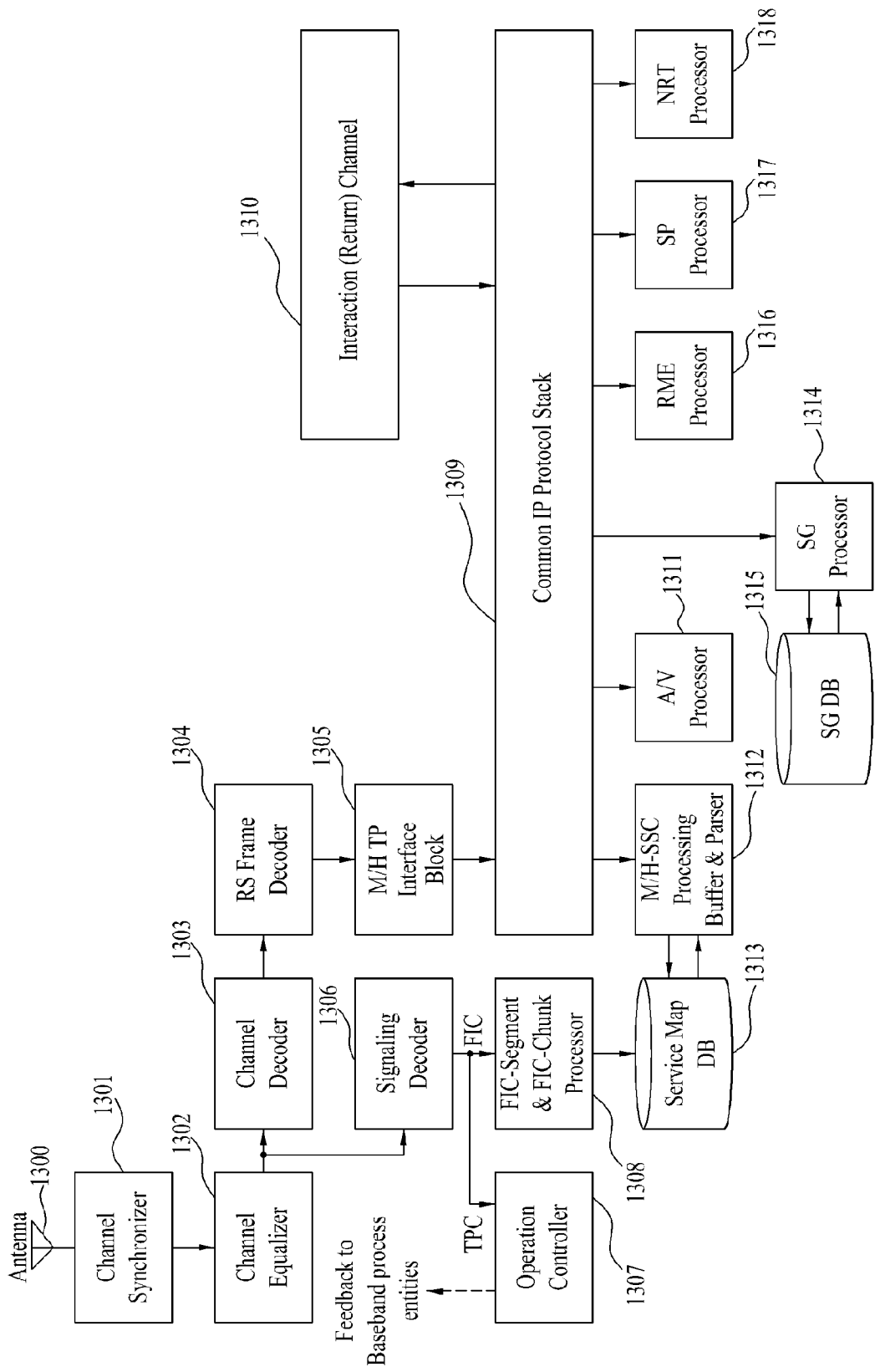
FIG. 42 is a block diagram illustrating a reception system according to an embodiment of the present invention.

FIG. 41 is a flow chart illustrating an embodiment of a transmission method according to the present invention.

The RS frame encoder 111 FEC-encodes an RS frame including mobile data (S4100) and divides the encoded RS frame into a plurality of RS frame portions (S4101). In this case, the RS frame may be one of a primary RS frame and a secondary RS frame having different FEC code rates and each of the primary RS frame and the secondary RS frame may be FEC-encoded independently and include independent RS frame portions.

The RS Frame portion to SCCC block converter 3600 included in the block processor 112 divides each of the RS Frame portions into a plurality of SCCC blocks (S4102). Then, the convolutional encoder 3602 performs convolutional coding on data included in each of the SCCC blocks (S4103). In this case, the code rate may be one of ½, ⅓, and ¼ and may be changed according to a region of a data group to be formed at a later time, through which the SCCC block is to be transmitted. In addition, the code rate may be applied independently or equally for each region of a data group and may be applied independently or equally for each SCCC block corresponding to the region of the data group.

The SCCC block to mobile data block converter 3605 maps a plurality of SCCC blocks including convolution-coded data to a mobile data block (S4104). In this case, one SCCC block may be mapped to one mobile data block and two SCCC blocks may be combined and mapped to one mobile data block.

The group formatter 113 forms a data group including a plurality of mobile data blocks (S4105). In an embodiment of the present invention, the data group includes a plurality of regions including the mobile data blocks.

The packet formatter 115 creates mobile data packets using data included in the data group (S4106). The mobile data packets include a specified number of mobile data packets and a first scalable number of mobile data packets. In an embodiment of the present invention, the specified number is 118 and the first scalable number is one of 11, 20, 29, and 38.

The packet Multiplexer 120 multiplexes mobile data packets and second scalable main data packets output from the packet formatter 115 (S4107). The sum of the first scalable number and the second scalable number is equal to a predetermined value which is 38 in an embodiment of the present invention.

Figure 43:
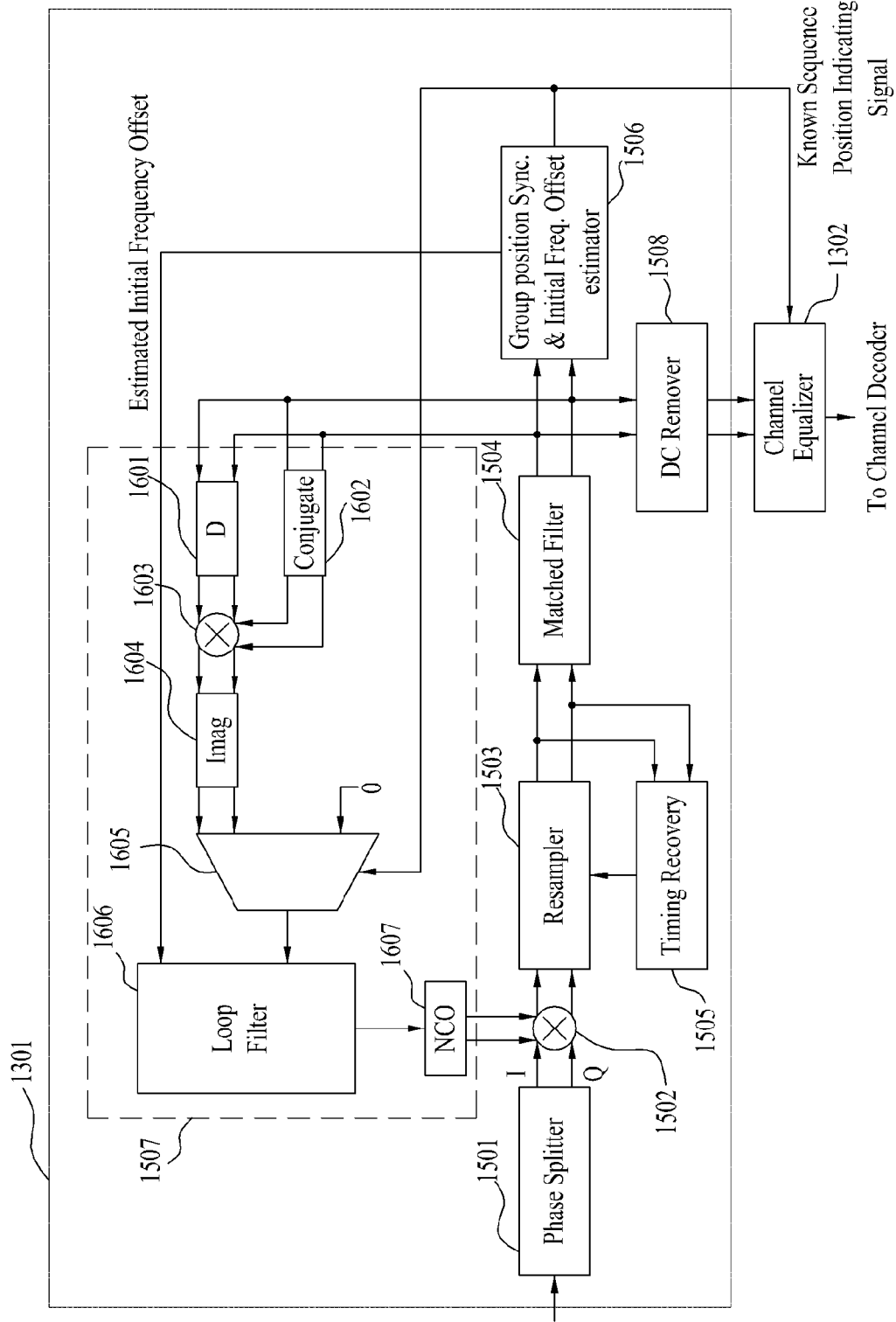
FIG. 43 is a detailed block diagram illustrating a demodulator contained in a channel synchronizer 1301 according to an embodiment of the present invention.

FIG. 43 illustrates a block view showing the structure of a receiving system according to an embodiment of the present invention. The receiving system of FIG. 43 includes an antenna 1300, a channel synchronizer 1301, a channel equalizer 1302, a channel decoder 1303, an RS frame decoder 1304, an M/H TP interface block 1305, a signaling decoder 1306, an operation controller 1307, an FIC processor 1308, a common IP protocol stack 1309, an interaction channel unit 1310, an A/V processor 1311, a service signaling channel (SCC) processor 1312, a first storage unit 1313, a service guide (SG) processor 1314, and a second storage unit 1315. The receiving system may further include a rich media environment (RME) processor 1316, a service protection (SP) processor 1317, and a non-real time (NRT) processor 1318. Also, the receiving system may further include a main service data processing unit. Herein, the main service data processing unit may include a data deinterleaver, an RS decoder, and a data derandomizer.

According to an embodiment of the present invention, the first storage unit 1313 corresponds to a service map database (DB), and the second storage unit 1315 corresponds to a service guide database (DB).

The channel synchronizer 1301 includes a tuner and a demodulator. The tuner tunes a frequency of a specific channel through the antenna 1300, so as to down-convert the tuned frequency to an intermediate frequency (IF) signal, thereby outputting the converted IF signal to the demodulator. Herein, the signal being outputted from the tuner corresponds to a passband digital IF signal.

The demodulator included in the channel synchronizer 1301 uses known data sequences included in a data group and transmitted from the transmitting system, so as to perform carrier wave recovery and timing recovery, thereby converting the inputted pass band digital signal to a baseband digital signal.

For example, among the known data sequences, the channel equalizer 1302 uses a 1st known data sequence, and 3rd to 6th known data sequences to compensate the distortion in a received signal caused by multi path or a Doppler effect. At this point, the channel equalizer 1302 may enhance the equalizing performance by being fed-back with the output of the channel decoder 1303.

The signaling decoder 1306 extracts signaling data (e.g., TPC data and FIC data) from the received signal and decodes the extracted signal data. The decoded TPC data are outputted to the operation controller 1307, and the decoded FIC data are outputted to the FIC processor 1308. According to an embodiment of the present invention, the signaling decoder 1306 performs signaling decoding as an inverse process of the signaling encoder, so as to extract the TPC data and the FIC data from the received signal. For example, the signaling decoder 1306 performs a parallel concatenated convolution code (PCCC) type regressive turbo decoding process on the data corresponding to the signaling information region within the inputted data. Then, the signaling decoder 1306 derandomizes the turbo-decoded signaling data, thereby separating the TPC data and the FIC data from the derandomized signaling data. Additionally, the signaling decoder 1306 performs RS-decoding on the separated TPC data as an inverse process of the transmitting system, thereby outputting the RS-decoded TPC data to the operation controller 1307.

Herein, the TPC data may include RS frame information, SCCC information, M/H frame information, and so on. The RS frame information may include RS frame mode information and RS code mode information. The SCCC information may include SCCC block mode information and SCCC outer code mode information. The M/H frame information may include index information. And, the TPC data may include subframe count information, slot count information, parade_id information, SGN information, NOG information, and so on.

Thereafter, the signaling decoder 1306 performs deinterleaving on the separated FIC data in subframe units and performs RS decoding on the deinterleaved data as an inverse process of the transmitting system, thereby outputting the RS-decoded data to the FIC processor 1308. The transmission unit of the FIC data being deinterleaved and RS-decoded by the signaling decoder 1306 and outputted to the FIC processor 1308 corresponds to FIC segments.

The channel decoder 1303, which is also referred to as a block decoder, performs forward error correction in order to recover meaningful data (e.g., mobile service data) from the received signal. According to an embodiment of the present invention, in order to do so, the channel decoder 1303 uses SCCC-related information (e.g., SCCC block information, SCCC outer code mode information, and so on) included in the signaling data. According to the embodiment of the present invention, if the data being channel-equalized and inputted from the channel equalizer 1302 correspond to data processed with both serial concatenated convolution code (SCCC) type block-encoding and trellis-encoding (i.e., data within the RS frame, signaling data) by the transmitting system, the channel decoder 1303 performs trellis-decoding and block-decoding on the corresponding data as an inverse process of the transmitting system. Alternatively, if the data being channel-equalized and inputted from the channel equalizer 1302 correspond to data processed only with trellis-encoding and not with block-encoding (i.e., main service data), the channel decoder 1303 performs only trellis-decoding on the corresponding data.

By performing RS-CRC decoding on the received data, the RS frame decoder 1304 recovers the RS frame. More specifically, the RS frame decoder 1304 performs forward error correction in order to recover the RS frame. In order to do so, according to an embodiment of the present invention, the RS frame decoder 1304 uses RS-associated information (e.g., RS code mode) among the signaling data.

The M/H TP interface block 1305 extracts M/H TP packets from the RS frame, so as to recover the IP datagram, thereby outputting the recovered IP datagram to the common IP protocol stack 1309. Herein, the M/H TP packets encapsulate the IP datagram. More specifically, the header of each M/H TP packet is analyzed so as to recover the IP datagram from the payload of the corresponding M/H TP packet.

The operation controller 1307 uses the decoded TPC data structure so as to control the operations of various baseband processes. More specifically, the operation controller 1307 receives the TPC data and delivers information, such as M/H frame timing information, information on whether or not a data group exists in a selected parade, position information of known data within the data group, and power control information, to block requiring the respective information.

The FIC processor 1308 collects (or gathers) FIC segments to recover an FIC chunk and stores the recovered FIC chunk in the first storage unit 1313. The FIC chunk includes signaling information required in an ensemble selection process and a mobile (or M/H) service scanning process.

The service signaling channel processor 1312 extracts service signaling channel table sections from the designated IP multicast streams and stores the extracted service signaling channel table sections in the first storage unit 1313. The service signaling channel includes IP level signaling information, which is required for M/H service selection and scanning processes. Herein, the service signaling channel according to the present invention transmits at least one of an SMT, a GAT, an RRT, a CIT, and an SLT. At this point, according to embodiment of the present invention, the access information of the IP datagram transmitting the service signaling channel corresponds to a well-known destination IP address and a well-known destination UDP port number. Therefore, the service signaling channel processor 1312 has a well-known destination IP address and a well-known destination UDP port number, thereby being capable of extracting the IP stream transmitting the service signaling channel, i.e., service signaling data. Then, at least one of the SMT, the GAT, the RRT, the CIT, and the SLT extracted from the service signaling data is recovered and stored in the first storage unit 1313. For example, the first storage unit 1313 stores a service map configured from signaling information collected the FIC processor 1308 and the service signaling channel processor 1312.

The A/V processor 1311 receives the IP datagram from the common IP protocol stack 1309. Then, the A/V processor 1311 separates the audio data and the video data from the received IP datagram and decoded each of the audio data and the video data with a respective decoding algorithm, thereby displaying the decoded data to the screen. For example, at least one of an AC-3 decoding algorithm, an MPEG 2 audio decoding algorithm, an MPEG 4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm may be applied be used as the audio decoding algorithm, and at least one of an MPEG 2 video decoding algorithm, an MPEG 4 video decoding algorithm, an H.264 decoding algorithm, an SVC decoding algorithm, and a VC-1 decoding algorithm may be applied as the video decoding algorithm.

The SG processor 1314 recovers announcement data and stores the recovered announcement data to the second storage unit 1315, thereby providing a service guide to the viewer.

The interaction (or return) channel unit 1310 provides an uplink from the receiving system through the common IP protocol stack 1309. At this point, the interaction channel should be IP-compatible.

The RME processor 1316 receives an M/H broadcast program or RME data through the common IP protocol stack 1309, the RME data being delivered through the interaction channel. Then, the received M/H broadcast program or RME data are recovered and then processed.

The SP processor 1317 recovers and processes data associated with service protection, which are received through the common IP protocol stack 1309. Then, the SP processor 1317 provides protection to the M/H service depending upon the subscription state of the viewer (or user).

The NRT processor 1318 recovers and processes non-real time data, such as file application.

FIG. 43 illustrates a detailed block view of a demodulator included in the channel synchronizer 1301 according to an embodiment of the present invention.

The channel synchronizer 1301 of FIG. 43 may include a phase splitter 1501, a first multiplier 1502, a resampler 1503, a Matched Filter 1504, a Timing Recovery block 1505, a Group Position Synchronization & Initial Frequency offset estimator 1506, a Carrier Recovery block 1507, and a DC remover 1508. According to an embodiment of the present invention, an analog-to-digital converter (not shown) converting a passband analog signal to a passband digital signal may be provided at the front end of the phase splitter 1501. Also, according to an embodiment of the present invention, an automatic gain control (AGC) is performed before carrier recovery and timing recovery.

The carrier recovery block 1507 includes a delay unit 1601, a second multiplier 1603, a carrier frequency offset detector 1604, a multiplexer 1605, a loop filter 1606, and Numerically Controlled Oscillator (NCO) 1607.

Also referring to FIG. 23, the phase splitter 1501 receives a pass band digital signal and splits the received signal into a pass band digital signal of a real number element and a pass band digital signal of an imaginary number element both having a phase of 90 degrees between one another. In other words, the pass band digital signal is split into complex signals. The split portions of the pass band digital signal are then outputted to the first multiplier 1502. Herein, the real number signal outputted from the phase splitter 1501 will be referred to as an 'I' signal, and the imaginary number signal outputted from the phase splitter 1501 will be referred to as a 'Q' signal, for simplicity of the description of the present invention.

It is assumed that the signal being outputted from the tuner of the present invention is an intermediate frequency (IF) of 44 MHz. According to another embodiment of the present invention, the signal being outputted from the tuner may also be a zero IF signal (i.e., complex baseband signal). In this case, the zero IF signal is inputted to the first multiplier 1502 bypassing the phase splitter 1501.

The first multiplier 1502 multiplies the I and Q pass band digital signals, which are outputted from the phase splitter 1501, by a digital complex signal outputted from the NCO 1607 of the carrier recovery block 1507, thereby down-converting the I and Q passband digital signals to baseband digital complex signals. At this point, by multiplying the carrier frequency offset being outputted from the carrier recovery block 1507 by the output of the phase splitter 1501, the carrier frequency offset included in the output signal of the phase splitter 1501 is compensated. Thereafter, the baseband digital signals of the first multiplier 1502 are inputted to the resampler 1503.

The resampler 1503 multiplies the signals outputted from the first multiplier 1502 by a sampling clock provided by the timing recovery block 1505, so as to compensate symbol timing errors, thereby outputting the compensated signals to the matched filter 1504 and the timing recovery block 1505.

The matched filter 1504 performs matched filtering on the output signals of the resampler 1503, thereby outputting the signals processed with matched filtering to the Group Position Synchronization & Initial Frequency offset estimator 1506, the Carrier Recovery block 1507, and the DC remover 1508.

The Group Position Synchronization & Initial Frequency offset estimator 1506 detects the place (or position) of the known data sequences that are included in the data group and received. Simultaneously, the Group Position Synchronization & Initial Frequency offset estimator 1506 estimates an initial frequency offset during the known data detection process. In this case, the carrier recovery block 1507 may use the known data sequence position information and initial frequency offset value to estimate the carrier frequency offset with more accuracy, thereby performing compensation. Also, the Group Position Synchronization & Initial Frequency offset estimator 1506 performs group position synchronization. More specifically, the Group Position Synchronization & Initial Frequency offset estimator 1506 extracts the starting position of each data group.

For example, the Group Position Synchronization & Initial Frequency offset estimator 1506 detects the position (or place) of the known data sequence included in the data group. Then, the Group Position Synchronization & Initial Frequency offset estimator 1506 outputs the detected known sequence position indicating signal to the multiplexer 1604 and the channel equalizer 1302 of the carrier recovery block 1507. Furthermore, the Group Position Synchronization & Initial Frequency offset estimator 1506 estimates the initial frequency offset by using the second known data sequence within the data group, which is then outputted to the loop filter 1606 of the carrier recovery block 1507.

The timing recovery block 1505 receives the output of the resampler 1503 so as to detect the timing error. Then, the timing recovery block 1505 outputs a sampling clock being in proportion with the detected timing error to the resampler 1503, thereby controlling the sampling of the resampler 1503.

The DC remover 1508 removes a pilot tone signal (i.e., DC signal), which has been inserted by the transmitting system, from the matched-filtered signal outputted from the matched filter 1504. Thereafter, the DC remover 1508 outputs the processed signal to the channel equalizer 1302.

According to an embodiment of the present invention, among the known data sequences included in the data group, a correlation of repeated known data patterns of a second known data sequence is used to detect the position of a known data sequence within the data group and to estimate an initial frequency offset. Particularly, according to an embodiment of the present invention, a partial correlation is used to detect the position of a known data sequence and to estimate an initial frequency offset.

The initial frequency offset includes a rough frequency offset and a finer frequency offset. More specifically, when acquiring carrier frequency acquisition, at first a rough frequency offset is used to reduce a frequency pull-in range, and, then, a finer frequency offset is used to reduce the frequency pull-in range once again.

In the present invention, the second known data sequence within the data group is configured of a first 528 symbol sequence and a second 528 symbol sequence each having the same pattern. More specifically, the 528 pattern is repeated after a data segment synchronization signal of 4 symbols.

In the description of the present invention, the second known data sequence will be referred to as an acquisition training sequence.

The Group Position Synchronization & Initial Frequency offset estimator (or known sequence detector) 1506 uses the repeated known data pattern of the second known data sequence, so as to perform group position synchronization and initial frequency offset estimation. For example, a correlation between the received signal and a second known data sequence, which is pre-known based upon an agreement between the transmitting system and the receiving system, and by finding a maximum correlation value, the group position synchronization may be performed. However, if a frequency offset exists in the received signal, the reliability of a general correlation method, wherein an entire second known data sequence is used to obtain one correlation value, may be degraded. More specifically, as the length of a known data pattern for correlation becomes longer, the possibility of the reliability of a correlation peak value being degraded may increase.

Therefore, according to an embodiment of the present invention, a partial correlation method is used to detect a highly reliable correlation peak value, even when a large frequency offset exists. More specifically, by using the partial correlation method, noise may be reduced.

AS described above, in the present invention, by obtaining a partial correlation by dividing (or segmenting) the second known data sequence into two or more parts, a peak value among the correlation value for each part may be obtained. Then, all of the peak correlation values for each part are added so as to calculate the average (or mean) value. Accordingly, the noise included in the received signal is cancelled, thereby reducing the noise.

In order to do so, the second known data sequence is segmented (or divided) into multiple parts, and a correlation between the known data sequence of each part (i.e., reference known data sequence of a corresponding part generated from the receiving system) and the receiving signal is calculated (or obtained) for each part. Thereafter, the partial correlation values obtained for each part are all added. At this point, each of the correlation values obtained for each part corresponds to a squared value (i.e., a magnitude square) having no phase information.

(a) of FIG. 44 shows an example of each part being configured of N number of symbols, when the second known data symbol sequence is divided (or segmented) into L number of parts. More specifically, in (a) of FIG. 44, L represents a number of parts being segmented from the second known data symbol sequence, and N represents the length of each part. Also, * signifies a complex conjugate. In other words, a second known data sequence is divided into L number of parts each having the length of N symbols. Thereafter, the correlation with the received signal is obtained for each part.

(b) of FIG. 44 illustrates a conceptual view of a partial correlator according to an embodiment of the present invention. Herein, the partial correlator consists of a multiplier 1701 shifting known data sequences of each corresponding part to the received signal so as to perform complex conjugate multiplication, a first accumulator 1702 accumulating the output of the multiplier 1701 for a period of N symbols, a squarer 1703 calculating a squared value of the output of the first accumulator 1702, and a second accumulator 1704 accumulating the output of the squarer 1703 for a predetermined period of time, thereby calculating an average (or mean) correlation value.

More specifically, the multiplier 1701 shifts the known data sequence of a corresponding part in accordance with the received signal so as to perform complex conjugate multiplication, thereby outputting the multiplied values to the first accumulator 1702. The first accumulator 1702 accumulates the output of the multiplier 1701 for a period of N symbols, thereby outputting the accumulated value to the squarer 1703. The output of the first accumulator 1702 corresponds to correlation values each having a phase and size. The squarer 1703 calculates the squared value of the output of the first accumulator 1702, thereby obtaining the size of the correlation value. The second accumulator 1704 accumulates the outputs of the squarer 1703 during L sections. Then, the second accumulator 1704 divides the accumulated value by L, so as to output the average correlation value of the corresponding part. Equation 2 shown below corresponds to (b) of FIG. 44 recapitulated in the form of an equation 2.

$$y[k] = 1/L \sum_{i=0}^{L} |z[k+Ni]|^2 \qquad \text{Equation 2}$$

More specifically, by finding a maximum correlation value during a data group period, the Group Position Synchronization & Initial Frequency offset estimator 1506 decides a group synchronization position and a known data sequence position. Also, by suing the partial correlation method, the known sequence detector estimates the initial frequency offset.

Figure 45:
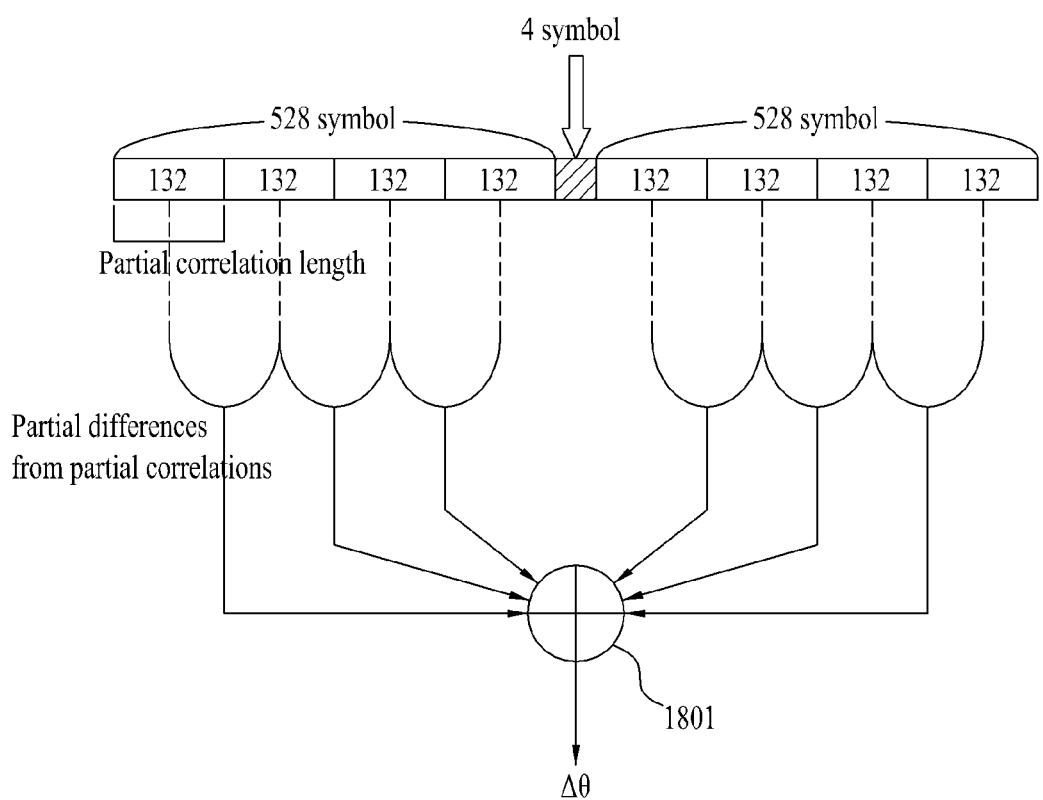
FIG. 45 is a conceptual diagram illustrating a method for roughly estimating an initial frequency offset by dividing a second known data sequence into 8 parts and calculating partial correlation of the 8 parts according to an embodiment of the present invention.

FIG. 45 illustrates an example of estimating a rough initial frequency offset by obtaining partial correlation by dividing (or segmenting) a second known data sequence into 8 parts. When applying this example to FIG. 44, L is equal to 8, and N is equal to 132 symbols. In case of FIG. 25, 8 partial correlators are required to be provided, and 8 peak correlation values may be obtained accordingly.

In this case, at a maximum correlation position, the Group Position Synchronization & Initial Frequency offset estimator 1506 calculates a phase difference between the correlation values of each of the successive parts. Then, the Group Position Synchronization & Initial Frequency offset estimator 1506 uses an adder 1801 to add all of the phase differences for each part, thereby outputting an average phase difference $\Delta\theta$. Subsequently, by using the average phase difference $\Delta\theta$ and the length (N) of each part, the known sequence detector may calculate $\omega_0$ as shown in Equation 3 below.

$$\omega_0 = \frac{\Delta\theta}{N} \qquad \text{Equation 3}$$

Herein, $\omega_0 = 2\pi f_0$
f0: Normalized frequency offset
$\Delta\theta$: Average phase difference)
N: Length of each part According to an embodiment of the present invention, in Equation 3, N is equal to 132.

At this point, the rough (or coarse) frequency offset f0 obtained from $\omega_0$ by applying Equation 3 provides a frequency pull-in range of ±80 kHz. A trade-off exists between the frequency pull-in range and a variance of an estimated error associated to a length of the part. More specifically, if the length of a known data pattern for the correlation is short, the frequency pull-in range increases, and the jitter also increases accordingly. On the other hand, if the length of a known data pattern for the correlation is long, the frequency pull-in range decreases, and the jitter also decreases accordingly.

Meanwhile, according to an embodiment of the present invention, a finer frequency offset is estimated by using repeated patterns of the second known data sequence. The second known data sequence is configured of two parts. More specifically, the second known data sequence is configured of a part including a first 528 symbol sequence and another part including a second 528 symbol sequence. Herein, a data segment synchronization signal of 4 symbols exists between the first 528 symbol sequence and the second 528 symbol sequence. This structure allows the finer frequency offset to be estimated by using a Maximum-likelihood algorithm.

Figure 46:
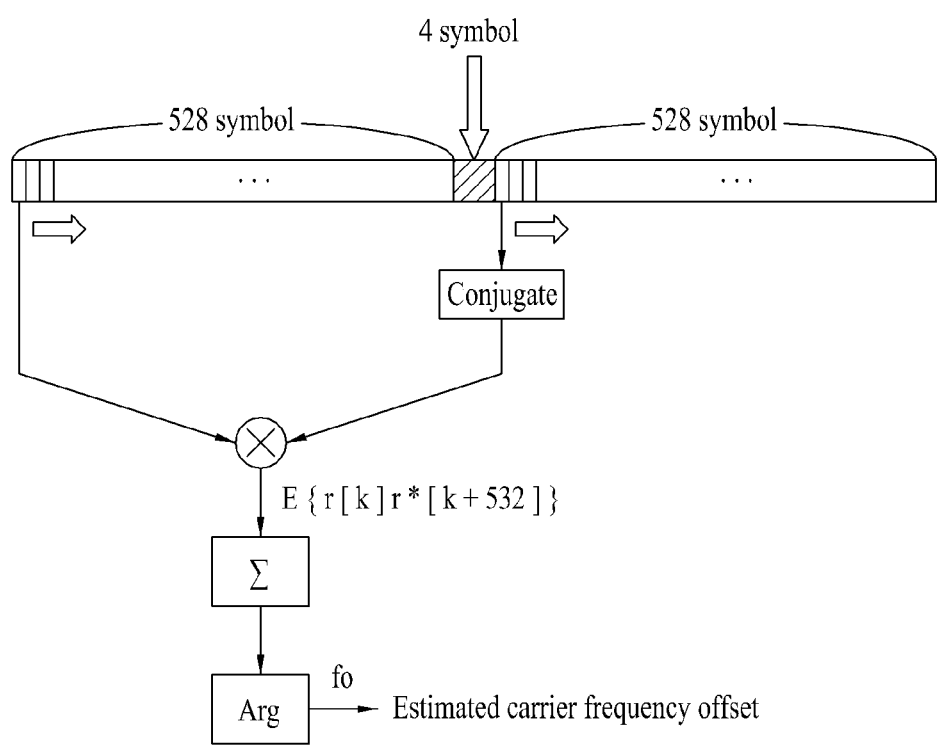
FIG. 46 is a conceptual diagram illustrating a method for precisely estimating a frequency offset using a maximum-likelihood algorithm according to an embodiment of the present invention.

FIG. 46 illustrates an example of estimating a finer frequency offset by using the Maximum-likelihood algorithm according to the present invention.

At this point, the received signal r[k] may be indicated as shown in Equation 4 below.

$$r[k] = x[k]e^{-j2\pi f_0 T_s k} + n[k] \qquad \text{Equation 4}$$

Herein, x[k]: transmitted signal
f0: frequency offset
Ts: symbol duration
n[k]: noise In Equation 4, f0 corresponds to the finer frequency offset.

Also, the correlation between the received signals separated by 532(=528+4) symbols may be obtained (or calculated) by using Equation 5 below.

$$E\{r[k]r^*[k+532]\} = E\{(x[k]e^{-j2\pi f_0 T_s k} + n[k])(x^*[k+532]e^{j2\pi f_0 T_s (k+532)} + n^*[k+532])\} \qquad \text{Equation 5}$$

$$= \sigma_s^2 e^{j2\pi f_0 T_s \cdot 532}$$

Where, $\sigma_s^2 : E\{|x[k]|^2\}$

More specifically, the partial correlation of the two parts spaced apart by 532 symbols (i.e., each part having the length of 532 symbols) is calculated and then the average value is calculated. Thereafter, after applying an argument, the finer frequency offset can be obtained. The finer frequency offset obtained by applying the Equation 5 provides a frequency pull-in range of ±10 kHz.

In the description of the present invention, the rough frequency offset and the finer frequency offset will be collectively referred to as an initial frequency offset. The initial frequency offset is outputted to the loop filter 1606 of the carrier recovery block 1507.

Meanwhile, according to an embodiment of the present invention, the carrier recovery block 1507 uses a carrier frequency tracking loop, as shown in FIG. 43.

The carrier recovery block 1507 loads an initial frequency offset estimated from the Group Position Synchronization & Initial Frequency offset estimator 1506. Then, the carrier recovery block 1507 tracks the remaining carrier frequency offset.

More specifically, the carrier recovery block 1507 uses a Maximum-likelihood to calculate the correlation of the received successive known data sequences, thereby estimating a carrier frequency offset (or error) using the same method that is used for the initial frequency offset estimation.

In order to do so, the delay unit 1601 of the carrier recovery block 1507 receives the data outputted from the matched filter 1504 in symbol units so as to perform a K symbol delay. Thereafter, the delay unit 1601 outputs the delayed data to the second multiplier 1603.

Also, the output data of the matched filter 1504 is conjugated by the conjugator 1602. Then, the conjugated data are inputted to the second multiplier 1603.

The second multiplier 1603 calculates the correlation value between the known data sequence delayed by K symbols by the delay unit 1601 and the known data sequence conjugated by the conjugator 1602. Thereafter, the second multiplier 1603 outputs the calculated correlation value to the carrier frequency offset detector 1604.

Herein, according to an embodiment of the present invention, K symbols is equal to 13312 symbols (=832*16 symbols). This is because the first known data sequence, and the third to sixth known data sequences are inserted and received at intervals of 16 segments, and also because one segment is configured of 832 symbols.

According to the embodiment of the present invention, the correlation value between the known data sequences spaced apart at an interval of 13312 symbols may be calculated by applying Equation 6 shown below.

$$E\{r[k]r^*[k+13312]\} = E\{(x[k]e^{-j2\pi f_0 T_s k} + n[k])(x^*[k+13312]e^{j2\pi f_0 T_s (k+13312)} + n^*[k+532])\}$$

$$= \sigma_s^2 e^{j2\pi f_0 T_s \cdot 13312}$$

Equation 6

Where, $\sigma_s^2$: $E\{|x[k]|^2\}$

Herein, x[k]: transmitted signal f0: carrier frequency offset

Ts: symbol duration n[k]: noise

In Equation 6, f0 corresponds to a carrier frequency offset for tracking

The carrier frequency offset detector 1604 extracts a carrier frequency offset from the correlation value outputted from the second multiplier 1603, as shown in Equation 6. Then, the extracted carrier frequency offset is outputted to the multiplexer 1605.

In accordance with the Known Sequence Position Indicating Signal from the Group Position Synchronization & Initial Frequency offset estimator 1506, the multiplexer 1605 selects an output of the carrier frequency offset detector 1604 or '0', which is then outputted as the final carrier frequency offset value.

More specifically, by using Known Sequence Position Indicating Signal, the validity of the carrier frequency offset value being outputted from the carrier frequency offset detector 1604 can be known. If the carrier frequency offset value is valid, the multiplexer 1605 selects the output of the carrier frequency offset detector 1604. And, if the carrier frequency offset value is not valid, the multiplexer 1605 selects '0'. Then, the multiplexer 1605 outputs the selection to the loop filter 1606.

The loop filter 1606 adds the output of the multiplexer 1605 to the estimated initial frequency offset, so as to perform baseband pass-filtering. Thereafter, the filtered data are outputted to the NCO 1607.

The NCO 1607 generates a complex signal corresponding to a baseband pass-filtered carrier frequency offset, thereby outputting the generated complex signal to the first multiplier 1502.

Meanwhile, according to an embodiment of the present invention, by turning the power on only in particular slots, i.e., slots having the data groups of a parade allocated thereto, wherein the parade includes a mobile service requested to be received, the channel synchronizer 1301 may reduce power consumption in the receiving system. For this, the receiving system may further include a power controller (not shown), which controls the power supply of the demodulator.

The data demodulated by the channel synchronizer 1301 using the known data are inputted to the channel equalizer 1302. Also, the demodulated data may be inputted to the known sequence detector 1506.

At this point, a data group that is inputted for the equalization process may be divided into region A to region D, as shown in FIG. 5. More specifically, according to the embodiment of the present invention, region A includes M/H block B4 to M/H block B7, region B includes M/H block B3 and M/H block B8, region C includes M/H block B2 and M/H block B9, and region D includes M/H block B1 and M/H block B10. In other words, one data group is divided into M/H blocks from B1 to B10, each M/H block having the length of 16 segments. Also, a long training sequence (i.e., known data sequence) is inserted at the starting portion of the M/H blocks B4 to B8. Furthermore, two data groups may be allocated (or assigned) to one VSB field. In this case, field synchronization data are positioned in the 37$^{th}$ segment of one of the two data groups.

The present invention may use known data, which have position and content information based upon an agreement between the transmitting system and the receiving system, and/or field synchronization data for the channel equalization process.

The channel equalizer 1302 may perform channel equalization using a plurality of methods. According to the present invention, the channel equalizer 2003 uses known data and/or field synchronization data, so as to estimate a channel impulse response (CIR), thereby performing channel equalization.

Most particularly, an example of estimating the CIR in accordance with each region within the data group, which is hierarchically divided and transmitted from the transmitting system, and applying each CIR differently will also be described herein.

At this point, a data group can be assigned and transmitted a maximum the number of 4 in a VSB frame in the transmitting system. In this case, all data group do not include field synchronization data. In the present invention, the data group including the field synchronization data performs channel-equalization using the field synchronization data and known data. And the data group not including the field synchronization data performs channel-equalization using the known data.

For example, the data of the M/H block B3 including the field synchronization data performs channel-equalization using the CIR calculated from the field synchronization data area and the CIR calculated from the first known data area. Also, the data of the M/H blocks B1 and B2 performs channel-equalization using the CIR calculated from the field synchronization data area and the CIR calculated from the first known data area. Meanwhile, the data of the M/H blocks B1 to B3 not including the field synchronization data performs channel-equalization using CIRS calculated from the first known data area and the third known data area.

As described above, the present invention uses the CIR estimated from the known data region in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Figure 47:
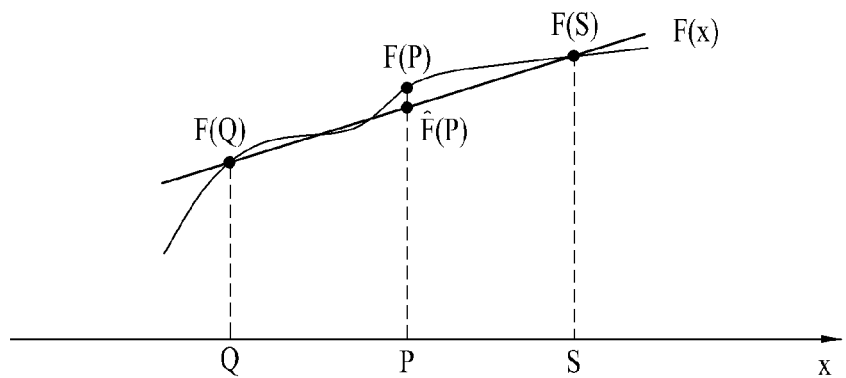
FIG. 47 illustrates an example of linear interpolation.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. FIG. 47 illustrates an example of linear interpolation.

More specifically, in a random function F(x), when given the values F(Q) and F(S) each from points x=Q and x=S, respectively, the approximate value $\hat{F}$(P) of the F(x) function at point x=P may be estimated by using Equation 7 below. In other words, since the values of F(Q) and F(S) respective to each point x=Q and x=S are known (or given), a straight line passing through the two points may be calculated so as to obtain the approximate value F̂(P) of the corresponding function value at point P. At this point, the straight line passing through points (Q,F(Q)) and (S,F(S)) may be obtained by using Equation 7 below.

$$\hat{F}(x) = \frac{F(S) - F(Q)}{S - Q}(x - Q) + F(Q) \quad \text{Equation 7}$$

Accordingly, Equation 8 below shows the process of substituting p for x in Equation 7, so as to calculate the approximate value F̂(P) of the function value at point P.

$$\hat{F}(P) = \frac{F(S) - F(Q)}{S - Q}(P - Q) + F(Q) \quad \text{Equation 8}$$

$$\hat{F}(P) = \frac{S - P}{S - Q}F(Q) + \frac{P - Q}{S - Q}F(S)$$

The linear interpolation method of Equation 8 is merely the simplest example of many other linear interpolation methods. Therefore, since any other linear interpolation method may be used, the present invention will not be limited only to the examples given herein.

Alternatively, when a value F(Q) of a function F(x) at a particular point Q and a value F(S) of the function F(x) at another particular point S are known (or given), extrapolation refers to estimating a function value of a point outside of the section between points Q and S. Herein, the simplest form of extrapolation corresponds to linear extrapolation.

Figure 48:
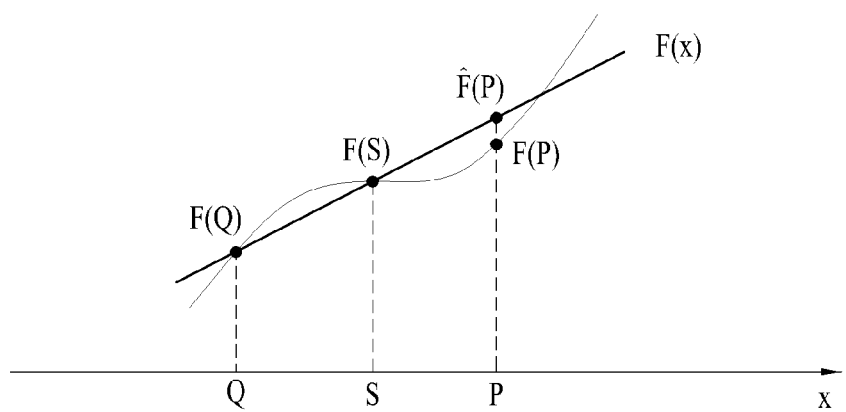
FIG. 48 illustrates an example of linear extrapolation.

FIG. 48 illustrates an example of linear extrapolation. As described above, for linear extrapolation as well as linear interpolation, in a random function F(x), when given the values F(Q) and F(S) each from points x=Q and x=S, respectively, the approximate value F̂(P) of the corresponding function value at point P may be obtained by calculating a straight line passing through the two points.

Herein, linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

Figure 49:
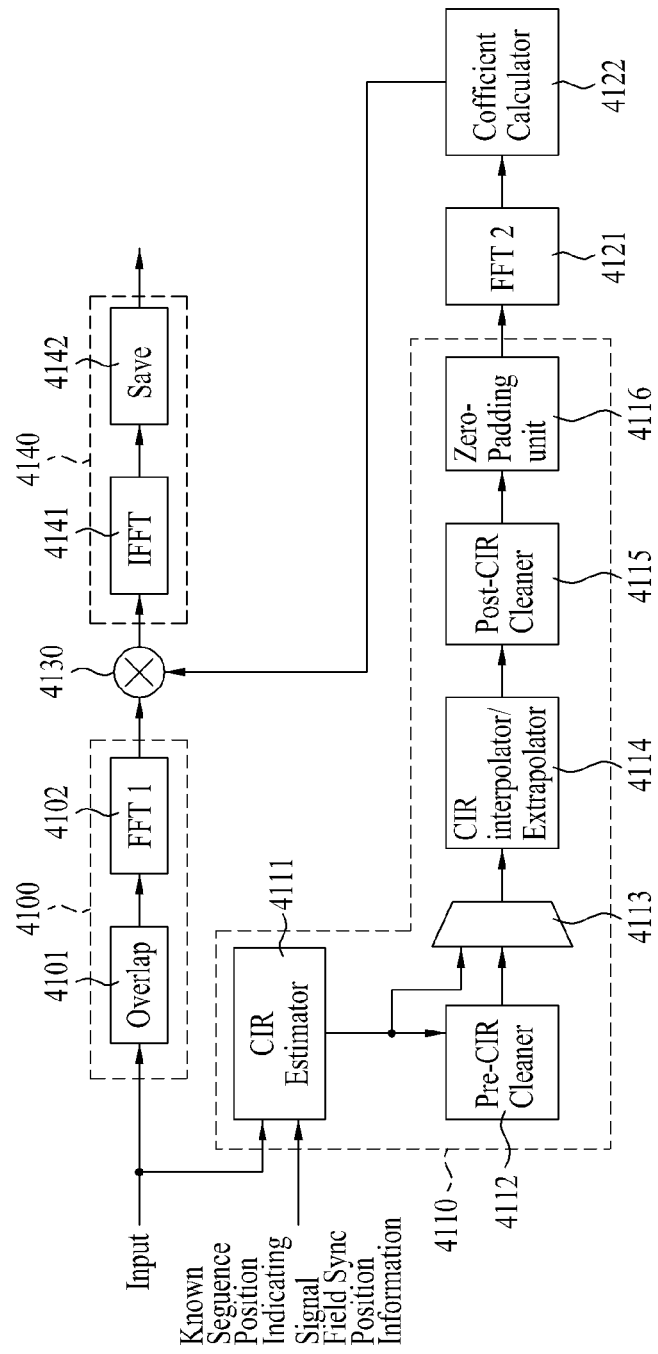
FIG. 49 illustrates an example of a channel equalizer according to an embodiment of the present invention.

FIG. 49 illustrates a block diagram of a channel equalizer according to an embodiment of the present invention.

Referring to FIG. 49, the channel equalizer includes a first frequency domain converter 4100, a channel estimator 4110, a second frequency domain converter 4121, a coefficient calculator 4122, a distortion compensator 4130, and a time domain converter 4140.

Herein, the channel equalizer may further include a remaining carrier phase error remover, a noise canceller (NC), and a decision unit.

The first frequency domain converter 4100 includes an overlap unit 4101 overlapping inputted data, and a fast fourier transform (FFT) unit 4102 converting the data outputted from the overlap unit 4101 to frequency domain data.

The channel estimator 4110 includes a CIR estimator 4111, a first cleaner 4112, a multiplexer 4113, a CIR calculator 4114, a second cleaner 4115 and a zero-padding unit 4116.

Herein, the channel estimator 4110 may further include a phase compensator compensating a phase of the CIR which estimated in the CIR estimator 4111.

The second frequency domain converter 4121 includes a fast fourier transform (FFT) unit converting the CIR being outputted from the channel estimator 4110 to frequency domain CIR.

The time domain converter 4140 includes an IFFT unit 4141 converting the data having the distortion compensated by the distortion compensator 4130 to time domain data, and a save unit 4142 extracting only valid data from the data outputted from the IFFT unit 4141. The output data from the save unit 4142 corresponds to the channel-equalized data.

If the remaining carrier phase error remover is connected to an output terminal of the time domain converter 4140, the remaining carrier phase error remover estimates the remaining carrier phase error included in the channel-equalized data, thereby removing the estimated error.

If the noise remover is connected to an output terminal of the time domain converter 4140, the noise remover estimates noise included in the channel-equalized data, thereby removing the estimated noise.

More specifically, the receiving data demodulated in FIG. 49 are overlapped by the overlap unit 4101 of the first frequency domain converter 4100 at a pre-determined overlapping ratio, which are then outputted to the FFT unit 4102. The FFT unit 4102 converts the overlapped time domain data to overlapped frequency domain data through by processing the data with FFT. Then, the converted data are outputted to the distortion compensator 4130.

The distortion compensator 4130 performs a complex number multiplication on the overlapped frequency domain data outputted from the FFT unit 4102 included in the first frequency domain converter 4100 and the equalization coefficient calculated from the coefficient calculator 4122, thereby compensating the channel distortion of the overlapped data outputted from the FFT unit 4102. Thereafter, the compensated data are outputted to the IFFT unit 4141 of the time domain converter 4140. The IFFT unit 4141 performs IFFT on the overlapped data having the channel distortion compensated, thereby converting the overlapped data to time domain data, which are then outputted to the save unit 4142. The save unit 4142 extracts valid data from the data of the channel-equalized and overlapped in the time domain, and outputs the extracted valid data.

Meanwhile, the received data are inputted to the overlap unit 4101 of the first frequency domain converter 4100 included in the channel equalizer and, at the same time, inputted to the CIR estimator 4111 of the channel estimator 4110.

The CIR estimator 4111 uses a training sequence, for example, data being inputted during the known data section and the known data in order to estimate the CIR. If the data to be channel-equalizing is the data within the data group including field synchronization data, the training sequence using in the CIR estimator 4111 may become the field synchronization data and known data. Meanwhile, if the data to be channel-equalizing is the data within the data group not including field synchronization data, the training sequence using in the CIR estimator 4111 may become only the known data.

For example, the CIR estimator 4111 uses the data received during a known data section and reference known data generated from the receiving system based upon an agreement between the receiving system and the transmitting system, so as to estimate a channel impulse response (CIR). In order to do so, the CIR estimator 4111 is provided with a Known Sequence Position Indicating Signal from the Group Position Synchronization & Initial Frequency offset estimator 1506.

Also, in case of the data group including field synchronization, the CIR estimator 4111 may use the data being received during one field synchronization section and the reference field synchronization data, which generated from the receiving system in accordance with an agreement between the transmitting system and the receiving system, so as to estimate a channel impulse response (CIR_FS). In order to do so, the CIR estimator 4111 may be provided with Field Sync Position Information from the Group Position Synchronization & Initial Frequency offset estimator 1506. The CIR estimator 4111 may estimate a channel impulse response (CIR) by using a well-known least square (LS) method.

In the LS method, a cross correlation value p between known data that have passed through a channel during a known data section and known data already known by a receiving end (or receiver) is calculated, and an auto-correlation matrix R of the known data is also calculated. Thereafter, a matrix operation (or calculation) of $R^{-1} \cdot p$ is performed so that the auto-correlation portion existing in the cross correlation value p between the received data and the initial (or original) known data can be removed, thereby estimating the CIR of the transmission channel.

Also, according to another embodiment of the present invention, the CIR estimator may also perform CIR estimation by using a least mean square (LMS) method. For example, in regions A and B within the data group, the Channel Impulse Response (CIR) is estimated by using the Least Square (LS) method, and, then, channel equalization may be performed. Thereafter, in regions C and D within the data group, the CIR is estimated by using the Least Mean Square (LMS) method, and, then, channel equalization may be performed.

The CIR estimated as described above is outputted to the first cleaner 4112 and the multiplexer 4113. The multiplexer 4113 may either select the output of the first cleaner 4112 or select the output of the CIR estimator 4111 depending upon whether the CIR operator 4114 performs interpolation on the estimated CIR, or whether the CIR operator 4114 performs extrapolation on the estimated CIR. For example, when the CIR operator 4114 performs interpolation on the estimated CIR, the multiplexer 4113 selects the output of the CIR estimator 4111. And, when the CIR operator 4114 performs extrapolation on the estimated CIR, the multiplexer 4113 selects the output of the first cleaner 4112.

The CIR operator 4114 performs interpolation or extrapolation on the estimated CIR and then outputs the interpolated or extrapolated CIR to the second cleaner 4115.

More specifically, the CIR estimated from the known data includes a channel element that is to be obtained as well as a jitter element caused by noise. Since such jitter element deteriorates the performance of the equalizer, it preferable that a coefficient calculator 4122 removes the jitter element before using the estimated CIR. Therefore, according to the embodiment of the present invention, each of the first and second cleaners 4113 and 4115 removes a portion of the estimated CIR having a power level lower than the predetermined threshold value (i.e., so that the estimated CIR becomes equal to '0'). Herein, this removal process will be referred to as a "CIR cleaning" process.

The CIR calculator 4114 performs CIR interpolation by multiplying CIRs estimated from the CIR estimator 4111 by each of coefficients, thereby adding the multiplied values. At this point, some of the noise elements of the CIR may be added to one another, thereby being cancelled. Therefore, when the CIR calculator 4114 performs CIR interpolation, the original (or initial) CIR having noise elements remaining therein. In other words, when the CIR calculator 4114 performs CIR interpolation, the estimated CIR bypasses the first cleaner 4113 and is inputted to the CIR calculator 4114.

Subsequently, the second cleaner 4115 cleans the CIR interpolated by the CIR interpolator-extrapolator 4114.

Conversely, the CIR calculator 4114 performs CIR extrapolation by using a difference value between two CIRs, so as to estimate a CIR positioned outside of the two CIRs. Therefore, in this case, the noise element is rather amplified. Accordingly, when the CIR calculator 4114 performs CIR extrapolation, the CIR cleaned by the first cleaner 4113 is used. More specifically, when the CIR calculator 4114 performs CIR extrapolation, the extrapolated CIR passes through the second cleaner 4115, thereby being inputted to the zero-padding unit 4116.

Meanwhile, when a second frequency domain converter (or fast fourier transform (FFT2)) 4121 converts the CIR, which has been cleaned and outputted from the second cleaner 4115, to a frequency domain, the length and of the inputted CIR and the FFT size may not match (or be identical to one another). In other words, the CIR length may be smaller than the FFT size. In this case, the zero-padding unit 4116 adds a number of zeros '0's corresponding to the difference between the FFT size and the CIR length to the inputted CIR, thereby outputting the processed CIR to the second frequency domain converter (FFT2) 4121. Herein, the zero-padded CIR may correspond to one of the interpolated CIR, extrapolated CIR, and the CIR estimated in the known data section.

The second frequency domain converter 4121 outputs the converted CIR to the coefficient calculator 4122.

The coefficient calculator 4122 uses the frequency domain CIR being outputted from the second frequency domain converter 4121 to calculate the equalization coefficient. Then, the coefficient calculator 4122 outputs the calculated coefficient to the distortion compensator 4130. Herein, for example, the coefficient calculator 4122 calculates a channel equalization coefficient of the frequency domain that can provide minimum mean square error (MMSE) from the CIR of the frequency domain, which is outputted to the distortion compensator 4130.

The distortion compensator 4130 performs a complex number multiplication on the overlapped data of the frequency domain being outputted from the FFT unit 4102 of the first frequency domain converter 4100 and the equalization coefficient calculated by the coefficient calculator 4122, thereby compensating the channel distortion of the overlapped data being outputted from the FFT unit 4102.

Block Decoder

Meanwhile, if the data being inputted to the block decoder 1303, after being channel-equalized by the equalizer 1302, correspond to the data having both block encoding and trellis encoding performed thereon (i.e., the data within the RS frame, the signaling information data, etc.) by the transmitting system, trellis decoding and block decoding processes are performed on the inputted data as inverse processes of the transmitting system. Alternatively, if the data being inputted to the block decoder correspond to the data having only trellis encoding performed thereon (i.e., the main service data), and not the block encoding, only the trellis decoding process is performed on the inputted data as the inverse process of the transmitting system.

The trellis decoded and block decoded data by the block decoder 1303 are then outputted to the RS frame decoder 1304. More specifically, the block decoder 1303 removes the known data, data used for trellis initialization, and signaling information data, MPEG header, which have been inserted in the data group, and the RS parity data, which have been added by the RS encoder/non-systematic RS encoder or non-systematic RS encoder of the transmitting system. Then, the block decoder 1303 outputs the processed data to the RS frame decoder 1304. Herein, the removal of the data may be performed before the block decoding process, or may be performed during or after the block decoding process.

Meanwhile, the data trellis-decoded by the block decoder 1303 are outputted to the data deinterleaver of the main service data processor. At this point, the data being trellis-decoded by the block decoder 1303 and outputted to the data deinterleaver may not only include the main service data but may also include the data within the RS frame and the signaling information. Furthermore, the RS parity data that are added by the transmitting system after the pre-processor may also be included in the data being outputted to the data deinterleaver.

According to another embodiment of the present invention, data that are not processed with block decoding and only processed with trellis encoding by the transmitting system may directly bypass the block decoder 1303 so as to be outputted to the data deinterleaver. In this case, a trellis decoder should be provided before the data deinterleaver.

More specifically, if the inputted data correspond to the data having only trellis encoding performed thereon and not block encoding, the block decoder 1303 performs Viterbi (or trellis) decoding on the inputted data so as to output a hard decision value or to perform a hard-decision on a soft decision value, thereby outputting the result.

Meanwhile, if the inputted data correspond to the data having both block encoding process and trellis encoding process performed thereon, the block decoder 1303 outputs a soft decision value with respect to the inputted data.

In other words, if the inputted data correspond to data being processed with block encoding by the block processor and being processed with trellis encoding by the trellis encoding module, in the transmitting system, the block decoder 1303 performs a decoding process and a trellis decoding process on the inputted data as inverse processes of the transmitting system. At this point, the RS frame encoder of the pre-processor included in the transmitting system may be viewed as an outer (or external) encoder. And, the trellis encoder may be viewed as an inner (or internal) encoder. When decoding such concatenated codes, in order to allow the block decoder 1303 to maximize its performance of decoding externally encoded data, the decoder of the internal code should output a soft decision value.

Figure 50:
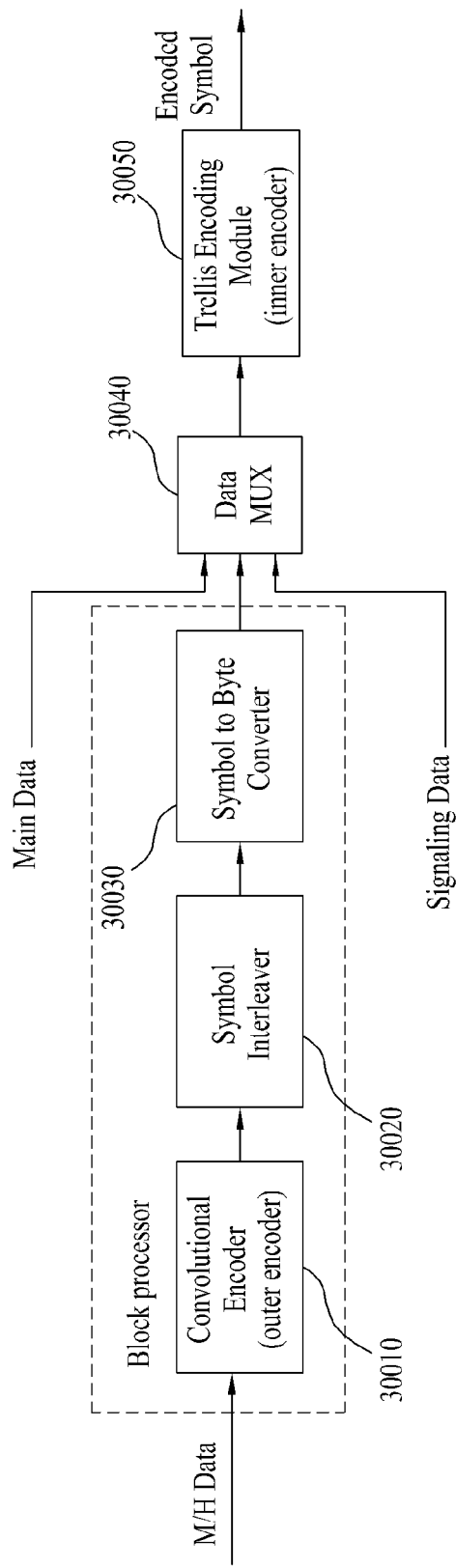
FIG. 50 illustrates a serial concatenated convolution code (SCCC) coding process according to an embodiment of the present invention.

FIG. 50 illustrates SCCC encoding process according to an embodiment of the present invention.

The SCCC encoding process is related with Convolutional Encoder 30010, Symbol Interleaver 30020, Symbol to Byte Converter 30030, Data MUX 30040 and Trellis Encoding Module 30050.

A SCCC Decoder can decode both the main trellis code and the M/H convolutional code, considering that they are effectively concatenated with each other at the transmitter through the symbol interleaver 30020 and the data mux module 30040 as shown in FIG. 50. the data mux module 30040, shown as a single block, actually consists of a number of processors including the Group formatter, the Packet formatter, the Packet mux, the RS encoder, the data interleaver, the byte to symbol converter and the 12-way symbol demultiplexer in the 12-way trellis encoder.

Figure 51:
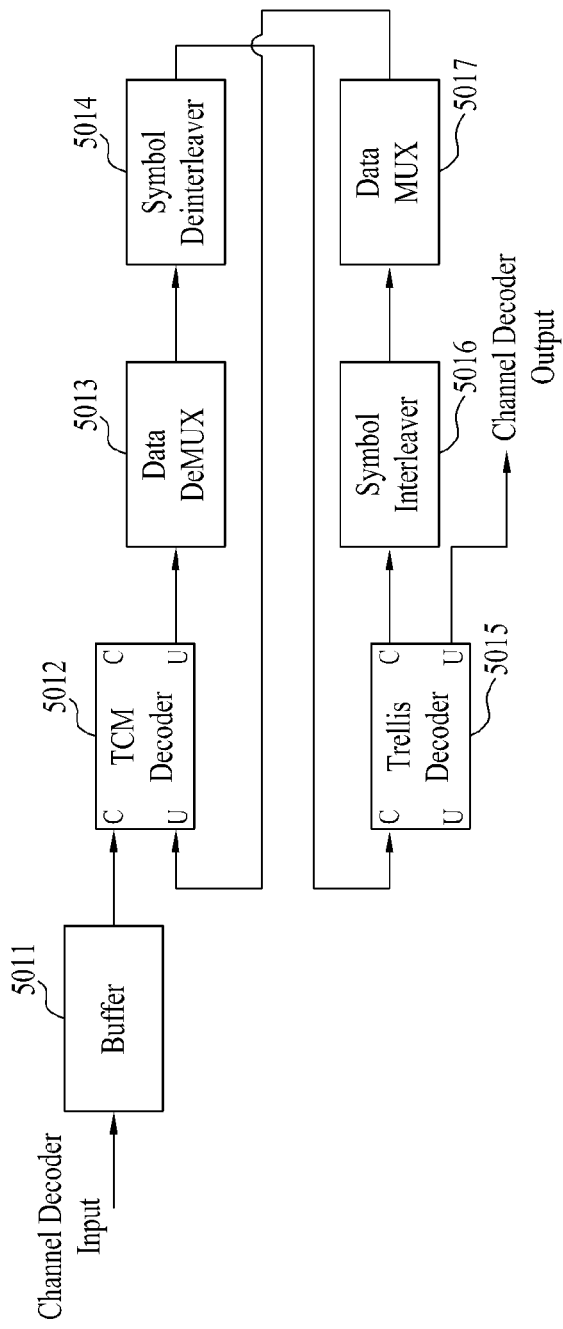
FIG. 51 illustrates a detailed block view showing a block decoder according to an embodiment of the present invention.

FIG. 51 illustrates a detailed block view showing a block decoder 1303 according to an embodiment of the present invention. The block decoder 1303 includes an input buffer 5011, a Trellis Code Modulation (TCM) decoder 5012, a data demultiplexer 5013, a symbol deinterleaver 5014, a symbol decoder 5015, a symbol interleaver 5016, and a data multiplexer 5017. The TCM decoder 5012 is referred to as an inner decoder, and the symbol decoder 5015 is referred to as an outer decoder or a trellis decoder. The block decoder 1303 according to an embodiment of the present invention performs SCCC block decoding in SCCC block units on the inputted data. In FIG. 31, 'U' and 'C' marked on the TCM decoder 5012 and the symbol decoder 5015 respectively indicate 4 ports of soft input soft output (SISO).

The input buffer 5011 temporarily stores values of mobile service data symbols (i.e., including RS parity data symbols that were added during RS frame encoding, and CRC data symbols) being channel-equalized and outputted from the channel equalizer 5011 in SCCC block units. Thereafter, the input buffer 5011 repeatedly outputs the stored values to the TCM decoder 5012.

Also, among the symbol values being outputted from the channel equalizer 1302, input symbol values of section do not include any mobile service data symbol (i.e., including RS parity data symbols that were added during RS frame encoding, and CRC data symbols) values bypass the input buffer 5011 without being stored. More specifically, since only trellis-decoding is performed on the input symbol value of sections that are not processed with SCCC block encoding, the input buffer 5011 directly outputs such input to the TCM decoder 5012 without performing any temporary storing or repeated outputting processes.

The input buffer 5011 refers to information associated to SCCC being outputted from the operation controller 1307 or the signaling decoder 1308, e.g., the SCCC block mode and SCCC outer code mode, so as to control the storage and output of the input data.

In correspondence with the 12-way trellis encoder, the TCM decoder 5012 includes a 12-way Trellis Coded Modulation (TCM) decoder. Herein, 12-way trellis-decoding is performed on the input symbol value as an inverse process of the 12-way trellis-encoder.

More specifically, the TCM decoder 5012 receives as many output symbol values of the input buffer 5011 and soft-decision values being fed-back through the data multiplexer 5017 as each SCCC blocks, so as to perform TCM decoding on each symbol.

At this point, the soft-decision values that are fed-back are matched to be in a one-to-one correspondence with a number of symbol positions corresponding to the number of SCCC blocks being outputted from the input buffer 5011, so that the matched soft-decision values can be inputted to the TCM decoder 5012 based upon the control of the data multiplexer 5017. More specifically, the symbol values being outputted from the input buffer 5011 and the turbo-decoded and inputted data are matched to one another in accordance with the same position within the respective SCCC block, thereby being outputted to the TCM decoder 5012. For example, if the turbo-decoded data correspond to the third symbol value within the SCCC block, the corresponding turbo-decoded data are matched with the third symbol value within the SCCC block being outputted from the input buffer 5011, thereby being outputted to the TCM decoder 5012.

In order to do so, the data multiplexer 5017 controls the system so that the input buffer 5011 can store the corresponding SCCC block data while the iterative turbo decoding is being performed. And, by using a delay method, the data multiplexer 5017 also controls the system so that the soft-decision value (e.g., LLR) of the output symbol of the symbol interleaver 5016 can be matched, so as to be in a one-to-one correspondence, with the symbol value of the input buffer 5011 corresponding to the same position (or location) within the block of the output symbol, thereby being inputted to the TCM decoder of the corresponding way. At this point, in case of a symbol value that is not block decoded, since the corresponding symbol value is not turbo decoded, a null bit is inputted in the matched output position (or location).

After performing this process for a predetermined number of iteration of turbo decoding, the data of the next SCCC block is stored in the input buffer 5011 and then outputted, so as to repeat the turbo-decoding process.

The output of the TCM decoder 5012 signifies the reliability of the symbols being inputted to the trellis encoder of the transmitting system with respect to the transmitted symbols. For example, since the 2-bit input of the trellis encoding module of the transmitting system corresponds to one symbol, a Log Likelihood Ratio (LLR) between the likelihood (or probability) of one bit being '1' and the likelihood (or probability) of another bit being '0' may be respectively outputted (bit-unit output) for the upper bit and the lower bit. The Log Likelihood Ratio (LLR) signifies a log value on a ratio between the likelihood value of the input bit being '1' and the likelihood value of the input bit being '0'. Alternatively, a log likelihood ratio of the likelihood value of 2 bits, i.e., one symbol being "00", "01", "10", and "11" may be outputted (symbol-unit output) for all four combinations (00,01,10,11). This eventually corresponds to the soft-decision value of the received symbol, which indicates the reliability of the bits that were inputted to the trellis encoder. Herein, a Maximum A posteriori Probability (MAP), a Soft-Out Viterbi Algorithm (SOVA) may be used as the decoding algorithm of each TCM decoder included in the TCM decoder 5012.

The data demultiplexer 5013 identifies the soft-decision values corresponding mobile service data symbols (i.e., including RS parity data added when performing RS frame encoding, and CRC data symbols) from the output of the TCM decoder 5012, thereby outputting the identified soft-decision values to the symbol deinterleaver 5014. At this point, the data demultiplexer 5013 performs an inverse process of process reordering of a mobile service data symbol generated from an intermediate step, wherein the output symbols outputted from the block processor of the transmitting system are being inputted to the trellis encoding module (e.g., when the symbols pass through the group formatter, the data deinterleaver, the packet formatter, and the data interleaver). Thereafter, the data demultiplexer 5013 performs reordering of the process order of soft decision values corresponding to the mobile service data symbols and, then, outputs the processed mobile service data symbols to the symbol deinterleaver 5014.

This is because a plurality of blocks exist between the block processor and the trellis encoding module, and because, due to these blocks, the order of the mobile service data symbols being outputted from the block processor and the order of the mobile service data symbols being inputted to the trellis encoding module are not identical to one another. More specifically, the data demultiplexer 5013 reorders (or rearranges) the order of the mobile service data symbols being outputted from the outer TCM decoder 5012, so that the order of the mobile service data symbols being inputted to the symbol deinterleaver 5014 matches the order of the mobile service data symbols outputted from the block processor of the transmitting system. The reordering process may be embodied as one of software, middleware, and hardware.

The symbol deinterleaver 5014 performs symbol deinterleaving on the soft decision values of data symbols being reordered and outputted from the data demultiplexer 5013 as an inverse process of the symbol interleaver included in the transmitting system. The size of the SCCC block being used by the symbol deinterleaver 5014, during the symbol deinterleaving process, is identical to the interleaving size (i.e., B) of an actual symbol of the symbol interleaver included in the transmitting system. This is because turbo decoding is performed between the TCM decoder 5012 and the symbol decoder 5015.

The input and output of the symbol interleaver 5014 all corresponds to soft-decision values, and the deinterleaved soft-decision values are outputted to the symbol decoder 5015.

The symbol decoder 5015 has 4 memory states. If the symbol decoder is in a ½ coding rate mode, the memory states are changed in accordance with an input LLR set respective to a symbol. More specifically, in case of data being ½-rate encoded and outputted, the output LLR of the symbol deinterleaver 5014 is directly outputted to the symbol decoder 5015.

However, if the symbol decoder is in a ¼ coding rate mode, i.e., in case of data being ¼-rate encoded and outputted from the symbol encoder of the transmitting system, the memory states are changed in accordance with 2 input LLR sets respective to 2 successive symbols. Therefore, 2 input LLR sets should be merged into one LLR set during the input stage of the symbol decoder 5015. In the present invention, the merged LLR set may be obtained by adding first input LLRs and second input LLRs. If Li(x) is defined as an input LLR value having a condition of 'x', the merged LLR set may be expressed by using Equation 9 shown below.

$Li$(merged nibble='0000')=$Li$(first symbol='00')+$Li$ (second symbol='00')

$Li$(merged nibble='0001')=$Li$(first symbol='00')+$Li$ (second symbol='01')

$Li$(merged nibble='0010')=$Li$(first symbol='00')+$Li$ (second symbol='10')

$Li$(merged nibble='0011')=$Li$(first symbol='00')+$Li$ (second symbol='11')

$Li$(merged nibble='0100')=$Li$(first symbol='01')+$Li$ (second symbol='00')

⋮

$Li$(merged LLR='1111')=$Li$(first symbol='11')+$Li$ (second symbol='11')  Equation 9

Meanwhile, as the opposite of the input LLR processing, the processing of the LLR that is to be outputted from the symbol decoder 5015 is divided into 2 symbol LLRs in the ¼-code rate mode, as shown in Equation 10 below, thereby being outputted.

$Lo$(first symbol='00')=Maximum Probability whose LLR is from the sets {$Lo$(merged nibble='00$XY$')+Delta}

$Lo$(first symbol='01')=Maximum Probability whose LLR is from the sets {$Lo$(merged nibble='01$XY$')+Delta}

$Lo$(first symbol='10')=Maximum Probability whose LLR is from the sets {$Lo$(merged nibble='10$XY$')+Delta}

$Lo$(first symbol='11')=Maximum Probability whose LLR is from the sets {$Lo$(merged nibble='00$XY$')+Delta}

$Lo$(second symbol='00')=Maximum Probability whose LLR is from the sets {$Lo$(merged nibble='$XY$00')+Delta}

$Lo$(second symbol='01')=Maximum Probability whose LLR is from the sets {$Lo$(merged nibble='$XY$01')+Delta}

*Lo*(second symbol='10')=Maximum Probability whose LLR is from the sets {*Lo*(merged nibble='*XY*10')+Delta}

*Lo*(second symbol='11')=Maximum Probability whose LLR is from the sets {*Lo*(merged nibble='*XY*00')+Delta}   Equation 10

Herein, X and Y are the arbitrary selected digits from digit 0 or 1. Also, according to an embodiment of the present invention, a correction term 'Delta' value is calculated from an IETF RFC 3926 "FLUTE—File Delivery over Unidirectional Transport".

At this point, the symbol decoder 5015 output 2 types of soft-decision values. One corresponds to a soft-decision value being matched with an output symbol of the symbol decoder (hereinafter referred to as a first soft-decision value). And, the other corresponds to a soft-decision value being matched with an input symbol of the symbol decoder (hereinafter referred to as a second soft-decision value). The first soft-decision value represents a reliability of the output symbol, i.e., two bits, of the symbol encoder. And, a Log Likelihood Ratio (LLR) between the likelihood (or probability) of one bit being '1' and the likelihood (or probability) of another bit being '0' may be respectively outputted (bit-unit output) for the upper bit and the lower bit, which configure a symbol. Alternatively, a log likelihood ratio of the likelihood value of 2 bits, i.e., one symbol being "00", "01", "10", and "11" may be outputted (symbol-unit output) for all combinations. The first soft-decision value is fed-back to the TCM decoder 5012 through the symbol interleaver 5016 and the data multiplexer 5017. The second soft-decision value represents a reliability of the input symbol of the symbol encoder of the transmitting system. Herein, the second soft-decision value is expressed as a Log Likelihood Ratio (LLR) between the likelihood (or probability) of one bit being '1' and the likelihood (or probability) of another bit being '0', thereby being outputted to the RS frame decoder 1304. Herein, a Maximum A posteriori Probability (MAP), a Soft-Out Viterbi Algorithm (SOVA) may be used as the decoding algorithm of the symbol decoder 5015.

At this point, when the first soft-decision value being outputted from the symbol decoder 5015 is in a ¼ coding rate mode, the first soft-decision value is divided into 2 symbol LLRs, as shown in Equation 10, so as to be outputted to the symbol interleaver 5016.

For example, when the input/output unit of the symbol decoder 5015 corresponds to symbol units, 16 ($2^4$=16) different types of soft-decision values (LLRs) are inputted to the symbol decoder 5015. At this point, the 16 ($2^4$=16) different types of soft-decision values (i.e., LLRs) being inputted to the symbol decoder 5015 correspond to results of adding the respective first input LLR and the respective second input LLR.

If ¼-rate coding is performed by the symbol encoder, the symbol decoder 5015 receives the LLR respective to the 16 different symbols and performs symbol decoding. Thereafter, the symbol decoder 5015 may output the LLR respective to the 16 different symbols as the first soft-decision value. Alternatively, the symbol decoder 5015 may receive the LLR respective to 4 bits and performs symbol decoding. Thereafter, the symbol decoder 5015 may output the LLR respective to the 4 bits as the first soft-decision value.

And, if ½-rate coding is performed by the symbol encoder, the symbol decoder 5015 receives the LLR respective to the 4 different symbols and performs symbol decoding. Thereafter, the symbol decoder 5015 may output the LLR respective to the 4 different symbols as the first soft-decision value. Alternatively, the symbol decoder 5015 may receive the LLR respective to 2 bits and performs symbol decoding. Thereafter, the symbol decoder 5015 may output the LLR respective to the 2 bits as the first soft-decision value.

According to an embodiment of the present invention, the symbol interleaver 5016 performs symbol interleaving on the first soft-decision value being outputted from the symbol decoder 5015, as shown in FIG. 32, thereby outputting the symbol-interleaved first soft-decision value to the data multiplexer 5017. Herein, the output of the symbol interleaver 5020 also becomes a soft-decision value. According to another embodiment of the present invention, the symbol interleaver 5016 performs symbol interleaving on the first soft-decision value being outputted from the symbol decoder 5015, as shown in FIG. 32, thereby outputting the symbol-interleaved first soft-decision value to the data multiplexer 5017.

If the SCCC block mode is '00', a data group is configured of 10 SCCC blocks. And, if the SCCC block mode is '01', a data group is configured of 5 SCCC blocks. At this point, the symbol interleaving pattern of the 15 SCCC blocks are different from one another. Therefore, in order to store all symbol interleaving patterns, a memory having a very large capacity (e.g., ROM) is required. FIG. 32 illustrates a block view showing the structure of a symbol interleaver according to the present invention, wherein the symbol interleaver can perform symbol interleaving without requiring a memory, such as ROM. More specifically, when the SCCC block is inputted, symbol interleaved data may be directly outputted without having to use a memory, such as ROM.

Figure 52:
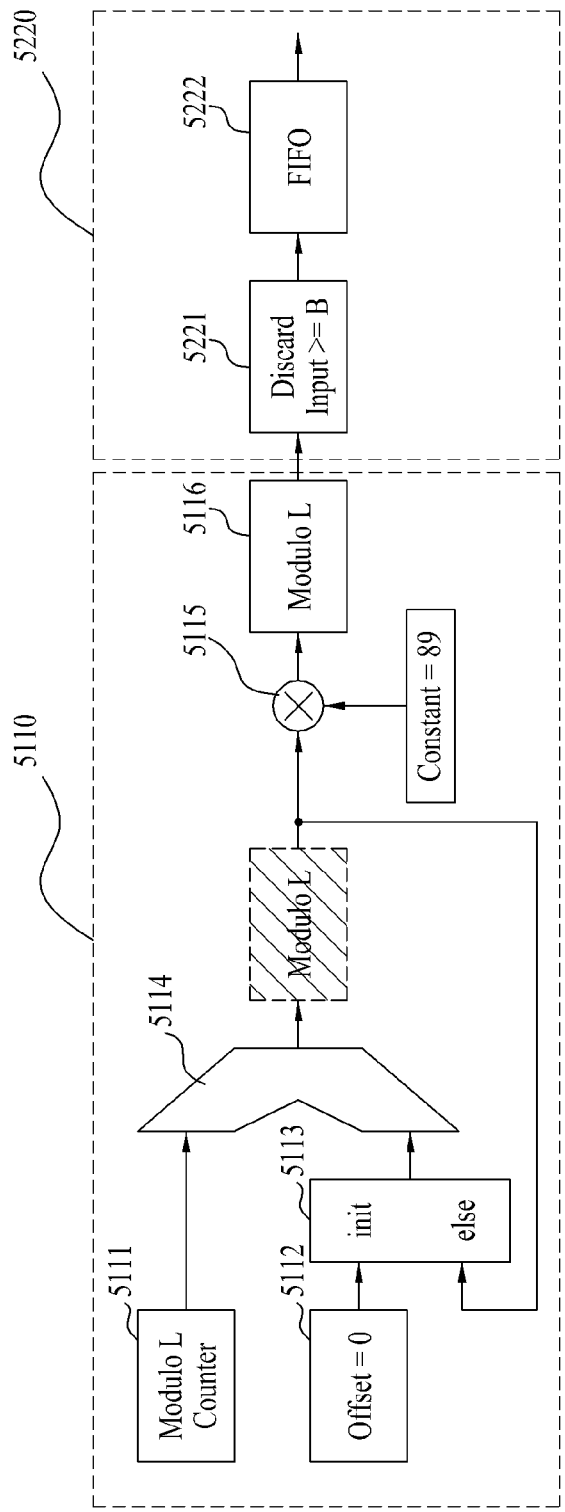
FIG. 52 is a block diagram illustrating a pattern generator of a symbol interleaver according to an embodiment of the present invention.

The symbol interleaver 5016 of FIG. 52 includes a pattern generator 5110 and a pattern output unit 5220. The pattern generator 5110 may include a modulo counter 5111, a multiplexer 5113, an accumulator 5114, a multiplier 5115, and a modulo operator 5116. The pattern output unit 5220 may include a data remover 5221 and a buffer 5222. Herein, a modulo operation may be further included between the accumulator 5114 and the multiplier 5115. Also, the multiplier 5115 may be configured of multiple adders (or shifters).

In FIG. 52, B represents a Block length in symbols (e.g., SCCC block length) being inputted for symbol interleaving. And, L corresponds to a symbol unit block length actually being interleaved y the symbol interleaver 5016. At this point, L=2m (wherein m is an integer), wherein L should satisfy the condition of L≧B.

The modulo counter 5111 performs sequential counting starting from 0 to L. The accumulator 5114 receives a count value of the modulo counter 5111 starting from 0. The multiplexer 5113 selects a constant when starting the symbol interleaving process on an SCCC block. Thereafter, the multiplexer 5113 is fed-back with the output of the accumulator 5114, thereby outputting the feedback to the accumulator 5114. In this case, an initial offset value of symbol interleaving is equal to 0.

The accumulator 5114 adds the output of the modulo counter 5111 and the output of the multiplexer 5113 and, then outputs the added value to the multiplier 5113.

The multiplier 5115 multiplies the output of the accumulator 5114 by a constant 89, thereby outputting the multiplied result to the modulo operator 5116. The modulo operator 5116 performs a modulo L operation on the output of the multiplier 5115, thereby outputting the processed data to the pattern output unit 5220. According to an embodiment of the present invention, the modulo operator 5116 uses a bitwise mask function to perform the modulo L operation. For example, when the L value is equal to 210, and when only the lower 10 bits among the output of the multiplier 5115 are outputted from the modulo operator 5116 and inputted to the pattern output unit 5220, the modulo L operation is performed.

When the output value is equal to or greater than B, the data remover 5221 of the pattern output unit 5220 discards the input value and outputs the processed data to the buffer 5222. According to an embodiment of the present invention, the buffer 5222 is configured to have a First Input First Output (FIFO) structure. The buffer 5222 condenses the remaining values that have not been discarded by the data remover 5221 and then stores the condensed values, which are then outputted in accordance with the stored order. Therefore, the first output B outputted from the buffer 5222 corresponds to the symbol interleaving pattern P(i). At this point, the index i value of the symbol interleaving pattern P(i) increases from 0 to B−1. If the modulo counter 5111 continues to be operated, and when the next output B is collected from the buffer 5222, the symbol interleaving pattern at this point becomes the inverse order of the symbol interleaving pattern P(i). More specifically, the index i value of the symbol interleaving pattern P(i) decreases from B−1 to 0.

Therefore, when the initial offset is set to an L/2 value and not to '0', and when symbol interleaving is started, the first B output becomes an inverse order of the interleaving pattern P(i). In this case, the initial offset value of symbol interleaving becomes an L/2 value.

If 0 is used as the initial offset value, the Lth value being fed-back from the accumulator 5114 becomes (L−1)*L/2, and the modulo L of the feedback value is L/2.

For example, when the initial offset value is set to 0, the symbol interleaving pattern P(i) may be obtained. And, when the initial offset value is set to an L/2 value, an inverse order of the interleaving pattern P(i), i.e., a symbol deinterleaving pattern P(i)−1 may be obtained from the beginning. For example, when the symbol deinterleaver 5014 sets an L/2 value as the initial offset value, and when the symbol interleaver 5016 sets '0' as the initial offset value, only one symbol interleaving pattern P(i) is used to performed both the symbol deinterleaving and symbol interleaving processes.

Alternatively, when only one initial offset is set, and when the modulo operator 5111 performs a counting process up to 2L, a symbol interleaving pattern and a symbol deinterleaving pattern may be generated by using a single initial offset.

FIG. 53 illustrates an example of a symbol interleaving pattern generated when the offset value is equal to 0 according to the present invention. In the example shown in FIG. 33, L is equal to 12000, and the SCCC block length is equal to 16384. Herein, the output pattern in an index starting from 12000 to 23999 corresponds to an inverse order of the output pattern in an index starting from 0 to 11999.

Also, since interleaving and deinterleaving are inverse processes of one another, the interleaving pattern P(i) and the deinterleaving pattern P(i)−1 are not required to be separately generated by the block decoder 1303. More specifically, symbol interleaving and deinterleaving operations may both be performed by using only the symbol interleaving pattern P(i).

(a) of FIG. 54 shows an exemplary process of performing symbol interleaving by using only the symbol interleaving pattern P(i). And, (b) of FIG. 34 shows an exemplary process of performing symbol deinterleaving by using only the symbol interleaving pattern P(i).

In (a) of FIG. 54, the symbol interleaving process is as described below.

1a. An interleaving pattern P(i) is generated.
1b. The ith input data symbol is written in location i of the memory.
1c. Starting from location i of the memory, an ith output data symbol is read.

When the processes 1a to 1c are performed from 0 to B−1, the symbol interleaving process for one SCCC block is completed. Herein, the memory may correspond to a buffer 5222.

In (b) of FIG. 54, the symbol deinterleaving process is as described below.

2a. An interleaving pattern P(i) is generated.
2b. The ith input data symbol is written in location i of the memory.
2c. Starting from location (i) of the memory, an ith output data symbol is read.

When the processes 2a to 2c are performed from 0 to B−1, the symbol deinterleaving process for one SCCC block is completed. Herein, the value of i ranges from 0 to B−1.

More specifically, in (a) and (b) of FIG. 54, step 1b and step 2c access the same address of the memory, and step 1c and step 2b access the same address of the memory.

Therefore, after reading previous data starting from a specific location (or position) of the memory, when current data are written in the corresponding location (or position), the symbol interleaver 5016 and the symbol deinterleaver 5014 may use a single permutation memory so as to perform symbol interleaving and symbol deinterleaving. More specifically, since an address of the memory can be shared during the symbol interleaving and symbol deinterleaving processes, the memory size may be reduced.

As described above, in the present invention, only one symbol interleaving pattern is used to perform symbol interleaving and symbol deinterleaving, thereby having the effect of reducing the memory size.

More specifically, the data multiplexer 5017 of the block decoder 1303 reorders (or rearranges) the output order of the symbol interleaver 5016 in accordance with the processing order of the symbol generated from an intermediate step (e.g., the group data formatter, the packet formatter, the data interleaver). Thereafter, the data multiplexer 5017 outputs the processed symbols to the TCM decoder 5012. Herein, the reordering process of the data multiplexer 5017 may be embodied as at least one of software, middleware, and hardware.

The soft-decision values being outputted from the symbol interleaver 5016 are matched to be in a one-to-one correspondence with mobile service data symbol positions corresponding to the number of SCCC blocks being outputted from the input buffer 5011. Then, the matched soft-decision values are inputted to the TCM decoder 5012. At this point, since a main service data symbol or an RS parity symbol, known data symbol, signaling information data, and so on, of the main service data do not correspond to mobile service data symbols, the data multiplexer 5017 inserts null data in the corresponding location (or position), thereby outputting the processed data to the TCM decoder 5012. Also, each time the symbols of the SCCC blocks are turbo-decoded, since there is no value being fed-back from the symbol interleaver 5016 at the beginning of the first decoding process, the data multiplexer 5017 inserts null data in all symbol positions including a mobile service data symbol, thereby transmitting the processed data to the TCM decoder 5012.

The second soft-decision values being outputted from the symbol decoder 5015 are inputted to the RS frame decoder 1304. For example, the symbol decoder 5015 does not output any second soft-decision value until turbo decoding is performed for a predetermined number of repetition (or iteration) times (e.g., M number of times). Thereafter, when M number of turbo-decoding processes on one SCCC block is all performed, the second soft-decision value of that specific point is outputted to the RS Frame decoder 1304. More specifically, after performing turbo-decoding for a predetermined number of times, the soft decision value of the symbol decoder 5015 is outputted to the RS frame decoder 1304. And, thus, the block decoding process on one SCCC block is completed.

In the present invention, this will be referred to as an iterative turbo decoding process for simplicity.

At this point, the number of iterative turbo decoding performed between the TCM decoder 5012 and the symbol decoder 5015 may be defined by considering hardware complexity and error correction performance. Accordingly, when the number of iterative turbo decoding increases, the error correction can be enhanced. However, this case disadvantageous in that the hardware may also increase.

RS Frame Decoder

Figure 55:
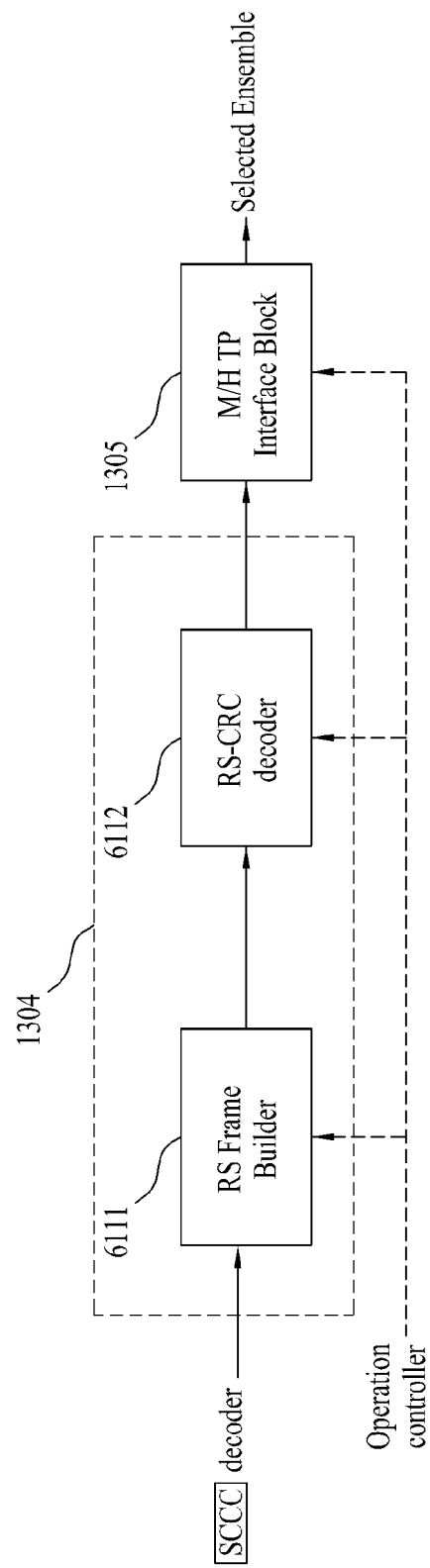
FIG. 55 illustrates a structure of a Reed Solomon (RS) frame decoder according to an embodiment of the present invention.

FIG. 55 illustrates a structure of an RS frame decoder according to an embodiment of the present invention.

RS frame decoder includes RS Frame builder 6111, RS-CRC Decoder 6112 and M/H TP Interface block 1305.

As shown in FIG. 55, an RS Frame decoder processes a particular M/H ensembleEnsemble selected by upper layer request. An RS Frame Builder collects data from the selected Ensemble and builds an RS frame corresponding to the selected Ensemble. An RS-CRC decoder detects and corrects errors in the completed RS frame. An M/H TP interface block derandomizes the data to undo the effects of the M/H randomizer at the transmitter, and finally outputs M/H TPs.

A RS Frame Decoder builds an RS Frame, detects errors on each row of the RS frame by CRC decoding, corrects errors by erasure RS decoding with error location information from CRC decoding and SCCC decoding on each column of the RS frame, and outputs M/H TPs (Transport Packets) with marked error indication fields.

Figure 56:
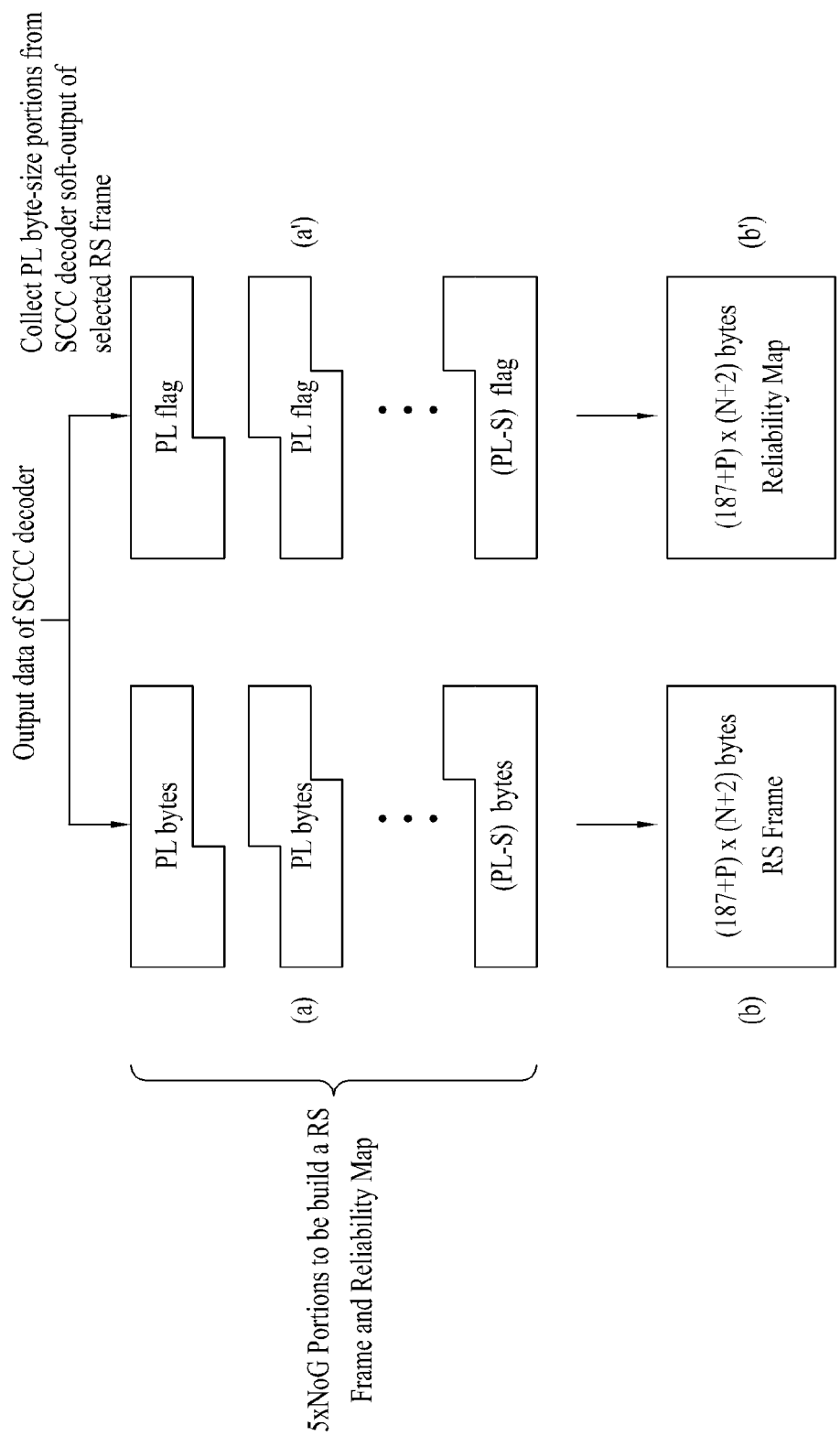
FIG. 56 illustrates, when an RS frame mode value is equal to '00', an exemplary process of grouping several portions being transmitted to a parade, thereby forming an RS frame and an RS frame reliability map.

FIG. 56 illustrates, when the RS frame mode value is equal to '00', an exemplary process of grouping several portion being transmitted to a parade, thereby forming an RS frame and an RS frame reliability map.

More specifically, the RS frame decoder 2006 receives and groups a plurality of mobile service data bytes, so as to form an RS frame. According to the present invention, in transmitting system, the mobile service data correspond to data RS-encoded in RS frame units. At this point, the mobile service data may already be error correction encoded (e.g., CRC-encoded). Alternatively, the error correction encoding process may be omitted.

It is assumed that, in the transmitting system, an RS frame having the size of (N+2)×(187+P) bytes is divided into M number of portions, and that the M number of mobile service data portions are assigned and transmitted to regions A/B/C/D in M number of data groups, respectively. In this case, in the receiving system, each mobile service data portion is grouped, as shown in FIG. 36(*a*), thereby forming an RS frame having the size of (N+2)×(187+P) bytes. At this point, when stuffing bytes (S) are added to at least one portion included in the corresponding RS frame and then transmitted, the stuffing bytes are removed, thereby configuring an RS frame and an RS frame reliability map. For example, when S number of stuffing bytes are added to the corresponding portion, the S number of stuffing bytes are removed, thereby configuring the RS frame and the RS frame reliability map.

Herein, when it is assumed that the block decoder 1303 outputs a soft decision value for the decoding result, the RS frame decoder 1304 may decide the '0' and '1' of the corresponding bit by using the codes of the soft decision value. 8 bits that are each decided as described above are grouped to create 1 data byte. If the above-described process is performed on all soft decision values of several portions (or data groups) included in a parade, the RS frame having the size of (N+2)×(187+P) bytes may be configured.

Additionally, the present invention uses the soft decision value not only to configure the RS frame but also to configure a reliability map.

Herein, the reliability map indicates the reliability of the corresponding data byte, which is configured by grouping 8 bits, the 8 bits being decided by the codes of the soft decision value.

For example, when the absolute value of the soft decision value exceeds a predetermined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure one data byte, is determined to be unreliable, the corresponding data byte is marked on the reliability map as an unreliable data byte.

Herein, determining the reliability of one data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the one data byte are determined to be reliable (i.e., when the absolute value of the soft decision values of all 8 bits included in the one data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of (N+2)×(187+P) bytes, the reliability map is also configured to have the size of (N+2)×(187+P) bytes. FIG. 36(*a'*) and FIG. 36(*b'*) respectively illustrate the process steps of configuring the reliability map according to the present invention.

Subsequently, the RS frame reliability map is used on the RS frames so as to perform error correction.

Figure 57:
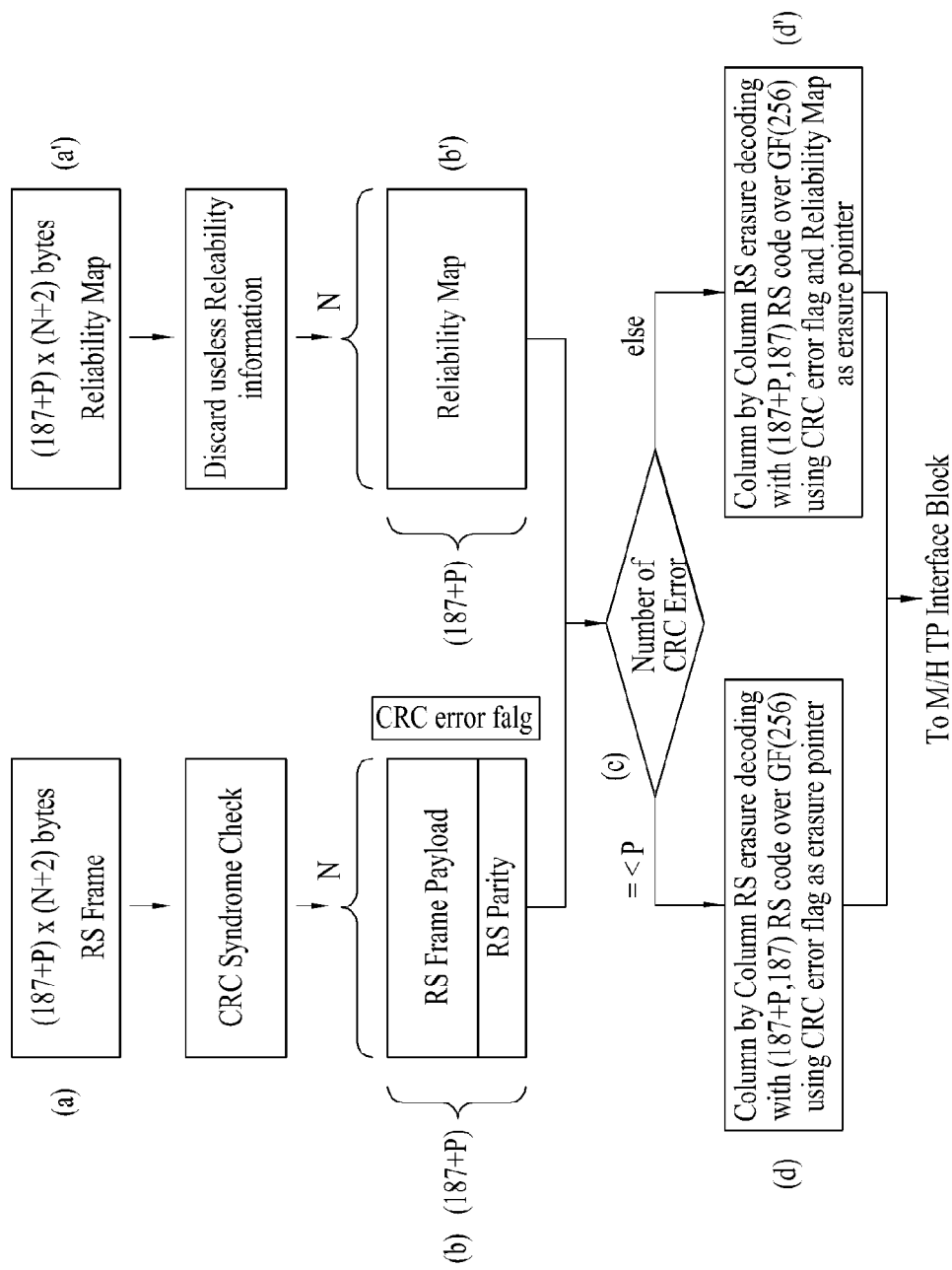
FIG. 57 illustrates an example of an error correction decoding process according to an embodiment of the present invention.
Figure 58:
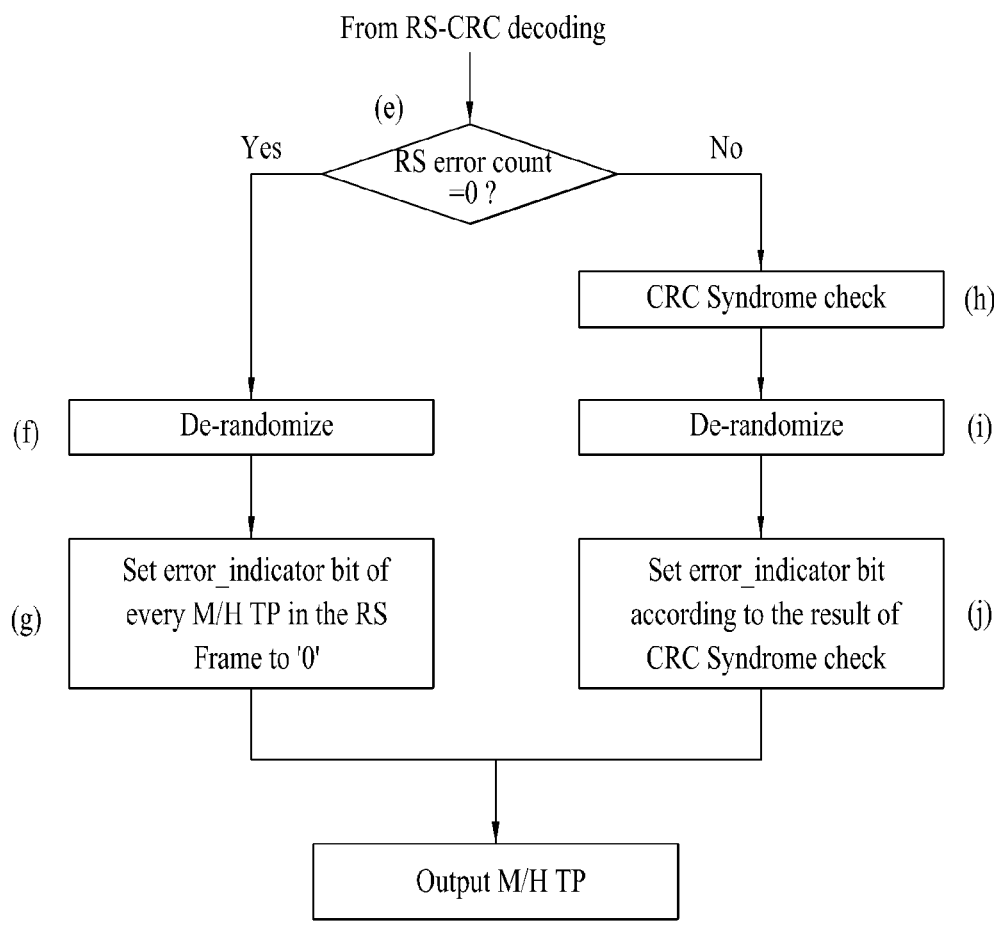
FIG. 58 illustrates an example of an error correction decoding process according to an embodiment of the present invention.

FIG. 57 and FIG. 58 illustrate an error correction decoding process according to an embodiment of the present invention.

According to an embodiment of the present invention, in case of FIG. 57, a CRC syndrome check process is performed once again on the CRC-RS decoded RS frame. And, the result of the CRC syndrome check process is marked in an error_indicator field within each M/H service data packet configuring the payload of the RS frame. Thereafter, the marked result is outputted for A/V decoding. For example, the error_indicator field of the M/H service data packet having an error existing therein is marked as '1', and the error_indicator field of the M/H service data packet having no error existing therein is marked as '0'. According to the embodiment of the present invention, if the error_indicator field value of all M/H service data packets within the RS frame payload is set to '0' and transmitted by the transmitting system, then based upon the CRC syndrome check result, only the error_indicator fields of the M/H service data packet rows are marked as '1'.

Thus, the probability of malfunctioning in blocks receiving and processing M/H service data packets (e.g., M/H TP interface block 1305) in later processes may be reduced. For example, the M/H TP interface block 1305 may discard any M/H service data packet having the error_indicator field marked as '1' without using the corresponding M/H service data packet. Accordingly, since the probability of malfunctioning in the M/H TP interface block 1305 can be reduced, the overall performance of the receiving system may be enhanced.

More specifically, when a (N+2)×(187+P)-byte size RS frame and a (N+2)×(187+P)-bit size RF frame reliability map are configured, as shown in (a) and (a') of FIG. 37, a CRC syndrome check is performed on the RS frame, so as to check whether or not an error has occurred in each row. Subsequently, the presence or absence of an error is marked on a CRC error flag corresponding to each row, as shown in (b) of FIG. 57. At this point, since the portion of the reliability map corresponding to the CRC checksum as no applicability, the corresponding portion is removed (or deleted or discarded), so that only N×(187+P) number of reliability information remains, as shown in (b') of FIG. 57.

As described above, after performing the CRC syndrome check, (187+P, 187)-RS decoding is performed on N number of columns. At this point, RS-decoding is performed on only N number of columns excluding the last 2 columns from the overall (N+2) number of columns because the last 2 columns are configured only of CRC checksum and also because the transmitting system did not perform RS-encoding on the last 2 columns.

At this point, depending upon the number of errors marked on the CRC error flag, either an erasure decoding process is performed or a general RS-decoding process is performed.

For example, when the number of rows including CRC error is less than or equal to a maximum number of errors correctable by RS erasure decoding (according to the embodiment of the present invention, the maximum number is '48'), (235,187)-RS erasure decoding is performed on the RS frame having (18+P) number of N-byte rows, i.e., the RS frame having 235 N-byte rows in a column direction, as shown in (d) of FIG. 57. However, when the number of rows including CRC error is greater than the maximum number of errors (i.e., 48 errors) correctable by RS erasure decoding, RS erasure decoding cannot be performed. In this case, error correction may be performed through a general RS-decoding process. Herein, the present invention may further enhance the error correcting ability by using the reliability map, which was generated when configuring the RS frame, from a soft decision value.

More specifically, the RS frame decoder compares the absolute value of the soft decision value of the block decoder 1303 with the pre-determined threshold value, so as to determine the reliability of the bit value decided by the code of the corresponding soft decision value. Also, 8 bits, each being determined by the code of the soft decision value, are grouped to form one data byte.

Accordingly, the reliability information on this one data byte is indicated on the reliability map. Therefore, as shown in FIG. 57(c), even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points.

Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column.

For example, it is assumed that the number of rows having CRC errors included therein within the RS frame is greater than 48. And, it is also assumed that the number of erasure points decided based upon the reliability information of the reliability map is indicated as 40 erasure points in the first column and as 50 erasure points in the second column. In this case, a (235,187)-RS erasure decoding process is performed on the first column. Alternatively, a (235,187)-RS decoding process is performed on the second column.

As described above, the present invention may apply the process (d) of FIG. 57 or the process (d') of FIG. 57, so as to perform error correction decoding on N number of columns excluding the last 2 columns within the RS frame.

After performing error correction decoding on the N number of columns, the number of RS errors is counted as shown in (e) of FIG. 58.

At this point, if an error did not occur in any of the columns, or if all errors have been corrected in process (d) of FIG. 57 or process (d') of FIG. 57, i.e., if the number of RS errors is equal to '0', this indicates that there is no error in the (N+187)-byte RS frame payload configuring the M/H service data packet within the corresponding RS frame. Herein, as shown in (f) of FIG. 58, derandomizing is performed on the (N+187)-byte RS frame payload as an inverse process of the transmitting system. Thereafter, when outputting each M/H service data packet (i.e., M/H TP packet) of the derandomized RS frame payload to the M/H TP interface block 1305, the output is performed by setting the value of the error_indicator field within the M/H service data packet to '0' (i.e., indicating that there is no error), as shown in (g) of FIG. 58. More specifically, the value of the error_indicator field within each of the M/H service data packets configuring the RS frame payload is equally set to '0'.

Meanwhile, even though RS-decoding is performed, errors in N number of columns may all remain without being corrected. In this case, the number of RS errors is not equal to '0'.

In this case, as shown in (h) of FIG. 57, a CRC syndrome check is performed once again on the RS-decoded RS frame, thereby checking once again whether or not an error exists in 187 rows.

The CRC syndrome check is repeated in (h) of FIG. 58 because, although RS-decoding has not been performed on the last 2 columns (i.e., CRC checksum data) of the RS frame, RS-decoding has been performed on the N number of columns including M/H service data packet. Accordingly, the effects (or influence) of the error corrected by RS-decoding may be verified and reflected (or applied).

More specifically, after performing CRC-RS decoding, when the present invention repeats the CRC syndrome check process once again on each row, as shown in (h) of FIG. 58, and derandomizes the RS frame payload processed with CRC syndrome checking, as shown in (i) of FIG. 58, and when the present invention outputs the derandomized RS frame payload, the present invention marks the CRC syndrome check result in the error_indicator field of the M/H service data packet configuring the corresponding row, as shown in (j) of FIG. 58.

For example, when performing the CRC syndrome check once again, if it is determined that there is not CRC error in the RS frame, the value of the error_indicator field within each M/H service data packet of the derandomized RS frame payload is equally set to '0'.

When performing the CRC syndrome check once again, if it is determined that a CRC error exists in a specific row of the RS frame, for example, the second and third rows of the RS frame, the values of the error_indicator field within the second and third M/H service data packets of the derandomized RS frame payload are marked to be equal to '1', and the value of the error_indicator field within the remaining M/H service data packets is equally marked to be equal to '0'.

The present invention is provided with a number (=M) of RS frame decoders aligned in parallel, wherein the number corresponds to the number of parades included in one M/H frame. Herein, the RS frame decoder may be configured by being provided with a multiplexer connected to the input end of each of the M number of RS frame decoders, so as to multiplex a plurality of portions, and a demultiplexer connected to the output end of each of the M number of RS frame decoders.

Signaling Decoding

The signaling decoder 1306 extracts and decodes signaling information (e.g., TPC and FIC information), which was inserted and transmitted by the transmitting system, from the received (or inputted) data. Thereafter, the signaling decoder 1306 provides the decoded signaling information to the block(s) requiring such information.

More specifically, the signaling decoder 1306 extracts and decodes TPC data and FIC data, which were inserted and transmitted by the transmitting system, from the equalized data. Then, the signaling decoder 1306 outputs the TPC data to the operation controller 1307, and the signaling decoder 1306 outputs the FIC data to the FIC processor 1308. For example, the TPC data and the FIC data are inserted in the signaling information region of each data group, thereby being received.

At this point, the signaling information area within the data group may be known by using the known data position information that is outputted from the known sequence detector 1506. The signaling information area corresponds to the area starting from the first segment to a portion of the second segment of M/H block B4 within the data group, as shown in FIG. 5. More specifically, in the present invention, 276(=207+69) bytes of the M/H block B4 within each data group are allocated to an area for inserting the signaling information. In other words, the signaling information area is configured of 207 bytes corresponding to the first segment of M/H block B4 and of the first 69 bytes of the second segment of M/H block B4. Additionally, the first known data sequence (i.e., first training sequence) is inserted in the last 2 segments of M/H block B3, and the second known data sequence (i.e., second training sequence) is inserted in the second and third segments of M/H block B4. At this point, since the second known data sequence is inserted after the signaling information area and then received, the signaling decoder 1306 may extract and decode signaling information of the signaling information area from the data being outputted from the channel synchronizer 1301 or the channel equalizer 1302.

Figure 59:
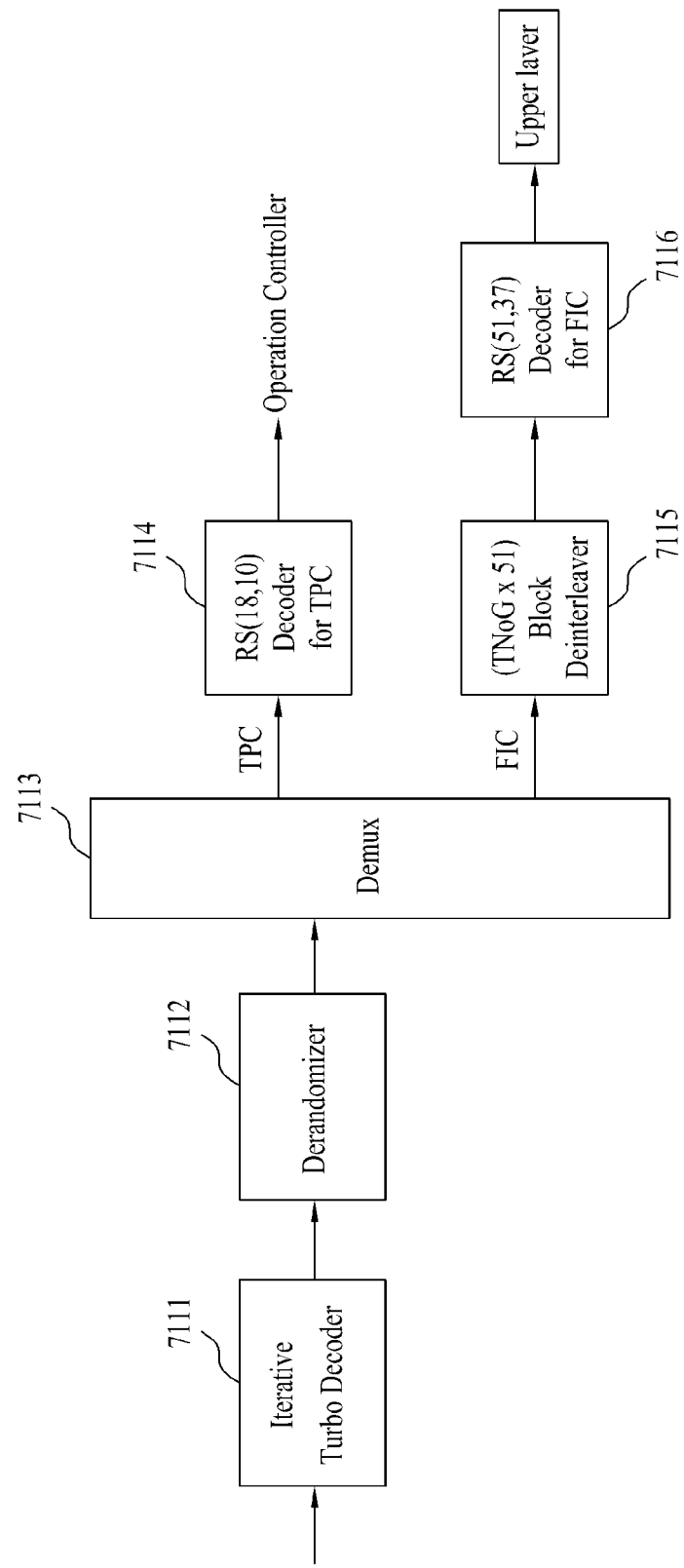
FIG. 59 illustrates a block view of the signaling decoder according to an embodiment of the present invention.

FIG. 59 illustrates a block view of the signaling decoder 1306 according to an embodiment of the present invention. The signaling decoder 1306 performs iterative turbo decoding and RS-decoding on the data of the signaling information region among the equalized data. Thereafter, the transmission parameter (i.e., TPC data) obtained as a result of the above-described process is outputted to the operation controller 1307, and the FIC data are outputted to an upper layer.

For this operation, the signaling decoder 1036 may include an iterative turbo decoder 7111, a derandomizer 7112, a demultiplexer 7113, an RS decoder 7114, a block deinterleaver 7115, and an RS decoder 7116.

Figure 60:
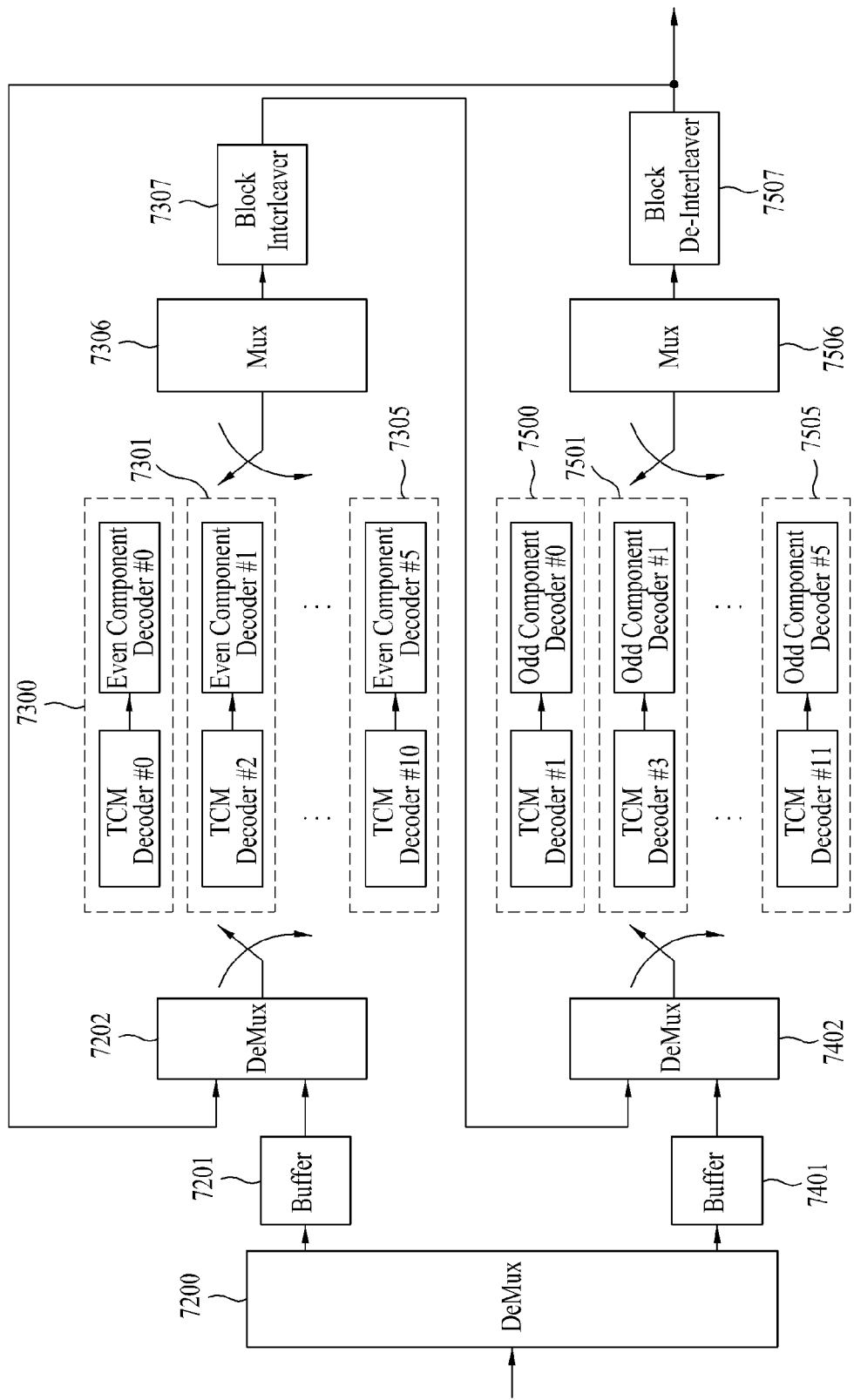
FIG. 60 is a detailed block diagram illustrating an iterative turbo decoder according to an embodiment of the present invention.

FIG. 60 is a detailed block diagram illustrating the iterative turbo decoder 7111. Referring to FIG. 60, upon receiving the signaling information area's data from among the equalized data, a demultiplexer (DeMux) 7200 discriminates symbols corresponding to respective branches of the signaling encoder of the transmission system, and outputs the discriminated symbols to buffers 7201 and 7401, respectively.

The buffers 7201 and 7401 store input data corresponding to the signaling information area, and respectively repeatedly output the stored input data to the demultiplexers 7202 and 7402 during the turbo decoding process.

In accordance with one embodiment of the present invention, it is assumed that output data of the even encoder in the signaling encoder of the transmission system is processed to be input to $0^{th}, 2^{nd}, \ldots, 10^{th}$ trellis encoders (i.e., even number trellis encoders), and output data of the odd encoder 575 is processed to be input to $1^{st}, 3^{rd}, \ldots, 11^{th}$ trellis encoders. In this case, the demultiplexer 7202 outputs output data of the buffer 7201 to a trellis decoder (i.e., TCM decoder) corresponding to the even number trellis encoder. The demultiplexer 7202 receives data fed back from the block deinterleaver 7507, and outputs the feed-back data to the same trellis decoder (i.e., TCM decoder) corresponding to the even number trellis encoder.

In this case, output data of each trellis decoder (TCM decoder) corresponds to a log likelihood ratio (LLR) value. The LLR value is a result from taking a logarithm of a soft decision value. More specifically, the LLR value corresponds to a log likelihood ratio (LLR) between a likelihood of input bit being equal to '1' and a likelihood of input bit being equal to '0'. An initial value of the LLR is set to zero. The LLR value is transferred to the even component decoder corresponding to the even component encoder contained in the signaling encoder of the transmission system. Input/output (I/O) data of the even component decoder is such an LLR value as well. In this case, since a single even number trellis decoder interoperates with a single even component decoder, an even component encoder and an even number trellis encoder are considered as a single encoder (effective component encoder). Hence, the even number trellis decoder and the even component decoder can be merged into a single effective component decoder. In the case where the two decoders configure a single decoder, decoding performance will be enhanced although complexity increases due to the increased number of states.

Output signals of the even component decoders 7300 to 7305 are sequentially transferred to the multiplexer 7306 and are then transferred to the block interleaver 7307. The block interleaver 7307 has the same configuration as a block interleaver used for the signaling encoder of the transmitting side.

The LLR value block-interleaved by the block interleaver 7307 is fed back to the demultiplexer 7402. The demultiplexer 7402 outputs the LLR value to a corresponding trellis decoder (i.e., TCM decoder) from among six trellis decoders, and at the same time transmits output data of the buffer 2401 to the trellis decoder. For example, provided that the LLR value fed back from the block deinterleaver 7507 is an LLR value of the first decoder 7500, the demultiplexer 7402 outputs this feed-back LLR value and the output data of the buffer 7401 to the trellis decoder of the first decoder 7500.

The above-mentioned rules are equally applied to the demultiplexer 7202. The odd number trellis decoder and the odd component decoder can be operated in the same manner as in the even number trellis decoder and the even component decoder. Likewise, the odd number trellis decoder and the odd component decoder can be implemented as a single effective component decoder.

Output signals of the odd number decoders 7500 to 7505 are sequentially transferred to the multiplexer 7506, and are then forwarded to the block deinterleaver 7507. The block deinterleaver 7507 is an inverse process of the block interleaver. Thus, the LLR value block-deinterleaved by the block deinterleaver 7507 is input to the demultiplexer 7202 to accomplish the iterative turbo decoding.

After the iterative turbo decoding has been repeatedly performed at a predetermined level, the iterative turbo-decoded result is output to the derandomizer 7112.

At this point, in the above-mentioned iterative turbo decoding process, the even and odd decoders must have trellis diagram information of a corresponding encoder. Each of the encoders shown in FIGS. 61(*a*) and 61(*b*) has five memories D0 to D4 so as to obtain 32 states (i.e., $2^5$ states). However, the number of states acquired when start states of all the signaling information areas are constant may be limited to the number of only some states among a total of 32 states. That is, if it is assumed that a start state of the effective component encoder is limited to a specific state, the effective component encoder may have a smaller number of states as compared to 32 states.

For example, all memories of the even/odd component encoders of the iterative turbo encoder (i.e., PCCC encoder) are each set to zero at the beginning of each signaling information area of a single data group. Because the signaling information area just follows a first known data sequence (i.e., $1^{st}$ training sequence) and the first known data sequence is designed to allow all memories in each of the twelve trellis encoders to have a state of zero at the end of the first known data sequence. As a result, the respective memories of the effective component encoder always start from a state '00000'. That is, all memories of the effective component encoder are each set to a state of zero at the beginning of the signaling information area. In this way, provided that all memories of the effective component encoders in the signaling information area start from the state '00000', the data encoding can be achieved using only specific states among 32 states although data of the signaling information area is considered to be random.

The signaling information area ranges from a first segment of an M/H block 'B4' of a data group to some parts of a second segment thereof. That is, 276 (=207+69) bytes of the M/H block 'B4' of each data group are assigned to an area for inserting signaling information. In other words, the signaling information area is composed of 207 bytes corresponding to a first segment of the M/H block 'B4' and first 69 bytes of a second segment thereof. In addition, the first known data sequence (i.e., the first training sequence) is inserted into the last 2 segments of an M/H block 'B3', and a second known data sequence (i.e., the second training sequence) is inserted into second and third segments of an M/H block 'B4'. In this case, the second known data sequence is located just behind the signaling information area. Third to sixth known data sequences (i.e., third to sixth training sequences) are respectively inserted into the last 2 segments of the M/H blocks B4, B5, B6, and B7.

Figure 61:
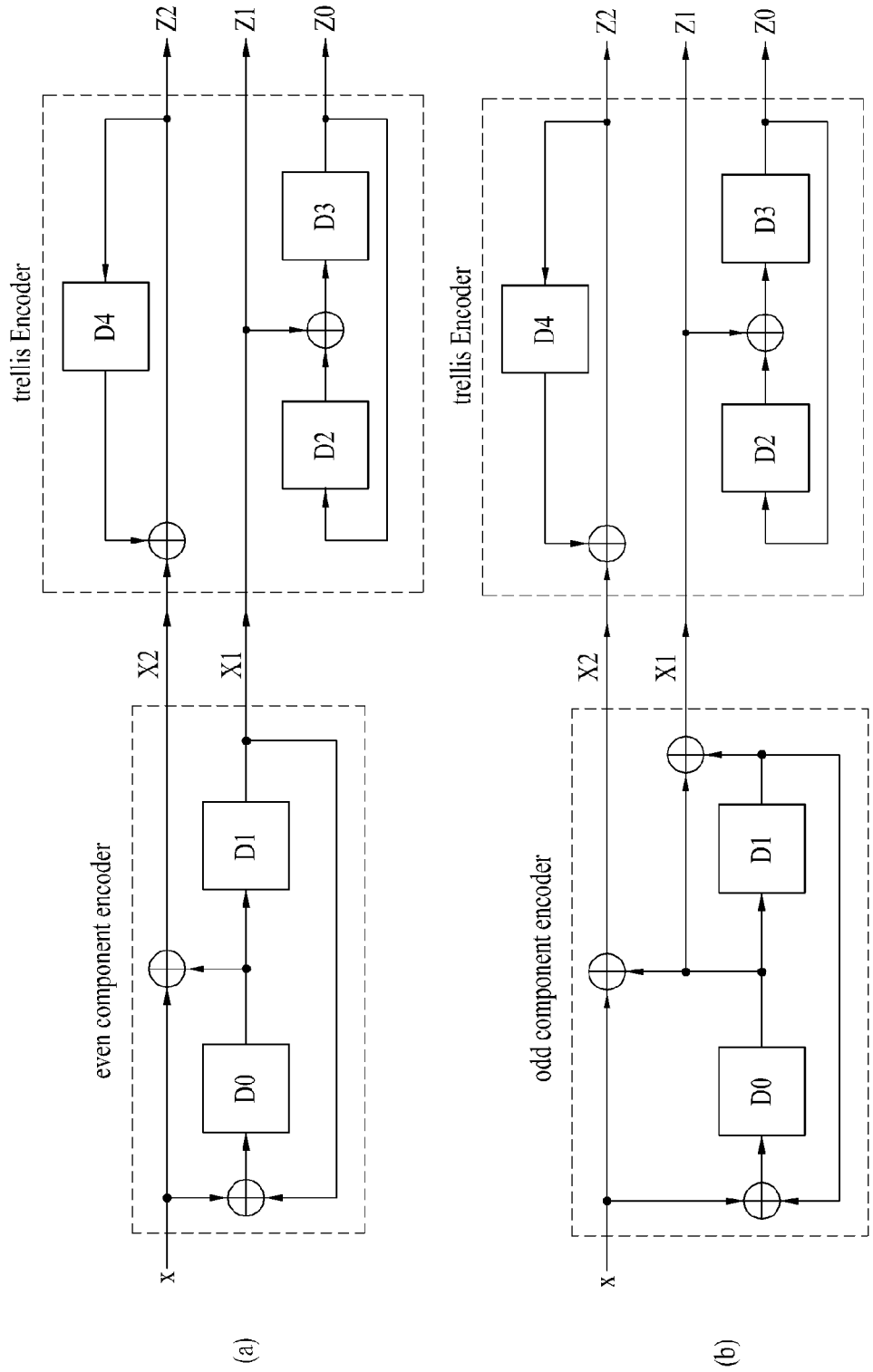
FIG. 61 illustrates an exemplary case in which a trellis encoder is serially concatenated with an even component encoder.

FIG. 61(*a*) illustrates an exemplary case in which a trellis encoder is serially concatenated with the even component encoder.

In fact, although a plurality of blocks are located between the even component encoder and the trellis encoder, the receiving system considers two blocks to be concatenated with each other, so that it decodes data. In other words, the trellis encoder performs precoding on the high-order bit 'X2' generated from the even component encoder, and outputs the precoded result as a most significant bit 'Z2'. In addition, the trellis encoder performs trellis-encoding on the low-order bit 'X1', so that it outputs the trellis-encoded result as two output bits Z1 and Z0.

FIG. 61(*b*) illustrates an exemplary case in which a trellis encoder is serially concatenated with the odd component encoder.

In fact, although a plurality of blocks are located between the even component encoder and the trellis encoder, the receiving system considers two blocks to be concatenated with each other, so that it decodes data. The trellis encoder performs precoding on the high-order bit 'X2' generated from the odd component encoder, and outputs the precoded result as a most significant bit 'Z2'. In addition, the trellis encoder performs trellis-encoding on the low-order bit 'X1', so that it outputs the trellis-encoded result as two output bits Z1 and Z0.

Figure 62:
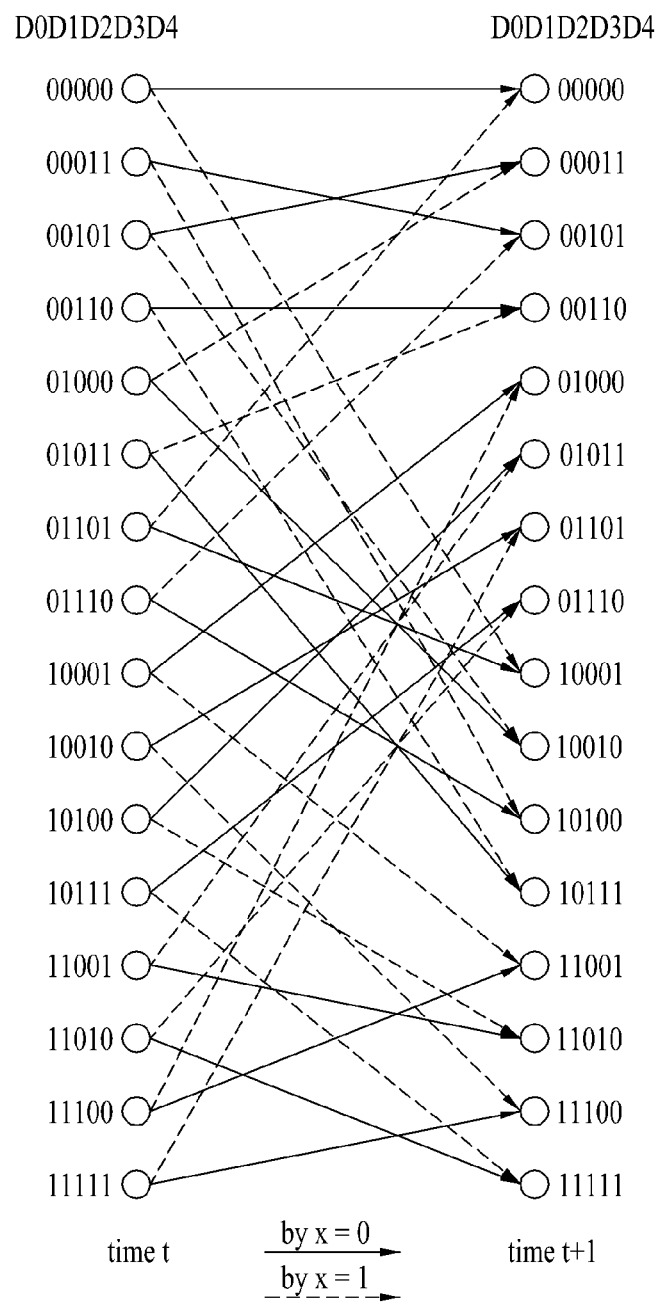
FIG. 62 is a trellis diagram including states capable of being acquired when a start state for an even decoder is set to '00000'.
Figure 63:
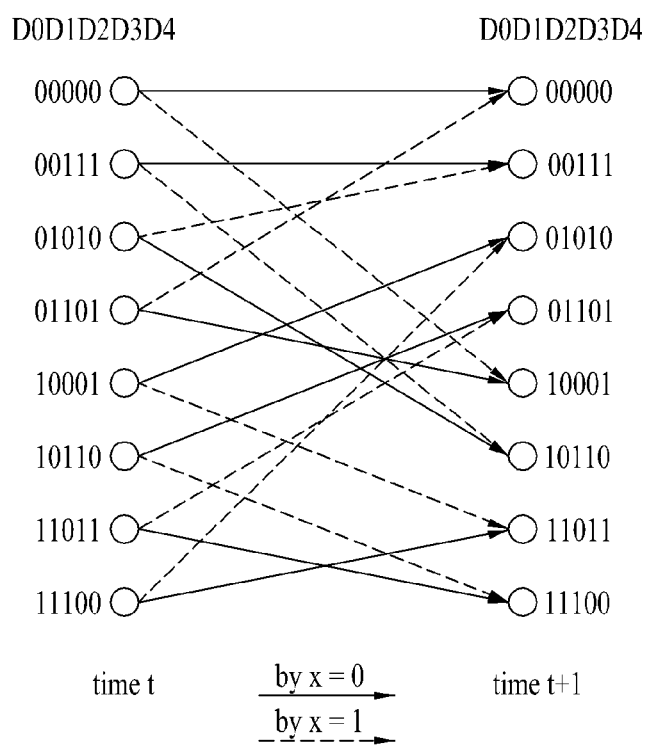
FIG. 63 is a trellis diagram including states capable of being acquired when a start state for an odd decoder is set to '00000'.

FIG. 62 is a trellis diagram including states capable of being acquired when a start state for the even decoder is set to '00000'. FIG. 63 is a trellis diagram including states capable of being acquired when a start state for the odd decoder is set to '00000'.

For example, if it is assumed that the even component encoder and the trellis encoder are regarded as a single encoder (i.e., a single effective component encoder) in the same manner as in FIG. 61(*a*), only 16 states from among 32 states are effective as shown in FIG. 62. For another example, if it is assumed that the odd component encoder and the trellis encoder are regarded as a single encoder (i.e., a single effective trellis encoder) in the same manner as in FIG. 61(*b*), only 8 states are effective as shown in FIG. 63.

In this way, in the case where the component encoder and the trellis encoder are implemented as a single effective component encoder and then the encoding of data is carried out in the single effective component encoder, the number of states to be selected from among 32 states for the above-mentioned encoding process is changed according to the component encoder structures. In this case, states to be used for the encoding process are changed according to which one of states is used as a start state.

For example, if it is assumed that the odd component encoder and the trellis encoder are regarded as a single effective component encoder in the same manner as in FIG. 61(*b*), the number of states to be used for the encoding is 8. In addition, if it is assumed that memories of the effective component encoder shown in FIG. 61(*b*) are designed to always start from the state '00000' in the signaling information area, the above 8 states become '00000', '00111', '01010', '01101', '10001', '10110', '11011', and '11100', respectively.

In this way, since only some states from among a total of states are used when the transmission system encodes data of the signaling information area, the iterative turbo decoder 7111 of the signaling decoder 1306 can perform turbo decoding of data using only the effective states, thereby greatly reducing complexity of the turbo decoder.

Meanwhile, the derandomizer 7112 performs derandomizing of the iterative turbo-decoded data, and outputs the derandomized result to the demultiplexer 7113. The demultiplexer (Demux) 7113 discriminates between TPC data composed of 18 bytes and FIC data composed of 51 bytes on the basis of the derandomized data.

Here, the TPC data is output to the RS decoder 7114 corresponding to an RS (18, 10) of a GF 256. The RS decoder 7114 receives a result of hard decision from the iterative turbo decoder 7111 so as to perform general RS decoding, or the RS decoder 7114 receives the result of soft decision from the iterative turbo decoder 7111 so as to perform RS erasure decoding. TPC data (i.e., transmission parameter information) error-corrected by the RS decoder 7114 is output to the operation controller 1307. In this case, the RS decoder 7114 further transmits the decision result to the operation controller 1307, so that it prevents the occurrence of operational failure which may be generated from misjudgment of the transmission parameter.

Also, since some information of the TPC data is repeatedly transmitted to each group, decoding performance can be improved using such a feature. For example, in case of FEC mode information such as SCCC or RS, since information of next M/H frame is repeatedly transmitted to three sub frames at the rear of one M/H frame, even though decoding is successfully performed once within the three subframes, there is no problem in receiving the next M/H frame.

The FIC data discriminated by the demultiplexer 7113 is output to a (TNoG×51) block deinterleaver 7115. The block deinterleaver 7115 is an inverse process of the (TNoG×51) block interleaver of the signaling encoder of the transmitting side.

For example, the (TNoG×51) block interleaver of the transmitting side is a variable-length block interleaver, and interleaves FIC data contained in each subframe in units of a (TNoG (columns)×51 (rows)) block. In this case, 'TNoG' is indicative of a total number of data groups allocated to a subframe contained in a single M/H frame.

The FIC data block-deinterleaved by the block deinterleaver 7115 is input to the RS decoder 7116 corresponding to the RS (51, 37) of the GF 256. In the same manner as in the RS decoder 7114 for TPC data, the RS decoder 7116 is able to use both the hard decision value and the soft decision value, and FIC data error-corrected by the RS decoder 7116 is output to the FIC processor 1308.

Meanwhile, TNoG value required by the block deinterleaver 7115 can be acquired from the TPC data output from the RS decoder 7114. To this end, the block deinterleaver 7115 includes a controller.

However, since TNoG of next M/H frame is transmitted to three subframes at the rear of one M/H frame, information of TNoG of the current subframe may not be obtained through TPC data decoding. For example, if the broadcast receiver is turned on at the third subframe (sub-frame #2) and starts to perform FIC decoding to obtain channel information, and performs FIC block deinterleaving using TNoG within the TPC data, the broadcast receiver cannot decode the FIC data until it reaches the next M/H frame.

Accordingly, the present invention suggests a method for decoding FIC data by acquiring TNoG even without using RS-decoded TPC data.

FIG. 64 illustrates a detailed embodiment of a process of extracting TNoG in accordance with the present invention.

The process of acquiring TNoG according to the present invention may be performed by the signaling decoder 1306, or may be performed by the operation controller 1307. According to one embodiment of the present invention, TNoG is acquired by the signaling decoder 1306. In particular, according to one embodiment of the present invention, a controller is provided at the block deinterleaver 7115 within the signaling decoder 1306, and acquires TNoG. This is only one example, and the controller may be provided outside the block deinterleaver 7115.

In other words, if a command to start FIC decoding is input, the signaling decoder 1306 searches start of next subframe. For example, it is supposed that a command to start FIC decoding is input at the middle of the n−1 th subframe within one M/H frame as shown in (a) of FIG. 44. In this case, start of the nth subframe is searched.

Namely, if the command to start FIC decoding is input, in order to extract start of the subframe, it is identified whether a data group exists in a corresponding slot. For example, 16 slots are assigned to one subframe. At this time, since known data exist in the data group, it is identified whether the data group exists in the corresponding slot as shown in (b) of FIG. 44 through correlation between a pre-determined pattern of known data and received data. As another example, information as to whether the data group exists in the corresponding slot may be provided from the operation controller 1307.

At this time, if it is identified whether the data group exists in the corresponding slot, the signaling decoder 1306 performs turbo decoding, signaling derandomizing, and demultiplexing for data of the signaling information area within the data group to split TPC data, and performs RS decoding for the split TPC data. Then, the signaling decoder 1306 acquires a slot number from the RS-decoded TPC data as shown in (d) of FIG. 64.

The slot number becomes 0 at a start slot of each sub frame, and has a value of 15 at the last slot of the corresponding subframe. Accordingly, start of the subframe can be identified by using the slot number.

In other words, the signaling decoder 1306 repeatedly performs the signaling decoding process until the slot number having a value of 0 is detected from the TPC data. If the data group within the subframe is assigned and transmitted as shown in (a) of FIG. 64 and the command to start FIC decoding is input at the middle of the n−1th subframe, start of the nth subframe is detected through the signaling decoding process. If the start of the subframe is detected, the group counter value is reset to 0.

If start of the nth subframe is detected through the above process, the signaling decoder 1306 detects a data group from the nth sub frame.

The presence of the data group may be identified using the correlation between the known data pattern and the received data, or may be provided from the operation controller 1307.

If the data group is detected, the group counter value increases by 1 as shown in (f) of FIG. 64. The turbo decoder 7111 and the derandomizer 7112 perform turbo decoding and derandomizing for data of the signaling information area within the data group. Subsequently, the demultiplexer 7113 performs demultiplexing for the derandomized data to split TPC data from FIC data, and the RS decoder 7114 performs RS decoding for the split TPC data. The slot number is acquired from the RS-decoded TPC data. Also, the split FIC data (i.e., 51 bytes) are stored in a buffer (not shown) of the block deinterleaver 7115.

The steps are performed whenever the data group is detected from the subframe to increase the group counter value by 1, and the buffer of the block deinterleaver 7115 stores the split FIC data by the demultiplexer 7113.

This process is performed until the end of the subframe is detected. According to one embodiment of the present invention, the end of the subframe is detected using the slot number such as (d) of FIG. 64. According to another embodiment of the present invention, the end of the subframe is detected using the field synchronizing counter value such as (e) of FIG. 64.

If the end of the subframe is identified, TNoG is calculated using the group counter value.

The TNoG value is applied to the FIC data stored in the buffer of the block deinterleaver 7115 to perform block deinterleaving. The block deinterleaved FIC data are input to the RS decoder 7116 and then RS-decoded by the RS decoder 7116. In case of (g) and (h) of FIG. 64, turbo decoding and derandomizing are performed for the FIC data included in each data group of the nth sub frame for the nth subframe interval and then stored in the buffer of the block deinterleaver 7115. The TNoG calculated is applied to the FIC data of the nth subframe stored in the buffer of the block deinterleaver 7115 to perform block deinterleaving, RS decoding is performed for the block deinterleaved FIC data.

Meanwhile, the end of the subframe may be detected using either the slot number such as (d) of FIG. 64 or the field synchronizing counter value such as (e) of FIG. 64.

In other words, if the slot number acquired from the RS-decoded TPC data becomes 0, it means that a new subframe starts. Accordingly, if the slot number becomes 0, it is determined that the previous subframe has ended. In this case, since the group counter value increases by 1, the value obtained by subtracting 1 from the group counter value becomes the TNoG value.

However, next subframe is the first subframe of new M/H frame, and data group may not exist in next M/H frame due to PRC. Under the circumstances, if the end of the subframe is detected using the slot number, TNoG cannot be identified until M/H frame where data group exists is detected, whereby FIC decoding time may be delayed. In this case, start of the subframe can be determined using the new slot number, and the number of field synchronization values can be counted to identify the end of the subframe. This is because that eight field synchronization values in one subframe and field synchronization values are transmitted regardless of the presence of the data group. For example, if the field synchronization counter value is 8, it is determined as the end of the subframe. In this case, the group counter value becomes the TNoG value. The field synchronization values can also be detected through correlation.

As described above, the transmitting system, the receiving system, and the method of processing broadcast signals according to the present invention have the following advantages.

When transmitting mobile service data through a channel, the present invention may be robust against errors and backward compatible with the conventional digital broadcast receiving system.

This invention extends a region for mobile service data in a slot. Thus, the transmitter can transmit more mobile service data.

This invention has an advantage enhancing the reception performance of a broadcast signal at a reception system, and a method for processing a broadcast signal by inserting additional known data in regions C, D and E.

When performing block deinterleaving on the turbo-decoded FIC data, by acquiring TNoG using slot information and data group information, the present invention may decode the FIC data, even when the TNoG information of the current subframe cannot be acquired by TPC data decoding. Therefore, the decoding performance of the FIC data may be enhanced.

After performing CRC-RS decoding, a CRC syndrome check may be performed once again on the RS frame, and the checked result is marked on an error_indicator field of the M/H service data packets configuring the payload of the RS frame. Thus, the likelihood of malfunction occurring in the block receiving and processing the M/H service data packet may be reduced, thereby enhancing the overall performance of the receiving system.

Finally, the present invention is even more effective when applied to mobile and portable receivers, which are also liable to a frequent change in channel and which require protection (or resistance) against intense noise.

What is claimed is:

1. A method for transmitting a broadcast signal in a transmitter, the method comprising:
   encoding mobile data for forward error correction (FEC) to build Reed-Solomon (RS) frames;
   dividing the built RS frames into a number of RS frame portions;
   dividing one of the RS frame portions into Serially Concatenated Convolutional Code (SCCC) blocks;
   performing convolutional coding on data in the SCCC blocks according to a SCCC code mode;
   mapping the SCCC blocks including the convolution-coded data to mobile data blocks according to a SCCC block mode which identifies relationship between the mobile data blocks and the SCCC blocks;
   forming a data group including the mobile data blocks, wherein the data group includes a plurality of regions, the plurality of regions includes the mapped mobile data blocks corresponding to a plurality of segments;
   forming mobile data packets including data in the data group;
   multiplexing a specified number of the mobile data packets, a first scalable number of the mobile data packets, and a second scalable number of main data packets;
   wherein one region of the plurality of regions includes the first scalable number of the mobile data packets.

2. The method of claim 1, wherein a sum of the first and second scalable numbers being a specified value, the first scalable number is equal to 11, 20, 29 or 38.

3. The method of claim 1, wherein the SCCC code mode indicates a code rate which is equal to '½', '⅓' or '¼'.

4. The method of claim 3, wherein the method further comprises: encoding a primary and secondary RS Frames by different FEC code rates, respectively.

5. The method of claim 4, wherein when the SCCC code rate is ½ or ¼, data in the primary RS frame is included in specified regions of the plurality of regions.

6. An apparatus for transmitting a broadcast signal in a transmitter, the apparatus comprising:
   a first encoder configured to encode mobile data for forward error correction (FEC) to build Reed-Solomon (RS) frames;
   a divider configured to divide the built RS frames into a number of RS frame portions;

a first converter configured to divide one of the RS frame portions into Serially Concatenated Convolutional Code (SCCC) blocks;

a second encoder to perform convolutional coding on data in the SCCC blocks according to a SCCC code mode;

a second converter configured to map the SCCC blocks including the convolution-coded data to mobile data blocks according to aSCCC block mode which identifies relationship between the mobile data blocks and the SCCC blocks;

a group formatter configured to form a data group including the mobile data blocks, wherein the data group includes a plurality of regions, the plurality of regions includes the mapped mobile data blocks corresponding to a plurality of segments;

a packet formatter configured to form mobile data packets including data in the data group;

a multiplexer configured to multiplex a specified number of the mobile data packets, a first scalable number of the mobile data packets, and a second scalable number of main data packets; (S p. 26)

wherein one region of the plurality of regions includes the first scalable number of the mobile data packets.

7. The method of claim 6, wherein a sum of the first and second scalable numbers being a specified value, the first scalable number is equal to 11, 20, 29 or 38.

8. The method of claim 6, wherein the SCCC code mode indicates a code rate which is equal to '½', '⅓' or '¼'.

9. The method of claim 8, wherein the apparatus further comprises: the first encoder configured to encode a primary and secondary RS Frames by different FEC code rates, respectively.

10. The method of claim 9, wherein when the SCCC code rate is ½ or ¼, data in the primary RS frame is included in specified regions of the plurality of regions.

* * * * *